US008779296B2

(12) United States Patent
Katsui et al.

(10) Patent No.: US 8,779,296 B2
(45) Date of Patent: Jul. 15, 2014

(54) WIRING BOARD, METHOD FOR MANUFACTURING SAME, DISPLAY PANEL, AND DISPLAY DEVICE

(75) Inventors: Hiromitsu Katsui, Osaka (JP); Kenichi Kitoh, Osaka (JP); Wataru Nakamura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 282 days.

(21) Appl. No.: 13/386,685

(22) PCT Filed: May 18, 2010

(86) PCT No.: PCT/JP2010/058390
§ 371 (c)(1),
(2), (4) Date: Jan. 24, 2012

(87) PCT Pub. No.: WO2011/013434
PCT Pub. Date: Feb. 3, 2011

(65) Prior Publication Data
US 2012/0120616 A1 May 17, 2012

(30) Foreign Application Priority Data
Jul. 28, 2009 (JP) .................. 2009-175373

(51) Int. Cl.
H05K 1/09 (2006.01)
G02F 1/1362 (2006.01)
H05K 1/00 (2006.01)
H05K 1/03 (2006.01)
H05K 1/11 (2006.01)
H05K 1/18 (2006.01)
H05K 1/16 (2006.01)
G02F 1/1333 (2006.01)
G02F 1/1343 (2006.01)
H01L 27/32 (2006.01)
G02F 1/1345 (2006.01)

(52) U.S. Cl.
CPC ......... *H01L 27/3276* (2013.01); *H01L 27/3258* (2013.01); *G02F 1/136286* (2013.01); *G02F 1/1345* (2013.01)
USPC ........... 174/251; 174/250; 174/254; 174/255; 174/258; 174/261; 361/750; 361/751; 361/762; 361/765; 349/122; 349/138; 349/140; 349/142

(58) Field of Classification Search
USPC .......... 361/750, 751, 762, 765; 174/250, 251, 174/254, 255, 256, 257, 258, 261; 349/122, 349/138, 140, 142
See application file for complete search history.

(56) References Cited

U.S. PATENT DOCUMENTS 5,636,329 A 6/1997 Sukegawa et al.
(Continued)

FOREIGN PATENT DOCUMENTS

JP 08-006059 A 1/1996
(Continued)

OTHER PUBLICATIONS

Official Communication issued in International Patent Application No. PCT/JP2010/058390, mailed on Jun. 15, 2010.

*Primary Examiner* — Hoa C Nguyen
*Assistant Examiner* — Binh Tran
(74) *Attorney, Agent, or Firm* — Keating & Bennett, LLP

(57) ABSTRACT

A wiring board is provided which can prevent a metal electrode from corroding due to a defect in a transparent conductive electrode covering an end face of an organic insulating film. An active-matrix substrate includes: a glass substrate; a metal wire provided on the glass substrate; a gate insulating film covering the metal wire; an interlayer insulating film covering the gate insulating film; and a transparent electrode formed on the interlayer insulating film. The scanning wire provided with a terminal area where the transparent electrode is laminated directly on the scanning wire. The transparent electrode extends over the terminal area in such a way as to cover an end face of the interlayer insulating film that faces the terminal area and an end face of the gate insulating film that faces the terminal area.

10 Claims, 19 Drawing Sheets

(56) References Cited

U.S. PATENT DOCUMENTS

| | | |
|---|---|---|
| 6,825,125 B2 * | 11/2004 | Hiromasu et al. ............ 438/706 |
| 7,760,281 B2 * | 7/2010 | Tanabe et al. ................... 349/43 |
| 2001/0004273 A1 | 6/2001 | Sugimoto et al. |
| 2002/0173155 A1 | 11/2002 | Hiromasu et al. |
| 2004/0217689 A1 | 11/2004 | Ochiai et al. |
| 2009/0079890 A1 | 3/2009 | Tanabe et al. |

FOREIGN PATENT DOCUMENTS

| | | |
|---|---|---|
| JP | 08-082805 A | 3/1996 |
| JP | 2001-174844 A | 6/2001 |
| JP | 2002-351354 A | 12/2002 |
| JP | 2004-205552 A | 7/2004 |
| JP | 2004-333673 A | 11/2004 |
| JP | 2009-080279 A | 4/2009 |

\* cited by examiner

DISPLAY SECTION

WIRING BOARD, METHOD FOR MANUFACTURING SAME, DISPLAY PANEL, AND DISPLAY DEVICE

TECHNICAL FIELD

The present invention relates to a wiring board having superior resistance to corrosion, a method for manufacturing such a wiring board, a display panel, and a display device.

BACKGROUND ART

In recent years, there has been a rapid spread of display devices using display media such as liquid crystals, organic EL (electroluminescence), and inorganic EL. Among these display devices, active-matrix display devices have been widely used because they are fast in response speed and make it easier to display multiple tones.

An active-matrix display device includes: an active-matrix substrate, on which a large number of pixels are arranged in a matrix manner; and a counter substrate placed in such a way as to face the active-matrix substrate.

The active-matrix substrate is larger in area than the counter substrate. The active-matrix substrate and the counter substrate are joined to each other by a sealing agent (not illustrated) extending along the edge of the counter substrate. Sandwiched between the active-matrix substrate and the counter substrate is a display medium layer constituted by any one of the various display media named above.

The active-matrix substrate has a plurality of scanning wires and a plurality of signal wires so arranged inside of a cell surrounded by the sealing agent as to intersect with one another. Provided near each of the intersections between the scanning wires and the signal wires is a pixel section having a TFT (thin-film transistor).

The active-matrix substrate has a region in its peripheral part that runs off the edge of the counter substrate. Provided in the region is a connection area including (i) drawn wires constituted by metal wires drawn from the pixel sections provided inside of the cell and (ii) terminal areas (terminal electrodes). Such a display device requires a connection of each TFT to an external drive circuit such as a driving integrated circuit.

A connection of each TFT to an external drive circuit is made by connecting the terminal electrode to a flexible wiring board, such as a TCP (tape carrier package), on which a driving integrated circuit has been mounted. Such a terminal electrode is connected to a flexible wiring board, generally, by using an ACF (anisotropic conductive film).

However, generally, due to mounting constraints, there is a distance of several millimeters between a region between the active-matrix substrate and the counter substrate in where the sealing agent is provided and a position on the connection area to which the ACF is attached. Therefore, the metal wires are exposed in the region between the region where the sealing agent is provided and the position to which the ACF is attached. For this reason, in this region, moisture, foreign bodies, etc. are likely to adhere to the metal wires, thus undesirably corroding the metal wires.

Accordingly, as methods for solving such a problem, the techniques described in Patent Literature 1 and Patent Literature 2 have been proposed, for example.

FIG. 21 is a cross-sectional view showing a configuration of a connection area on an active-matrix substrate described in Patent Literature 1.

As shown in FIG. 21, the active-matrix substrate includes: a glass substrate 301; a lower metal wire 302 drawn from a display section to a connection area provided at an end of the glass substrate 301; an interlayer insulating film 303 (planarizing film) covering the lower metal wire 302; a contact hole 304 formed in the interlayer insulating film 303; an upper metal wire 305 formed on the interlayer insulating film 303 and connected to the lower metal wire 302 through the contact hole 304; a transparent conductive film 306 entirely covering the upper metal wire 305; a protective insulating film 307, formed on the transparent conductive film 306, which has an opening provided in a terminal area (terminal electrode) of the upper metal wire 305. Connected to the terminal area by an ACF 310 is a copper foil wire 312 of a flexible wiring board 311.

In Patent Literature 1, corrosion of the metal wire formed under the transparent conductive film 306 is prevented by removing that part of the upper metal wire 305 which is neither protected by the protective insulating film 307 nor the ACF 310.

Further, FIG. 22 is a plan view showing a configuration of a connection terminal area on an active-matrix substrate described in Patent Literature 2.

As shown in FIG. 22, the active-matrix substrate includes: a glass substrate 401; scanning wires 402 provided on the glass substrate 401; a counter substrate 411; and a sealing agent 412 provided between the glass substrate 401 and the counter substrate 411, the scanning wires extending from pixel sections into an area outside of the sealing agent 412. Each of the scanning wires 402 has an end that serves as a terminal electrode 403 (gate input terminal) for use in connection with an external flexible wiring board 420 constituted by a polymer film or the like.

In Patent Literature 2, by forming slits 404 in an exposed part of each scanning wire 402 outside of the sealing agent 412, the exposed part of the scanning wire 402 is separated into plural parts.

Thus, in Patent Literature 2, the slits 404 suppress the progression of corrosion caused by immersion of the scanning wire 402 in dewdrops or the like.

CITATION LIST

Patent Literature 1

Japanese Patent Application Publication, Tokukaihei, No. 8-6059 (Publication Date: Jan. 12, 1996)

Patent Literature 2

Japanese Patent Application Publication, Tokukaihei, No. 8-82805 (Publication Date: Mar. 26, 1996)

SUMMARY OF INVENTION

Technical Problem

However, the structure described above in Patent Literature 1 is a structure from which each metal wire has been partly removed as mentioned above. For this reason, an attempt to achieve the structure described in Patent Literature 1 results in an increase in the number of masks that are needed for manufacturing, thus incurring a rise in manufacturing cost.

Further, in such a case as in Patent Literature 2 where slits 404 are formed in an exposed part of each scanning wire 402, the progression of corrosion of the scanning wire 402 can be suppressed. However, Patent Literature 2 does not prevent corrosion per se. For this reason, Patent Literature 2 does not bring a fundamental solution to the problems described above.

In particular, metal wires have recently been made lower in resistance as display devices have been made higher in definition and larger in screen size. Therefore, wiring materials, such as Al (aluminum) and Cu (copper), which are low in resistance but poor in corrosion resistance have been widely used instead of conventional wiring materials, such as Cr (chromium), which have corrosion resistance.

As mentioned above, the same metal wire is used in the connection area and each pixel section provided inside of the cell. For this reason, in a case where the metal wire is made of a low-resistance wiring material such as Cu, a defect in a transparent electrode such as an ITO electrode covering an end face of an interlayer insulating film (planarizing film) in contact with the metal wire causes the metal wire to corrode from the interlayer insulating film and an end face part of an insulating film such as a gate insulating film under the interlayer insulating film, thus undesirably causing problems such as wire breakage.

A possible reason for this is as follows: Such an interlayer insulating film made of a resin material (i.e., an organic insulating film) does not have a dense structure as an inorganic insulating film does, and as such, has its surface roughened by dry etching. In a case where a transparent conductive film such as an ITO film is formed on such an interlayer insulating film having a rough surface, the resulting transparent conductive film is not free from a defect. Such a defect allows moisture, etc. to enter through an end face of the insulating film under the transparent conductive film, thus causing corrosion.

However, neither Patent Literature 1 nor Patent Literature 2 mentions anything about a difference depending on the surface state of a lower layer (foundation layer) on which a transparent conductive film is laminated.

The present invention has been made in view of the foregoing problems, and it is an object of the present invention to provide a wiring board capable of preventing a metal electrode from corroding due to a defect in a transparent conductive film covering an end face of an organic insulating film as described above, a method for manufacturing such a wiring substrate, a display panel, and a display device.

Solution to Problem

In order to solve the foregoing problems, a wiring board according to the present invention includes: an insulating substrate; a metal wire provided on the insulating substrate; an inorganic insulating film covering the metal wire; an organic insulating film covering the inorganic insulating film; and a conductive film formed on the organic insulating film. The metal wire is provided with a region where the conductive film is laminated directly on the metal wire without the inorganic insulating film and the organic insulating film being sandwiched therebetween. Further, the conductive film extends over the region in such a way as to cover an end face of the organic insulating film that faces the region and an end face of the inorganic insulating film that faces the region, and the end face of the organic insulating film is further away from the region than the end face of the inorganic insulating film.

In order to provide the metal wire with a region where the conductive film is laminated directly on the metal wire without the inorganic insulating film and the organic insulating film being sandwiched therebetween, such as an external-device connection area or a wire connection area on the wiring substrate, it is necessary to execute the step of patterning the organic insulating film, the step of dry-etching the inorganic insulating film with use of the organic insulating film as a mask, etc. For this reason, the organic insulating film in the wiring substrate thus configured has its surface damaged before the formation of the conductive film. For this reason, that part of the conductive film which makes contact with the organic insulating film is not densely formed and may therefore suffer from a defect.

However, even if a defect occurs in that part of the conductive film which covers the organic insulating film, the foregoing configuration keeps a large distance between the defect and an area therebelow where the inorganic insulating film makes contact with the conductive film. This prevents the intrusion or runabout entry of a corrosion-accelerating component.

Therefore, even if a defect occurs in the conductive film on the organic insulating film, the foregoing configuration can prevent the metal wire from corroding or breaking due to the surface state of the organic insulating film.

Therefore, the foregoing configuration makes it possible to provide a wiring board which can prevent the metal wire from corroding due to a defect in a transparent conductive film covering the end face of the organic insulating film and which is superior in corrosion resistance.

Further, according to the foregoing configuration, the end face of the inorganic insulating film that faces the region and the end face of the organic film covering the inorganic insulating film are spaced from each other. For this reason, there is a step between the inorganic insulating film and the organic insulating film. For this reason, the foregoing configuration can render gradual a step that is to be straddled by the conductive film extending from the surface of the organic insulating film into the region. In the result, the coverage of the conductive film can also be improved.

Further, a display panel according to the present invention includes such a wiring board. A display device according to the present invention includes such a display panel. This makes it possible to provide a display panel and a display device which can prevent the metal wire from corroding due to a defect in a transparent conductive film covering the end face of the organic insulating film and which are superior in corrosion resistance.

In order to solve the foregoing problems, a method for manufacturing a wiring substrate according to the present invention includes: a metal wire forming step of forming a metal wire on an insulating substrate; an inorganic insulating film forming step of forming an inorganic insulating film that covers the metal wire; an organic insulating film forming step of pattern-forming an organic insulating film that covers the inorganic insulating film; an inorganic insulating film patterning step of pattering the inorganic insulating film with use of the organic insulating film as a mask and thereby exposing part of the metal wire; and a conductive film forming step of forming a conductive film on the organic insulting film so that the conductive film covers an end face of the organic insulating film and an end face of the inorganic insulating film and makes contact with the exposed part of the metal wire, the method further including a mask layer forming step of forming a mask layer on the inorganic insulating film so that the mask layer overlaps the metal wire, the mask layer functioning as a mask during patterning of the inorganic insulating film, the mask layer forming step being executed between the inorganic insulating film forming step and the organic insulating film forming step, by pattern-forming the organic insulating film in the organic insulating film forming step so that the end face of the organic insulating film is located on the mask layer and by patterning the inorganic insulating film in the inorganic insulating film patterning step with use of the organic insulating film and the mask layer as masks, the end face of the organic insulating film being made further away from a region than the end face of the inorganic insulating film, the region being a region where the metal wire is exposed, the end faces each facing the region.

Further in order to solve the foregoing problems, a method for manufacturing a wiring substrate according to the present invention includes: a metal wire forming step of forming a metal wire on an insulating substrate; an inorganic insulating film forming step of forming an inorganic insulating film that covers the metal wire; an organic insulating film forming step of pattern-forming an organic insulating film that covers the inorganic insulating film; an inorganic insulating film patterning step of pattering the inorganic insulating film with use of the organic insulating film as a mask and thereby exposing part of the metal wire; and a conductive film forming step of forming a conductive film on the organic insulting film so that the conductive film covers an end face of the organic insulating film and an end face of the inorganic insulating film and makes contact with the exposed part of the metal wire, the method further including a partial organic insulating film removing step of etching back (e.g., ashing or ashing combined with half exposure during the formation of the organic insulating film) part of the organic insulating film, the part covering the inorganic insulating film, and thereby making the end face of the organic insulating film further away from a region than the end face of the inorganic insulating film, the region being a region where the metal wire is exposed, the end faces each facing the region, the partial organic insulating film removing step being executed between the inorganic insulating film patterning step and the conductive film forming step.

Further, in order to solve the foregoing problems, a method for manufacturing a wiring substrate according to the present invention includes: a first metal wire forming step of forming a first metal wire on an insulating substrate; a first inorganic insulating film forming step of forming a first inorganic insulating film that covers the first metal wire; a second metal wire forming step of forming a second metal wire on the first inorganic insulating film; a second inorganic insulating film forming step of forming a second inorganic insulating film that covers the second metal wire; an organic insulating film forming step of pattern-forming an organic insulating film that covers the second inorganic insulating film; an inorganic insulating film patterning step of forming an opening by patterning the first and second inorganic insulating films with use of the organic insulating film as a mask and thereby exposing parts of the first and second metal wires inside of the opening; and a conductive film forming step of forming a conductive film on the organic insulting film so that the conductive film covers an end face of the organic insulating film and end faces of the first and second inorganic insulating films and makes contact with the exposed parts of the first and second metal wires, the method further including a partial organic insulating film removing step of etching back (e.g., ashing or ashing combined with half exposure during the formation of the organic insulating film) parts of the organic insulating film, the parts covering the first and second inorganic insulating films, and thereby making the end face of the organic insulating film further away from a region than the end faces of the first and second inorganic insulating films, the region being a region where the first and second metal wires are exposed, the end faces each facing the region, the partial organic insulating film removing step being executed between the inorganic insulating film patterning step and the conductive film forming step.

Further, in order to solve the foregoing problems, a method for manufacturing a wiring substrate according to the present invention includes: a first metal wire forming step of forming a first metal wire on an insulating substrate; a first inorganic insulating film forming step of forming a first inorganic insulating film that covers the first metal wire; a second metal wire forming step of forming a second metal wire on the first inorganic insulating film; a second inorganic insulating film forming step of forming a second inorganic insulating film that covers the second metal wire; an organic insulating film forming step of pattern-forming an organic insulating film that covers the second inorganic insulating film; an inorganic insulating film patterning step of forming an opening by patterning the first and second inorganic insulating films with use of the organic insulating film as a mask and thereby exposing parts of the first and second metal wires inside of the opening; and a conductive film forming step of forming a conductive film on the organic insulting film so that the conductive film covers an end face of the organic insulating film and end faces of the first and second inorganic insulating films and makes contact with the exposed parts of the first and second metal wires, the method further including a mask layer forming step of forming a mask layer on the first inorganic insulating film so that the mask layer overlaps the first metal wire, the mask layer functioning as a mask during patterning of the first inorganic insulating film, the mask layer forming step being executed between the first metal wire forming step and the first inorganic insulating film forming step, by pattern-forming the organic insulating film in the organic insulating film forming step so that the end face of the organic insulating film is located on the mask layer and by patterning the first and second inorganic insulating films in the inorganic insulating film patterning step with use of the organic insulating film and the mask layer as masks, the end face of the organic insulating film being made further away from a region than the end face of the first inorganic insulating film, the region being a region where the first metal wire is exposed, the end faces each facing the region.

Use of any of the method described above makes it possible to manufacture a wiring board according the present invention. It should be noted, as described above, that in a case where the region is a region of connection between the first metal wiring layer and the second metal wiring layer and is formed in an area inside of the sealing agent, corrosion is less likely than in a case where the region is provided in an area outside of the sealing agent. For this reason, in such a case, as described above, the wiring board may be structured such that the mask layer prevents only the first metal wiring layer from corroding.

Advantageous Effects of Invention

According to a wiring board, a method for manufacturing a wiring board, a liquid crystal panel, and a display device according to the present invention, as described above, an end face of an organic insulating film that faces a region where the conductive film is laminated directly on a metal wire without an inorganic insulating film and the organic insulating film being sandwiched therebetween is formed further away from the region than an end face of the inorganic insulating film that faces the region.

For this reason, even if a defect occurs in that part of the conductive film which covers the organic insulating film, the foregoing configuration keeps a large distance between the defect and an area therebelow where the inorganic insulating film makes contact with the conductive film. This prevents the intrusion or runabout entry of a corrosion-accelerating component.

Therefore, even if a defect occurs in the conductive film on the organic insulating film, the present invention can prevent the metal wire from corroding or braking due to the surface state of the organic insulating film.

DESCRIPTION OF EMBODIMENTS

Embodiment 1

An embodiment of the present invention is described below mainly with reference to (a) and (b) of FIG. 1 through (a) and (b) of FIG. 7, FIG. 19, and FIG. 20.

Figure 2:
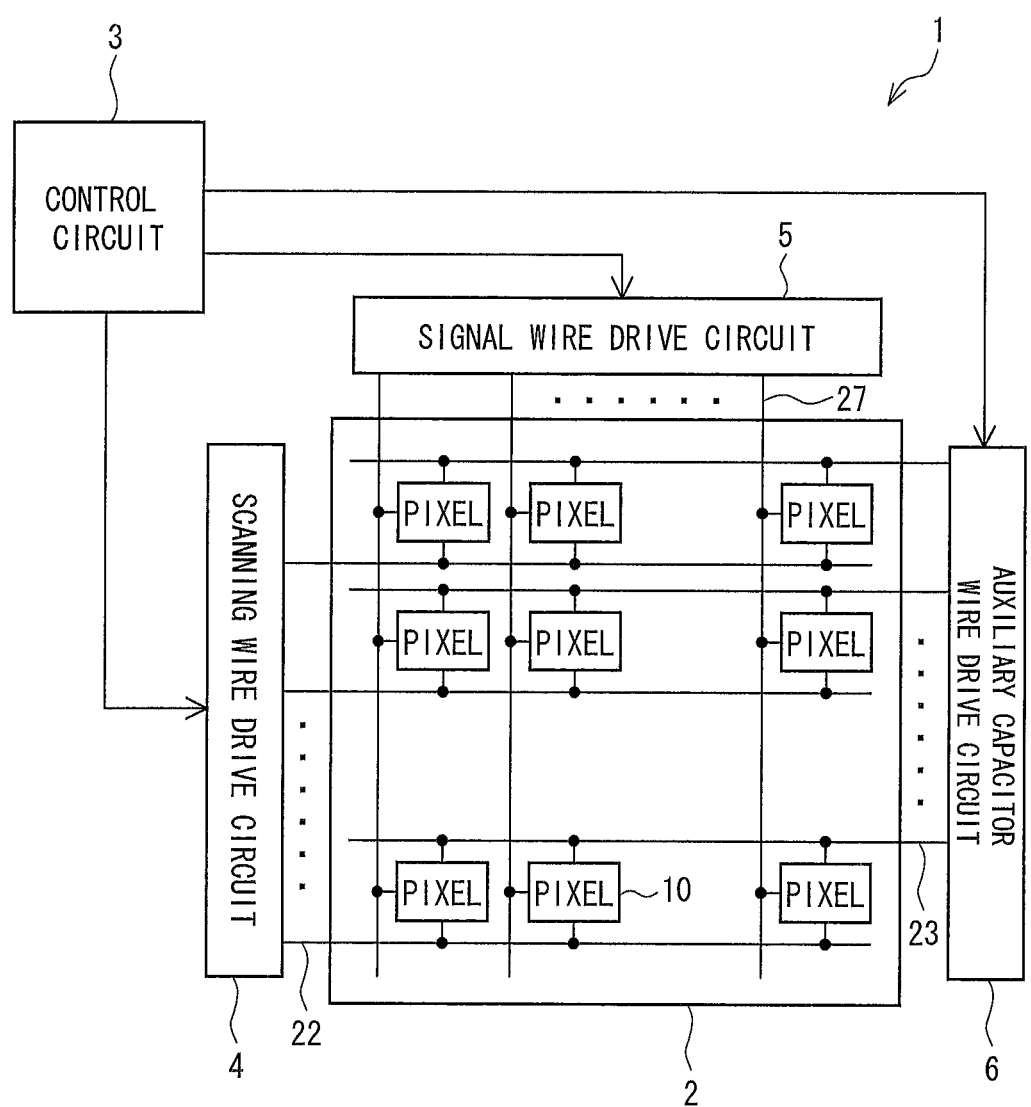
FIG. 2 is a block diagram schematically showing a configuration of a main part of a liquid crystal display device according to Embodiment 1 of the present invention.

FIG. 2 is a block diagram schematically showing a configuration of a main part of a liquid crystal display device according to the present embodiment.

As shown in FIG. 2, a liquid crystal display device 1 according to the preset embodiment includes: a liquid crystal panel 2 (display panel), on which pixels 10 are arranged in a matrix manner; a drive circuit, which drives the liquid crystal panel 2; a control circuit, which controls driving of the drive circuit; and, as needed, a backlight unit (not illustrated), etc.

The liquid crystal panel 2 is provided with a plurality of scanning wires 22 and a plurality of signal wires 27 each intersecting with each of the scanning wires 22, and has a pixel 10 (pixel section) provided for each combination of a scanning wire 22 and a signal wire 27. Further, the liquid crystal panel 2 has auxiliary capacitor wires 23 provided, as needed, in the same layer as the scanning wires 22 in such a way as to extend substantially in parallel with the scanning wires 22 across the pixels 10.

Further, the drive circuit includes: a scanning wire drive circuit 4, which drives the scanning wires 22 in the liquid crystal panel 2; a signal wire drive circuit 5, which drives the signal wires 27 in the liquid crystal panel 2; and, as needed, an auxiliary capacitor wire drive circuit 6, which drives the auxiliary capacitor wires 23 in the liquid crystal panel 2. The scanning wire drive circuit 4, the signal wire drive circuit 5, and the auxiliary capacitor wire drive circuit 6 are connected to the scanning wires 22, the signal wires 27, and the auxiliary capacitor wires 23, respectively, in such a way as to be able to independently supply external potentials to these metal wires.

Each of these drive circuits is connected to the control circuit 3, and is controlled by control signals and video signals that are supplied from the control circuit 3.

Figure 3:
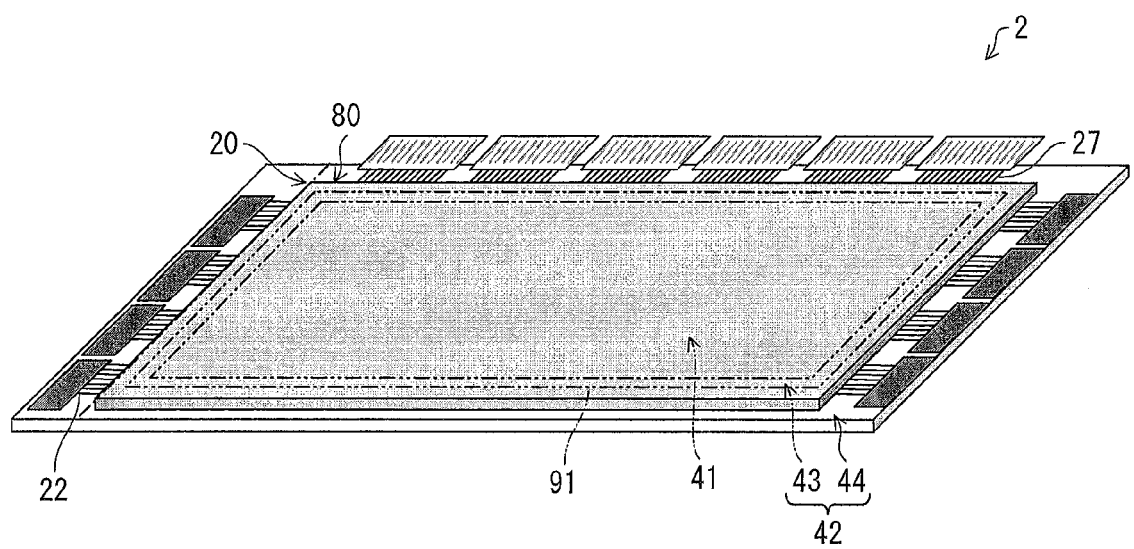
FIG. 3 is a perspective view schematically showing a configuration of a liquid crystal panel in the liquid crystal display device of FIG. 2.

FIG. 3 is a perspective view schematically showing a configuration of the liquid crystal panel in the liquid crystal display device of FIG. 2.

Figure 1:
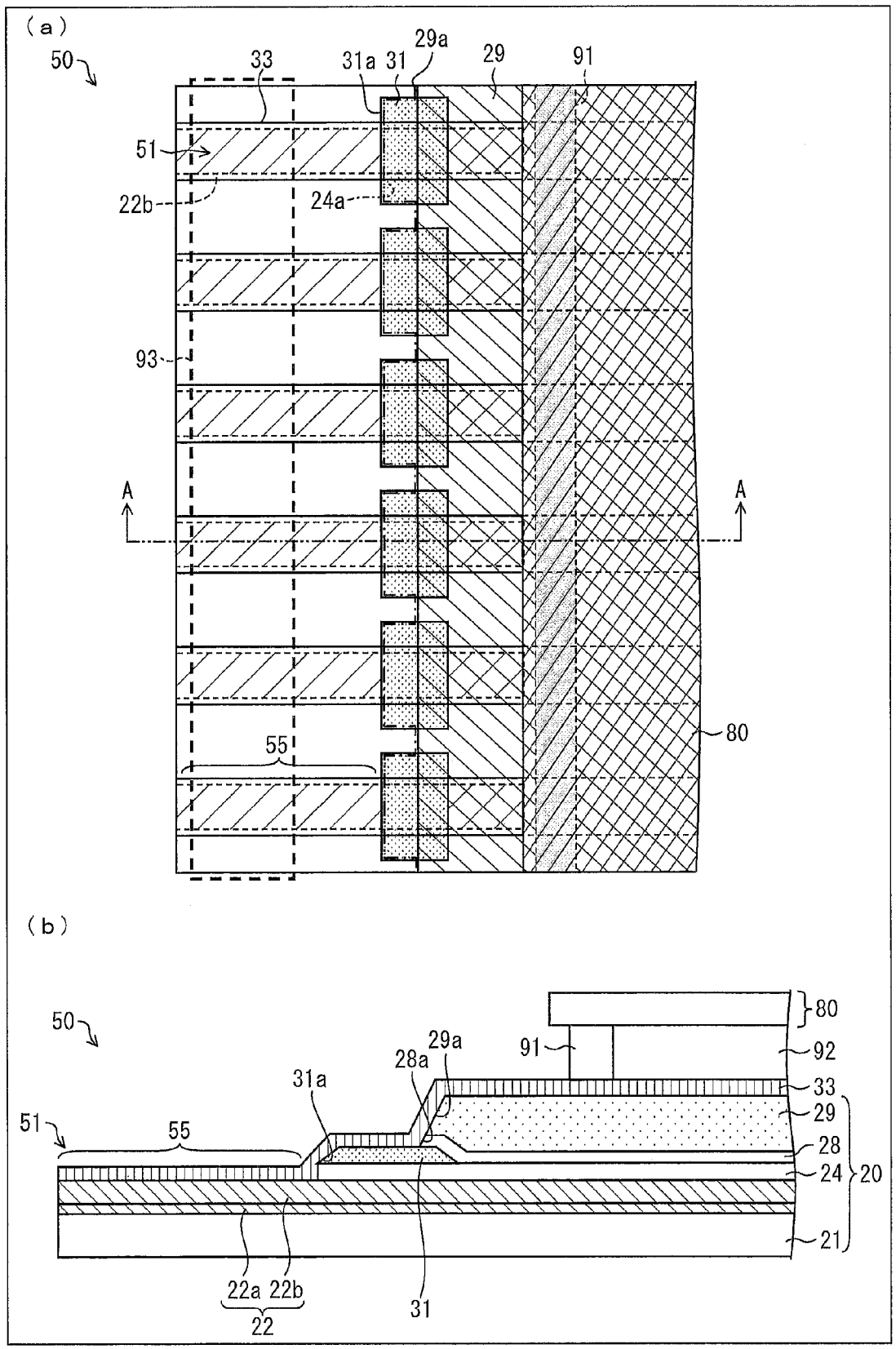
FIG. 1 shows (a) a plan view schematically showing a configuration of a scanning wire connection area on an active-matrix substrate according an embodiment of the present invention and an area therearound and (b) a cross-sectional view of the active-matrix substrate taken along the arrow A-A in (a) of FIG. 1.

As shown in FIG. 3, the liquid crystal panel 2 includes: an active-matrix substrate 20 (element substrate, wiring board), on which drive elements (switching elements; not illustrated) are provided; a counter substrate 80; and a liquid crystal layer 92 (see (b) of FIG. 1) provided between the active-matrix substrate 20 and the counter substrate 80. Further provided, as needed, on surfaces opposite those surfaces of the active-matrix substrate 20 and the counter substrate 80 which face each other are a wave plate and a polarizer (both not illustrated).

As shown in FIG. 3, the active-matrix substrate 20 is larger in area than the counter substrate 80. The active-matrix substrate 20 and the counter substrate 80 are joined to each other by a sealing agent 91 extending along the edge of the counter substrate 80.

The liquid crystal layer 92 is constituted by a liquid crystal material sealed in a region surrounded by the sealing agent 91 (i.e., in the inner part of a cell surrounded by the sealing agent 91 and formed by the active-matrix substrate 20 and the counter substrate 80).

The active-matrix substrate 20 includes: a display region 41, which displays an image that is viewed by a viewer; and a non-display region 42, provided outside of the display region, where an image is not viewed by a viewer.

The display region 41 is a region surrounded by the sealing agent 91 where the active-matrix substrate 20 and the counter substrate 80 face each other with the liquid crystal layer 92 sandwiched therebetween. Meanwhile, the non-display region 42 is constituted by a sealing part 43 where the sealing agent 91 is provided and a connection area 44 (peripheral terminal region) provided outside of the sealing part 43.

The active-matrix substrate 20 has a region in its peripheral part that runs off the edge of the counter substrate 80. Provided in the region is a connection area 44 including (i) drawn wires, drawn from the inside (display region 41) of the cell, which extend from metal wires such as the scanning wires 22 and the signal wires 27 and (ii) terminal areas (see FIG. 4) of the drawn wires.

Each of the terminal electrodes in the connection area 44 is electrically connected by an ACF or the like to an external device or, specifically, to a driving IC (integrated circuit) such as the scanning wire drive circuit 4 or the signal wire drive circuit 5, a driving LSI (large-scale integrated circuit), or an output terminal of a wire on a flexible wiring board (flexible printed wiring board: FPC board), such as a TCP or a COF (chip-on film), on which such a drive circuit has been mounted.

Figure 4:
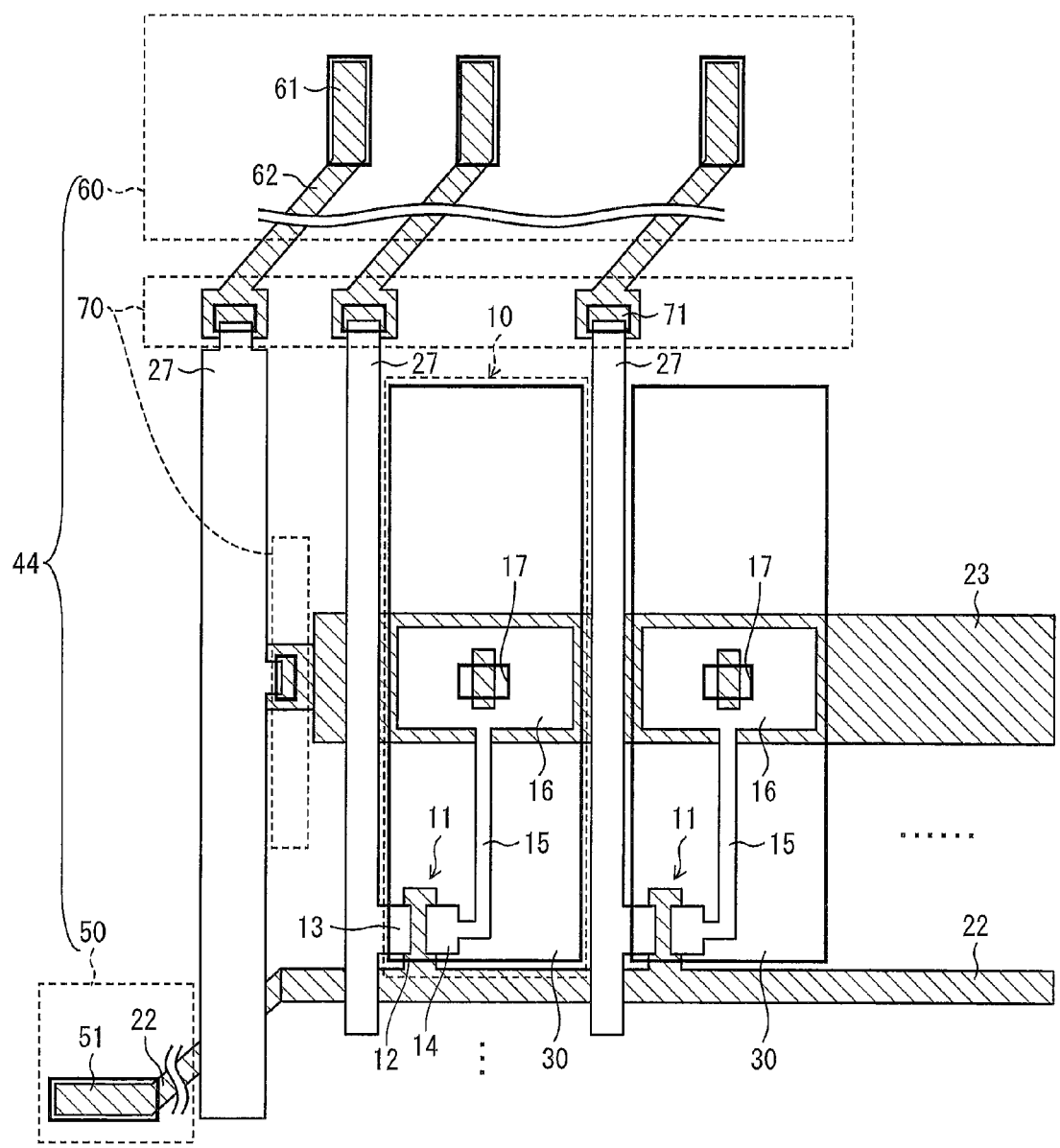
FIG. 4 is a plan view showing a wiring structure of a main part of an active-matrix substrate in the liquid crystal panel of FIG. 3.

FIG. 4 is a plan view showing a wiring structure of a main part of the active-matrix substrate 20 in the liquid crystal panel of FIG. 3. The present embodiment is described by taking, as an example, a case where the active-matrix substrate 20 used is a TFT substrate including TFTs as drive elements.

As shown in FIG. 4, the active-matrix substrate 20 has a plurality of scanning wires 22 and a plurality of signal wires 27 so arranged inside of a cell surrounded by the sealing agent 91 as to intersect with one another. Provided near each of the intersections between the scanning wires 22 and the signal wires 27 is a pixel 10 (pixel section) having a TFT 11 as a drive element (switching element). Each pixel 10 is provided with a pixel electrode 30.

The TFT 11 has its scanning electrode 12 connected to a scanning wire 22, its signal electrode 13 connected to a signal wire 27, and its drain electrode 14 electrically connected to the pixel electrode 30 via a drain wire 15, whereby when the scanning wire 22 has been selected, the TFT 11 in each pixel 10 becomes conductive, so that a signal voltage determined on the basis of a display data signal supplied from the control circuit 3 is applied by the signal wire drive circuit 5 to the liquid crystal panel 2 via the signal wire 27. Ideally, the liquid crystal panel 2 keeps retaining a cutoff voltage while the TFT 11 is off after the end of a selection period of the scanning wire 22.

Further, as mentioned above, the liquid crystal panel 2 has auxiliary capacitor wires 23 provided in the same layer as the scanning wires 22 in such a way as to extend substantially in parallel with the scanning wires 22 across the pixels 10.

Figure 6:
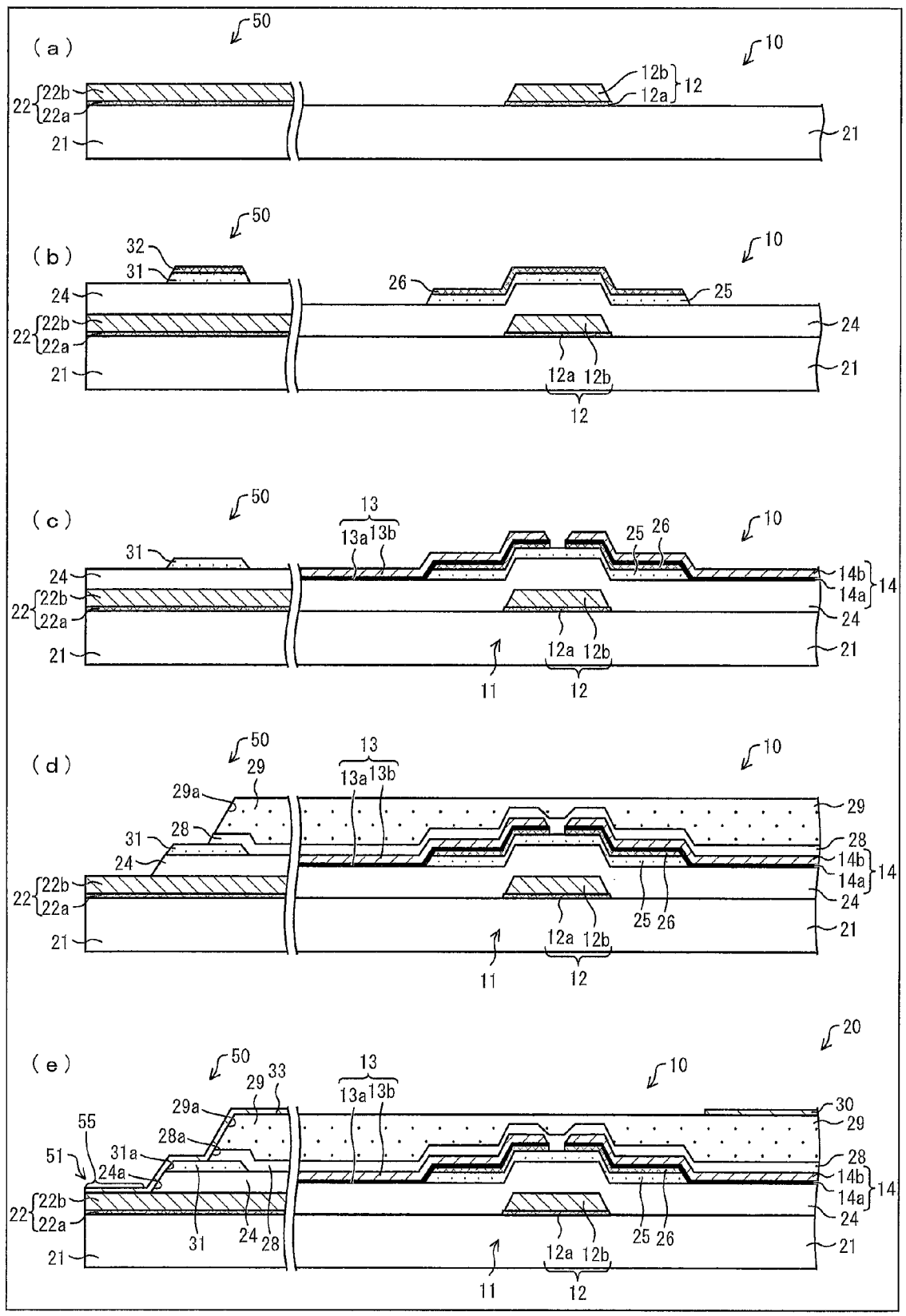
FIG. 6 is a set of cross-sectional views (a) through (e) of the active-matrix substrate of FIG. 1, the cross-sectional views (a) through (e) showing successive steps of a process by which the active-matrix substrate is manufactured.

On each of the auxiliary capacitor wires 23, an intermediate electrode 16 extending from the drain wire 15 is provided for each pixel 10 in the same layer as the drain electrode 14 via a gate insulating film 24 (not illustrated; see (e) of FIG. 6).

The intermediate electrode 16 is electrically connected to the pixel electrode 30 via a contact hole 17. The auxiliary capacitor electrode 23 and the intermediate electrode 16 function as electrodes for an auxiliary capacitor that is formed in each pixel 10. According to the present embodiment, the auxiliary capacitor that is formed between the auxiliary capacitor electrode 23 and the intermediate electrode 16 allows stabilization of a pixel potential. However, the auxiliary capacitor electrode 23 and the intermediate electrode 16 may be formed as needed, and are not necessarily essential.

In the connection area 40 on the active-matrix substrate 20, as shown in FIG. 4, there are provided a scanning wire connection area 50, a signal wire connection area 60, a wire connection area 70, and, as needed, an auxiliary wire connection area, etc. (not illustrated).

The scanning wire connection area 50 includes (i) scanning terminals 51 (terminal electrodes) via which the scanning wires 22 receive external signals, respectively, and (ii) drawn wires extending from the scanning wires 22, respectively. The signal wire connection area 60 includes (i) signal terminals 61 (terminal electrodes) via which the signal wires 27 receive external signals, respectively, and (ii) drawn wires extending from the signal wires 27 (connection wires 62 connected to the signal wires 27), respectively. The wire connection area 70 is used for electrical connection between a first metal wiring layer (gate metal layer) in which the scanning wires 22 are provided and a second metal wiring layer (source metal layer) in which the signal wires 27 are provided. Further, the auxiliary capacitor wire connection area (not illustrated) includes signal terminals (terminal electrodes) via which the auxiliary capacitor wires 23 receive external signals, respectively.

Next, those layers constituting the active-matrix substrate 20 are described below with reference to (e) of FIG. 6.

It should be noted that the following description is given by taking a laminated structure in the scanning wire connection area 50 as an example of a laminated structure in the connection area 44.

However, a laminated structure in the signal wire connection area 60 is identical in structure to the laminated structure in the scanning wire connection area 50, as long as the laminated structured are concerned. That is, as shown in FIG. 4, the signal wires 27 are electrically connected via contact holes 71 provided in the wire connection area 70 to the connection wires 62 provided in the same layer as the scanning wires 22.

Therefore, as described above, the terminal areas of the signal wires 27 make changes in connection (changes in layer) from the source metal layer to the gate metal layer in the wire connection area 70, thereby being formed in the same layer as the scanning wires 22. In the signal wire connection area 60, the connection wires 62 formed in the same layer as the scanning wires 22 are provided instead of the drawn wires extending from the scanning wires 22.

It should be noted that, as described above, the wire connection area 70 may be provided outside or inside of the sealing agent 91 (outside or inside of the cell).

FIG. 6 is a set of cross-sectional views (a) through (e) of the active-matrix substrate 20, the cross-sectional views (a) through (e) showing successive steps of a process by which the active-matrix substrate 20 is manufactured. It should be noted that in each of (a) through (e) of FIG. 6, a cross-section of the scanning wire connection area 50 and a cross-section of an area near a TFT 11 in each pixel 10 are juxtaposed as cross-sections of the non-display and display regions 42 and 41 of the active-matrix substrate 20 at the end of the corresponding step.

As shown in (e) of FIG. 6, the active-matrix substrate 20 according to the present embodiment includes a glass substrate 21 as a transparent insulating substrate (base substrate, wire retaining means).

It should be noted that the insulating substrate does not necessary need to be a glass substrate, and may for example be a plastic substrate or the like. Further, the insulating substrate does not necessarily need to be transparent, and it is only necessary that at least either the active-matrix substrate 20 or the counter substrate 80 have translucency. The insulating substrate (base substrate) is not to be particularly limited, as long as it can retain a display medium, such as liquid crystals, and wires.

First, a laminated structure of the display region 41 in the active-matrix substrate 20 is described.

The active-matrix substrate 20 has its display region 41 structured such that a TFT 11 serving as a drive element is provided for each pixel 10 on the glass substrate 21. Specifically, a first metal wiring layer (gate metal layer), a gate insulating film 24, a channel layer 25 (semiconductor layer), an electrode contact layer 26 (semiconductor layer), a second metal wiring layer (source metal layer), a protective film 28 (passivation film), an interlayer insulating film 29, and a pixel electrode 30 are provided in the order named over the glass substrate 21. Further, the active-matrix substrate 20 has an alignment film (not illustrated) provided, as needed, on the pixel electrode 30.

The first metal wiring layer is constituted by a scanning electrode 12 (e.g., an upper scanning electrode 12b/a lower scanning electrode 12a), a scanning wire 22 (e.g., an upper scanning wire 22b/a lower scanning wire 22a), an auxiliary capacitor wire 23 (see FIG. 4, e.g., an upper auxiliary capacitor wire/a lower auxiliary capacitor wire), a connection wire 62 (see FIG. 4, e.g., an upper connection wire/a lower connection wire), etc. Further, the second metal wiring layer is constituted by a signal electrode 13 (e.g., an upper signal electrode 13b/a lower signal electrode 13a), a drain electrode 14 (e.g., an upper drain electrode 14b/a lower drain electrode 14a), a signal wire 27 (see FIG. 4, e.g., an upper signal wire/a lower signal wire), an intermediate electrode 16 (see FIG. 4, e.g., an upper intermediate electrode/a lower intermediate electrode), etc.

As shown (e) of FIG. 6, the TFT 11 has such a structure that the scanning electrode 12, the gate insulating film 24, the channel layer 25, the electrode contact layer 26, the signal electrode 13, and the drain electrode 14 are laminated in the order named. Further, the TFT 11 and the second metal wiring layer have their surfaces protected by the protective film 28, as described above, so that the metal films are prevented from breaking away.

Next, a laminate structure of the scanning wire connection area 50 in the active-matrix substrate 20 is described.

In the scanning wire connection area 50, as shown in (e) of FIG. 6, the scanning wire 22 connected to the scanning electrode 12 (display electrode) is provided as a drawn wire extending from the inside (display region 21) of the cell.

Over the scanning wire 22 in the scanning wire connection area 50, the gate insulating film 24, a first semiconductor layer 31, the protective film 28, the interlayer insulating film 29, and the transparent electrode 33 are laminated in the order named. Further provided at an end of the scanning wire 22 by laminating the transparent electrode 33 directly on the scanning wire 22 is a terminal area 55.

As described above, the scanning wire 22, gate insulating film 24, and interlayer insulating film 29 provided in the pixel section extend into the scanning wire connection area 50. In the signal wire connection area 60, the signal wire 27, gate insulating film 24, and interlayer insulating film 29 provided in the pixel section extend into the signal wire connection area 60. The first metal wiring layer, the gate insulating film 24, the interlayer insulating film 29 are used both in the display region 41 and the non-display region 42 (connection area 44).

Further, as shown in (e) of FIG. 6, the first semiconductor layer 31 is formed in the same layer as the channel layer 25. That is, the first semiconductor layer 31 can be formed of the same material at the same time as the channel layer 25.

Further, as shown in (e) of FIG. 6, the pixel electrode 30 and the transparent electrode 33, formed on the interlayer insulating film 29, are formed in the same layer. That is, the pixel electrode 30 and the transparent electrode 33 can be formed of the same material at the same time.

It is preferable that the first metal wiring layer and the second metal wiring layer be low-resistance metal films. Especially, in recent years, there has been a strong demand to make metal wires lower in resistance as display devices have been made higher in definition and larger in screen size Therefore, the first metal wiring layer and the second metal wiring layer are suitably made of a metal material, e.g., a low-resistance metal, such as Al (aluminum) and Cu (copper), or an alloy thereof (e.g., a Cu alloy; hereinafter such low-resistance metals and alloys thereof being collectively referred to as "low-resistance metals").

The first metal wiring layer and the second metal wiring layer may each have a single-layer structure or a laminated structure such as a two-layer structure or a three-layer structure. When the first metal wiring layer and the second metal wiring layer have such laminated structures, the first metal wiring layer and the second metal wiring layer bring about such an advantage that wire breakage is more unlikely than when the first metal wiring layer and the second metal wiring layer have single-layer structures.

When the first metal wiring layer and the second metal wiring layer have such laminated structures, it is preferable that the first metal wiring layer and the second metal wiring layer have their upper metal wiring layers made of such a low-resistance metal as those named above.

On the other hand, the first metal wiring layer and the second metal wiring layer can have their lower metal wiring layers made of, but not particularly limited to, Cr (chromium), Ti (titanium), Ta (tantalum), Mo (molybdenum), or an alloy thereof (e.g., a Mo—Ti alloy), for example.

By providing a lower metal wiring layer made of Ti under an upper metal wiring layer made of Cu, for example, as will be described later, the first metal wiring layer can be brought into satisfactorily close contact with the glass substrate 21.

Further, as the gate insulating film 24 and the protective film 28, inorganic insulating films made of $SiN_x$ (silicon nitride), $SiO_2$ (silicon dioxide), etc. can be used. These insulating films may each have a single-layer structure or a laminated structure, too.

Further, as will be described later, a usable example of a material (semiconductor material) of which the channel layer 25 and the first semiconductor layer 31 are made is amorphous silicon. However, the channel layer 25 and the first semiconductor layer 31 are not to be limited to such a material, and may for example be made of IGZO (In, Ga, Zn, O), which is an oxide containing In (indium), Ga (gallium), and Zn (zinc), or an oxidized semiconductor such as ZnO (zinc oxide).

Further, as will be described later, a usable example of the electrode contact layer 26 and of the second semiconductor layer 32 to be described later (see (b) of FIG. 6) is an $n^+$ amorphous silicon layer obtained by highly doping an n-type impurity into amorphous silicon. However, the electrode contact layer 26 and the second semiconductor layer 32 are not to be limited to such a layer, and, for example, may each be a semiconductor layer obtained doping an impurity into any of the semiconductor materials named above.

Further, the interlayer insulating film 29 used is an organic insulating film made of acrylic resin or the like.

Further, a usable example of the pixel electrode 30 and of the transparent electrode 33 is a transparent conductive film made of ITO (indium tin oxide), IZO (indium zinc oxide), etc.

It should be noted that a method for forming (method for laminating) each of the layers is not to be particularly limited, and various conventional publicly-known methods can be applied as such.

The active-matrix substrate 20 is joined to the counter substrate 80 by a region other than the terminal areas 55 of the scanning wires 22 and terminal areas (not illustrated) of the signal wires 27. Provided between the scanning terminals 51 and signal terminals 61 and the counter substrate 80 is a margin for connecting the counter substrate 80 to an external device via the drawn wires.

These scanning terminals 51 and signal terminals 61 are used as connection terminals with external devices (specifically, a driving IC, a driving LSI, and a peripheral circuit such as an FPC board). For example, by connecting these scanning terminals 51 and signal terminals 61 to terminals of a TAB (tape automated bonding) tape serving as a driving LSI package connected to an FPC board, a liquid crystal display device can be manufactured which is driven by the driving LSI.

Next, a configuration of the scanning wire connection area 50, a configuration of the signal wire connection area 60, and a configuration of the auxiliary capacitor wire connection area (not illustrated) are described in detail with reference to (a) and (b) of FIG. 1 by taking the scanning wire connection area 50 of the connection area 44 as an example of a connection area for use in connection to an external device.

It should be noted the following description is given by taking the scanning wire connection area 50 of the connection area 44 as an example of a connection area for use in connection to an external device.

However, as mentioned above, the terminal areas of the signal wires 27 make changes in connection (changes in layer) from the source metal layer to the gate metal layer in the wire connection area 70, thereby being formed in the same layer as the scanning wires 22. Similarly, the auxiliary capacitor wire connection area also has its drawn wires formed in the gate metal layer. For this reason, the scanning wire connection area 50, the signal wire connection area 60, and the auxiliary capacitor wire connection area are only different by the names of the wires, and are identical in structure to one another.

For this reason, for example, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively. Further, in the auxiliary capacitor wire connection area, too, a similar reading is possible, with changes made only in the names of the metal layers (wires).

FIG. 1 shows (a) a plan view schematically showing a configuration of the scanning wire connection area 50 on the active-matrix substrate 20 and an area therearound and (b) a cross-sectional view of the active-matrix substrate 20 taken along the arrow A-A in (a) of FIG. 1.

As mentioned above, in the scanning wire connection area 50, the scanning wires 22 are provided as drawn wires extending out of the cell surrounded by the sealing agent 91.

As shown in (b) of FIG. 1, each of the scanning wires 22 is configured with its upper scanning wire 22b provided on its lower scanning wire 22a. However, as already explained, the scanning wire 22 is not to be limited to such a configuration.

As shown in (a) and (b) of FIG. 1, the scanning wire 22 is entirely covered with a gate insulating film 24 and an interlayer insulating film 29 provided above the gate insulating film 24, except for a terminal area 55 where a transparent electrode 33 (conductive film) has been laminated directly on the scanning wire 22. The interlayer insulating film 29 and the gate insulating film 24 are not provided in the terminal area 55.

Formed in a region between the terminal area 55 and the sealing agent 91 is a first semiconductor layer 31 that is a semiconductor layer constituted by the same semiconductor layer as a semiconductor layer (channel layer 25) in each TFT 11 (i.e., a semiconductor layer formed of the same material at the same time in the same layer as the channel layer 25).

As shown in (a) of FIG. 1, the first semiconductor layer 31 is wider in line width than the scanning wire 22 and the transparent electrode 33 in such a way to intersect with the scanning wire 22 and the transparent electrode 33. It should be noted that the transparent electrode 33 is wider in line width than the scanning wire 22.

Although the first semiconductor layer 31 is thus wider in line width than the scanning wire 22 and the transparent electrode 33, the first semiconductor layer 31 is narrower than the distance (wiring pitch) between the scanning wire 22 and a scanning wires 22 adjacent thereto, so as not to be connected to a first semiconductor layer 31 disposed above the adjacent scanning wire 22.

The first semiconductor layer 31 is a mask layer that functions as a mask for patterning (or, specifically, dry etching) of the gate insulating film 24.

For this reason, as shown in (a) and (b) of FIG. 1, the first semiconductor layer 31 is provided on the gate insulating film 24 so as to be positioned at an end of the gate insulating film 24 that faces the terminal area 55, so that its end face 31a meets an end face 24a of the gate insulating film 24 that is in contact with the first semiconductor layer 31.

The term "end face" in the present embodiment means an end face facing a region (terminal area 55) where the transparent electrode 33 has been laminated directly on the scanning wire 22, unless otherwise specified.

Further, the interlayer insulating film 29 has its end face 29a formed in such a way as to overlap the first semiconductor layer 31.

For this reason, the first semiconductor layer 31 is provided on the gate insulating film 24 so as to be positioned on an extension of the end face 29a of the interlayer insulating film 29, so that the first semiconductor layer 31 is intersected by the extension. For this reason, the first semiconductor layer 31 covers a position above the position where the scanning signal 22 is intersected by the extension.

The interlayer insulating film 29 functions as a mask for pattering (or, specifically, dry etching) of the gate insulating film 24 and the protective film 28 over the scanning wire 22. For this reason, the protective film 28 has its end face 28a formed in such a way as to meet the end face 29a of the interlayer insulating film 29.

Further, in the region where the first semiconductor layer 31 exists, the end face 24a of the gate insulating film 24 meets the end face 31a of the first semiconductor layer 31. On the other hand, in a region where no first semiconductor layer 31 exits, the end face 24a of the gate insulating film 24 meets the end face 29a of the interlayer insulating film 29 as shown in (a) of FIG. 1.

For this reason, as shown in (a) and (b) of FIG. 1, in the region where the first semiconductor layer 31 exits, part of the first semiconductor layer 31 and part of the gate insulating film 24 extend from the end face 29a of the interlayer insulating film 29 toward the terminal area 55. That is, part of the first semiconductor layer 31 and part of the gate insulating film 24 come out further than the end face 29a of the interlayer insulating film 29 toward the terminal area 55.

Therefore, the end face 24a of the gate insulating film 24 that faces the terminal area 55 is located closer to the terminal area 55 than is the end face 29a of the interlayer insulating film 29 that faces the terminal area 55. In other words, the end face 29a of the interlayer insulating film 29 that faces the terminal area 55 is provided further away from the terminal area 55 than is the end face 24a of the gate insulating film 24 that faces the terminal area 55.

In this way, those parts of the first semiconductor layer 31 and gate insulating film 24 which extend from the end face 29a of the interlayer insulating film 29 toward the terminal area 55 function also as separating walls (separating layers) that separate the scanning wire 22 (or the terminal area 55 in particular), which is a metal wiring layer, from the end face 29a of the interlayer insulating film 29 and from that part of the transparent electrode 33 which is on the end face 29a.

The transparent electrode 33 extends into the terminal area 55 in such a way as to cover an upper surface of the interlayer insulating film 29, the end face 29a of the interlayer insulating film 29, the end face 28a of the protective film 28, an upper surface of the first semiconductor layer 31, the end face 31a of the first semiconductor layer 31, and the end face 24a of the gate insulating film 24. That part of the transparent electrode 33 of the terminal area 55 which covers the scanning wire 22 is used as a scanning terminal 51 (terminal electrode) that is connected to an external device via an ACF 93 (adhesive layer).

As shown in (a) of FIG. 1, the transparent electrode 33 extends to the terminal area 55 along the scanning wire 22 drawn out of the cell, in such a way as to entirely cover the scanning wire 22, which serves as a drawn wire.

On the scanning wire connection area 50, an external device such as a peripheral circuit is mounted by using, as a connection terminal, the scanning terminal 51 constituted by the transparent electrode 33 covering the terminal area 55 of the scanning wire 22.

As shown in (a) of FIG. 1, the scanning terminal 51 is connected by press bonding to the peripheral circuit or the like via the ACF 93, so that a voltage applied from the peripheral circuit or the like is supplied to the scanning electrode 12 via the scanning wire 22.

Next, an effect of preventing intrusion of a corrosion-accelerating component into the active-matrix substrate 20 is explained with reference to FIGS. 5, 19, and 20.

It should be noted the following description is given by taking the scanning wire connection area 50 as an example; however, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively.

Figure 5:
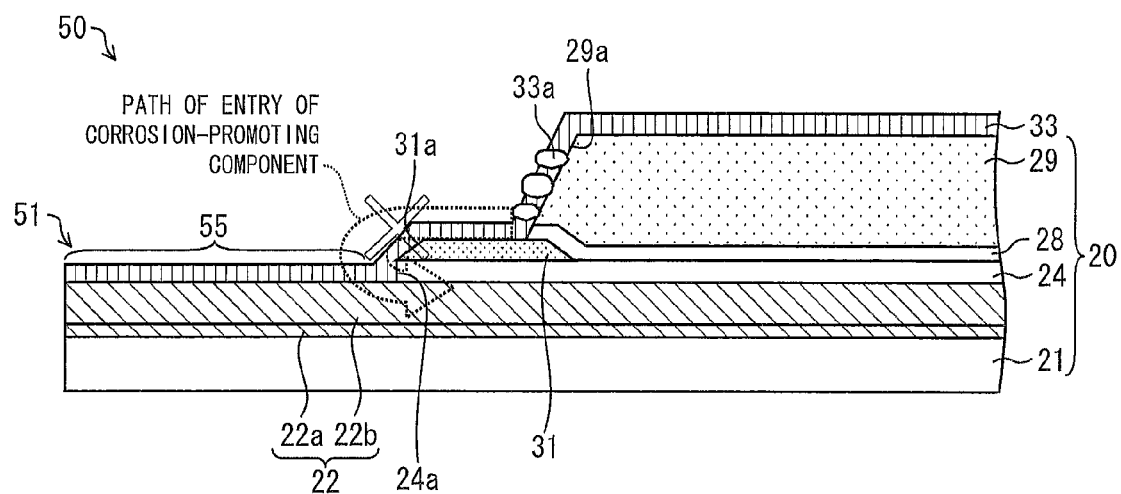
FIG. 5 is a cross-sectional view of a terminal electrode and an area therearound for explaining an effect of preventing intrusion of a corrosion-accelerating component into the active-matrix substrate of (a) and (b) of FIG. 1.

FIG. 5 is a cross-sectional view of a terminal electrode 51 and an area therearound for explaining an effect of preventing intrusion of a corrosion-accelerating component into the active-matrix substrate 20 of (a) and (b) of FIG. 1.

Figure 19:
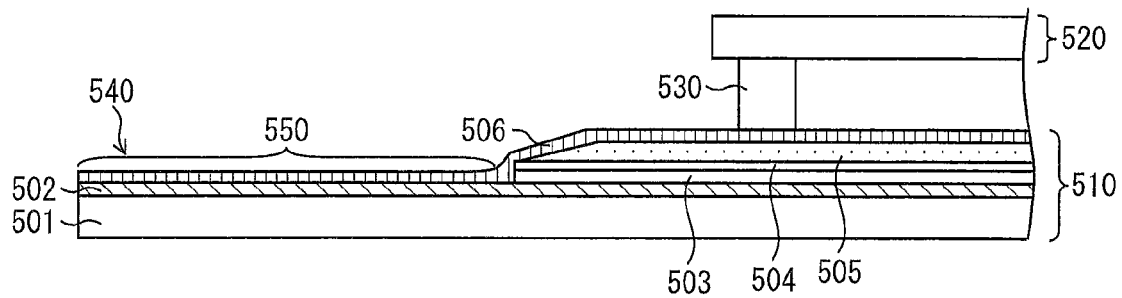
FIG. 19 is a cross-sectional view schematically showing a configuration of a scanning wire connection area on a comparative active-matrix substrate and an area therearound.

Further, FIG. 19 is a cross-sectional view schematically showing a configuration of a scanning wire connection area on a comparative active-matrix substrate and an area therearound. Further, FIG. 20 is a cross-sectional view of a terminal electrode and an area therearound, the cross-sectional view showing a path of entry of a corrosion-accelerating component into the comparative active-matrix substrate of FIG. 19.

As shown in FIG. 19, the comparative active-matrix substrate 510 has its scanning wire connection area configured such that a scanning wire 502, a gate insulating film 503, a protective film 504, an interlayer insulating film 505, and a transparent electrode 506 are laminated in the order named over a glass substrate 501. The scanning wire 502, drawn out of the cell, has a terminal area 550 provided at its end by laminating the transparent electrode 506 directly on the scanning wire 502.

Figure 21:
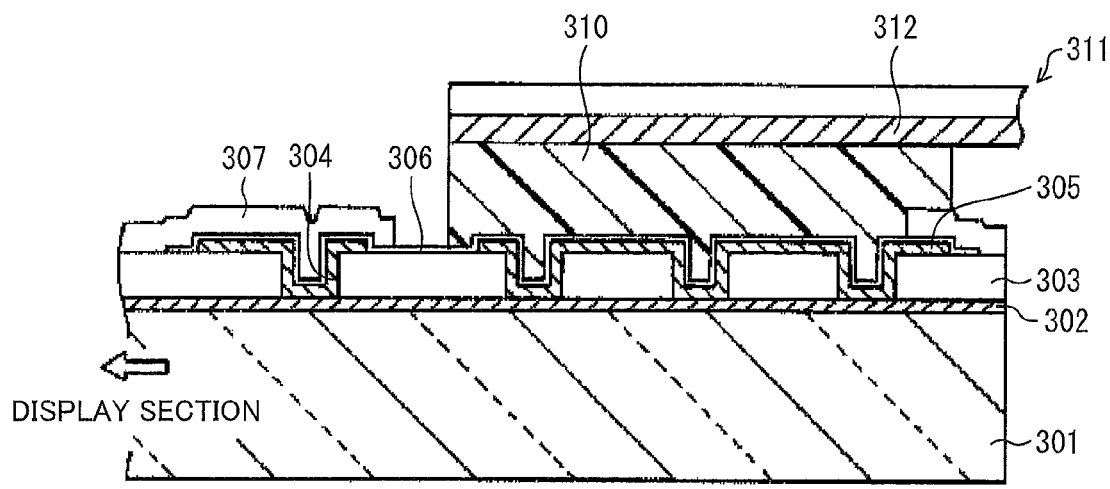
FIG. 21 is a cross-sectional view showing a configuration of a connection area on an active-matrix substrate described in Patent Literature 1.
Figure 22:
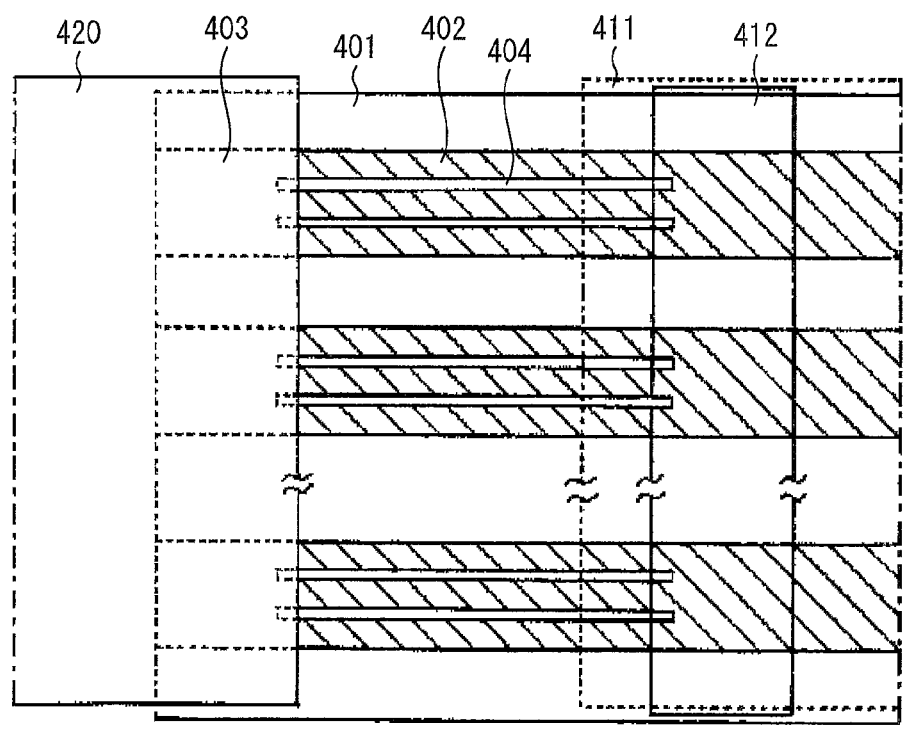
FIG. 22 is a cross-sectional view showing a configuration of a connection area on an active-matrix substrate described in Patent Literature 2.

In Patent Literature 1, as was shown in FIG. 21, the interlayer insulating film 303 is provided both in the position to which the ACF 310 is attached and an area therearound.

However, as with the active-matrix substrate 20 of (a) and (b) of FIG. 1, the comparative active-matrix substrate 510 of FIG. 19 does not have an interlayer insulating film 505, a protective film 504, or a gate insulating film 503 provided in the position (scanning terminal 540) to which the ACF is attached or in an area therearound, which position and area are to serve as a terminal area 550.

As the interlayer insulating film, which is a planarizing film, an organic insulating film whose thickness can be easily increased is used so that unevenness due to wiring can be compensated for. However, organic insulating films in general are more susceptible to mechanical stress and thermal stress and as such are more likely to suffer from cracks than inorganic insulating films.

An active-matrix substrate has terminal areas (terminal electrodes) to which an external device such as a drive circuit (peripheral circuit) is connected via an ACF. For this reason, a region of the active-matrix substrate that runs off the edge of the counter substrate is susceptible to stress during a step of mounting an external device on the terminal areas, a substrate dividing step (dicing), etc.

For this reason, it is preferable that no interlayer insulating film (planarizing film) be provided in the terminal areas (or, specifically, the position to which the ACF is attached and an area therearound) of the active-matrix substrate.

Moreover, because an ACF is characterized by making an electrical connection between an external device and each terminal electrode via conductive particles, a large uneven step between a terminal electrode in the position to which the ACF is attached and the other parts reduce the probability of the conductive particles' making contact with the terminal electrode, thus increasing the probability of a defect in an electrical connection. For this reason, it is preferable that no organic interlayer insulating film (planarizing film) having a great thickness be provided in the terminal areas (or, specifically, the position to which the ACF is attached and an area therearound) of the active-matrix substrate.

For this reason, the active-matrix substrate has an interlayer insulating film pattern-formed in its terminal areas in such a way as not to cover the terminal areas. Therefore, in the connection area on the active-matrix substrate, the lower layers, i.e., the protective film and the gate insulating film, are removed by etching (dry etching) with use of the interlayer insulating film as a mask, so that the metal wires are exposed at the terminal areas.

In the active-matrix substrate thus configured, the adhesion between the transparent conductive film, such as an ITO film, which is used as the terminal electrodes and the surfaces of the scanning wires is satisfactory, and the transparent conductive film is comparatively densely formed.

For this reason, in the active-matrix substrates 20 and 510 thus configured, corrosion hardly begins at the terminal areas 55 and 550, and corrosion is unlikely to progress in the terminal areas 55 and 550.

In either case, however, before sputtering the transparent electrodes 33 and 506 covering the interlayer insulating films 29 and 505, it is necessary to remove the interlayer insulating films 29 and 505, the protective films 28 and 504, and the gate insulating films 24 and 503 from the terminal areas 55 and 550 as described above. Since this is done by going through the step of dry-etching the gate insulating films 24 and 503 and the protective films 28 and 504 with use of the patterned interlayer insulating films 29 and 505 as masks, the surfaces of the interlayer insulating films 29 and 505 are damaged before the transparent electrodes 33 and 506 are sputtered.

In the result, the interlayer insulating films 29 and 505 become great in surface roughness (e.g., have levels of unevenness of 20 nm to 50 nm), so that those parts of the transparent electrodes 33 and 506 which make contact with the interlayer insulating films 29 and 505 are not densely formed. This may cause defects 33a and 506a in those parts of the transparent electrodes 33 and 506 as shown in FIGS. 5 and 20.

Figure 20:
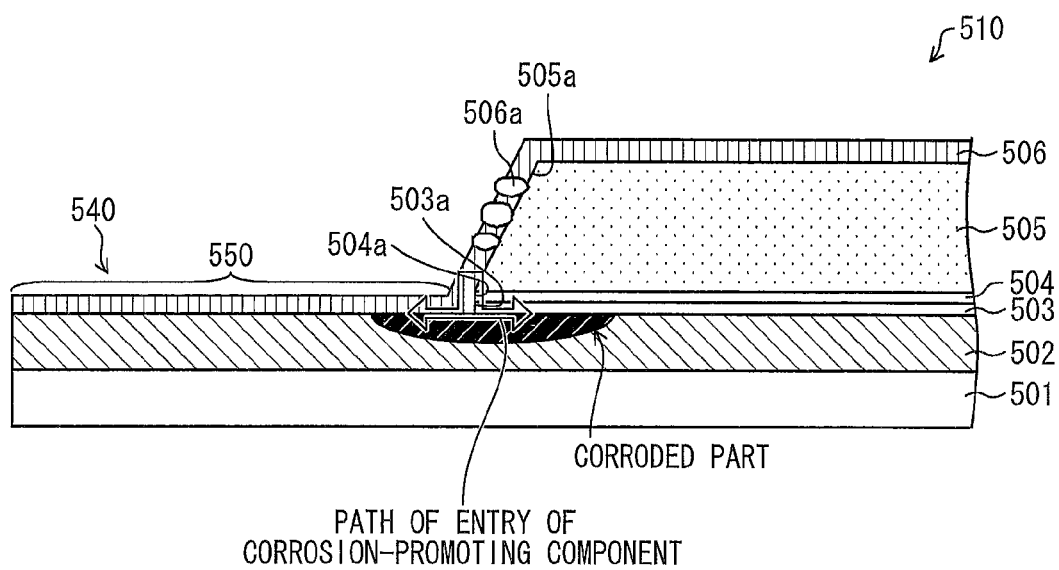
FIG. 20 is a cross-sectional view of a terminal electrode and an area therearound, the cross-sectional view showing a path of entry of a corrosion-accelerating component into the comparative active-matrix substrate of FIG. 19.

In the active-matrix substrate of FIGS. 19 and 20, dry etching of the gate insulating film 503 and the protective film 504 with use of the patterned interlayer insulating film 505 as a mask allows an end face 505a of the interlayer insulating film 505, an end face 503a of the gate insulating film 503 that is in contact with the scanning wire 502, and an end face 504a of the protective film 504 that lies between the interlayer insulating film 505 and the gate insulating film 503 to be joined together one after another.

For this reason, the presence of a defect 506a in the transparent electrode 560 (or, in particular, in a part that is in contact with the end face 505a of the interlayer insulating film 505) allows the intrusion of a corrosion-accelerating component such as moisture from the defect 506a through the end face 505a of the interlayer insulating film 505, the end face 504a of the protective film 504, and the end face 503a of the gate insulating film 503, and may further allow the intrusion of the corrosion-accelerating component into the scanning wire 502 that is in contact with the end face 503a, as shown in FIG. 20.

For this reason, the use of a low-resistance wiring material such as Cu for the scanning wires 502 in the active-matrix substrate 510 of FIGS. 19 and 20 sometimes causes corrosion in a scanning wire 502 that is close to such a defect 506a.

Figure 18:
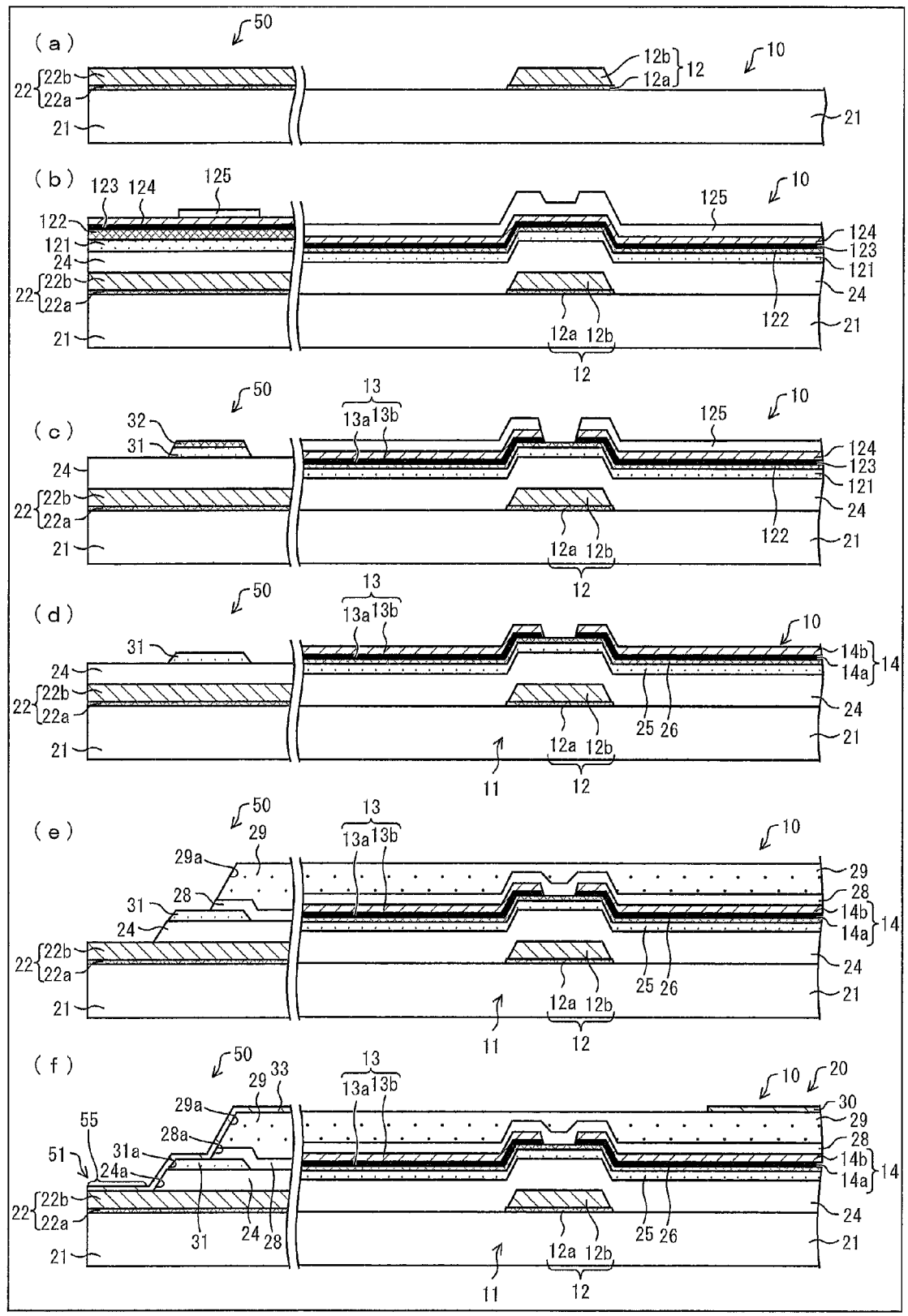
FIG. 18 is a set of cross-sectional views (a) through (f) of an active-matrix substrate according to Embodiment 9 of the present invention, the cross-sectional views (a) through (f) showing successive steps of a process by which the active-matrix substrate is manufactured.

In the result, the active-matrix substrate 510 of FIGS. 18 and 19 has a low probability of suffering from corrosion in the part where a scanning wire 502 and the transparent electrode 506 are in direct close contact with each other and in the part covered with the gate insulating film 503 and the protective film 504; however, once there occurs corrosion in a scanning wire 502 that is close to a defect 506a, the corrosion progresses along the interface between the scanning wire 502 and the transparent electrode 506 and the interface of the scanning wire 502 and the gate insulating film 503.

On the other hand, according to the present embodiment, as mentioned above, the first semiconductor layer 31 is provided between the gate insulating film 24 and the interlayer insulating film 29 (or, specifically, adjacent to the gate insulating film 24) so that the interlayer insulating film 29 has its end face 29a formed in such a way as to overlap the first semiconductor layer 31. For this reason, the first semiconductor layer 31 functions as a mask for dry etching of the gate insulating film 24.

In the result, as mentioned above, in the region where the first semiconductor layer 31 exits, part of the first semiconductor layer 31 and part of the gate insulating film 24 extend from the end face 29a of the interlayer insulating film 29 toward the terminal area 55, whereby the end face 29a of the interlayer insulating film 29 is provided further away from the terminal area 55 than is the end face 24a of the gate insulating film 24.

The layers are in close contact with each other in areas other than the surface of contact between the interlayer insulating film 29 and the transparent electrode 33 as described above, and the inorganic films have denser structures than the organic film. Further, by laminating the first semiconductor layer 31 as described above, the physical distance from a defect 33a is increased. For this reason, there occurs no intrusion of a corrosion-accelerating component through a part other than the end face 24a.

For this reason, as shown in FIG. 5, even if there occurs a defect 33a in that part of the transparent electrode 33 which covers the interlayer insulating film 29, the distance between the defect 33a and an area therebelow where the gate insulating film 24 and the scanning wire 22 are in contact with each other (or, in particular, the end face 24a of the interlayer insulating film 24 that is in contact with the scanning wire 22) is kept large. Further, the first semiconductor layer 31 reduces the surface roughness of the gate insulating film 24 after dry etching to a comparatively small degree. For this reason, that part of the transparent electrode 33 which covers the end face 24a of the gate insulating film 24 becomes dense, so that the intrusion and runabout entry of a corrosion-accelerating component are prevented.

For this reason, according to the present embodiment, even if the interlayer insulating film 29 has a rough surface and a defect 33a occurs in the transparent electrode 33 on the interlayer insulating film 29, corrosion and breakage of the scanning wire 22 and the scanning electrode 12 due to the surface state of the interlayer insulating film 29 can be prevented.

Further, according to the present embodiment, as mentioned above, the transparent electrode 33 covers the interlayer insulating film 29 as well as an area extending from the terminal area 55 to the upper surface of the first semiconductor layer 31. For this reason, even if a defect in pattern alignment of the transparent electrode 33 causes a displacement of that edge of the transparent electrode 33 which faces the sealing agent 91, that edge of the transparent electrode 33 which faces the sealing agent 91 will not have a (boundary) shift (displacement) to come closer to the terminal area 55 than the first semiconductor layer 31. For this reason, the surface of the scanning wire 22 (or, in particular, that surface of the scanning wire 22 which is close to the end face 29a of the interlayer insulating film 29) will not be exposed.

Further, by thus providing the first semiconductor layer 31 to space the end face 29a of the interlayer insulating film 29 and the end face 24a of the gate insulating film 24 from each other, the gate insulating film 24 and the first semiconductor layer 31 are allowed to render gradual the steps that are straddled by the transparent electrode 33 extending from the surface of the interlayer insulating film 29 to the terminal area 55 as described above. This also allows an improvement in coverage of the transparent electrode 33.

Next, a method for manufacturing such an active-matrix 20 is described below with reference to (a) through (e) of FIG. 6. An active-matrix substrate 20 in the present embodiment is manufactured through five photolithographic steps.

[Scanning Wire Forming Step]

(a) of FIG. 6 shows a state in which a two-layered scanning signal wire 22 composed of a lower scanning wire 22a and an upper scanning wire 22b has been formed as a metal wire on a glass substrate 21 and the scanning wire 22 is provided with a two-layered scanning electrode 12 composed of a lower scanning electrode 12a and an upper scanning electrode 12b. It should be noted that this example of manufacturing is described by taking, as an example, a case where the lower scanning electrode 12a and the lower scanning wire 22a are made of Ti and the upper scanning electrode 12b and the upper scanning wire 22b are made of Cu. That is, this example of manufacturing is described by taking, as an example, a case where a first metal wire (gate metal layer) including the scanning wire 22 has a Ti/Cu laminated structure (two-layer structure) serving as an upper metal wire/a lower metal wire.

First, two types of conductive film made of Ti and Cu, respectively, are successively formed in the order named by sputtering over the glass substrate 21.

Next, on the conductive film, a resist pattern is formed by photolithography. After that, the conductive film is patterned by wet etching, and then the resist pattern is washed away, whereby a scanning electrode 12 having a Cu/Ti two-layer structure with its upper scanning electrode 12b provided on its lower scanning electrode 12a is formed in each pixel 10. Further, at the same time, a scanning wire 22 having a Cu/Ti two-layer structure with its upper scanning wire 22b provided on its lower scanning wire 22a is formed on the glass substrate 21 to serve as a display electrode in the display region 41 and as a drawn wire and a terminal electrode in the scanning wire connection area 50.

At this point in time, connection wires 62 and, as needed, auxiliary capacitor wires 23 can be formed as shown in FIGS. 2 and 4 by pattering the conductive film. It should be noted that a change in connection between a signal wire 27 and a connection wire 62 will be explained in the embodiments to be described later, and as such, is omitted from the present embodiment.

In this step, it is preferable that the Ti film thus formed have a thickness of 20 to 150 nm and that the Cu film thus formed have a thickness of 200 to 500 nm; however, this does not imply any particular limitation.

[Gate Insulating Film/Semiconductor Layer Forming Step]

In this step, first, as shown in (b) of FIG. 6, a gate insulating film 24 (inorganic insulating film) made of silicon nitride (SiN$_x$) is formed by CVD in such a way as to cover the scanning electrode 12 and the scanning wire 22. Next, an amorphous silicon layer and an n$^+$ amorphous silicon layer highly doped with an n-type impurity are formed as semiconductor layers over the gate insulating film 24, and then a resist pattern is formed by photolithography. After that, the semiconductor layers are patterned by dry etching, and then the resist pattern is washed away.

Thus, as shown in (b) of FIG. 6, a channel layer 25 constituted by the amorphous silicon layer and an electrode contact 26 constituted by the n$^+$ amorphous silicon layer laminated on the channel layer 25 are formed over the gate insulating film 24 in each pixel 10. Further, a first semiconductor layer 31 constituted by the amorphous silicon layer is formed on the gate insulating film 24 in the scanning wire connection area 50, and a second semiconductor layer 32 constituted by the n$^+$ amorphous silicon layer is formed on the first semiconductor layer 31.

Although not illustrated, the step allows semiconductor layers similar to the first and second semiconductor layers 31 and 32 to be formed over the gate insulating film 24 in the signal wire connection area 60, too. That is, in the signal wire connection area 60, too, first and second semiconductor layers 31 and 32 are formed of the same material at the same time in the same layer as the first and second semiconductor layers 31 and 32 in the scanning wire connection area 50, separately from the first and second semiconductor layers 31 and 32 in the scanning wire connection area 50.

In this step, it is preferable that the silicon nitride film thus formed to constitute the gate insulating film 24 have a thickness of 200 to 500 nm; however, this does not imply any particular limitation. Further, it is preferable that the amorphous silicon layer thus formed to constitute the channel layer 25 and the first semiconductor layer 31 have a thickness of 30 to 300 nm, and that the n$^+$ amorphous silicon layer thus formed to constitute the electrode contact layer 26 and the second semiconductor layer have a thickness of 20 to 150 nm.

[Signal Wire Forming Step]

Next, although not illustrated, two-layered signal wires 27 (see FIGS. 2 and 4) each composed of a lower signal wire and an upper signal wire and drain wires 15 (see FIG. 4) are formed on the gate insulating film 24. Further, at this point in time, as shown in (c) of FIG. 6, two-layered signal electrodes 13, each composed of a lower signal electrode 13a and an upper signal electrode 13b, with which the signal wires 27 are provided respectively and two-layered drain electrodes 14 each composed of a lower drain electrode 14a and an upper drain electrode 14b are formed on the gate insulating film 24.

It should be noted that this example of manufacturing is described by taking, as an example, a case where the lower signal wire (not illustrated), the lower signal electrode 13a, and the lower drain electrode 14a are made of Ti and the upper signal wire (not illustrated), the upper signal electrode 13b, and the upper drain electrode 14b are made of Cu. That is, this example of manufacturing is described by taking, as an example, a case where a second metal wire (source metal layer) including the signal electrodes 13 has a Ti/Cu laminated structure (two-layer structure) serving as an upper metal wire/a lower metal wire.

In this step, first, two types of conductive film made of Ti and Cu, respectively, are successively formed in the order named by sputtering over the gate insulating film 24 in such a way as to cover the electrode contact layer 26.

On the conductive film, a resist pattern is formed by photolithography. After that, the conductive film is patterned by wet etching, and then the resist pattern is washed away.

Thus, a signal electrode 13 having a two-layer structure with an upper signal electrode 13b provided on a lower signal electrode 13a is formed in each pixel 10. Further, separately from the signal wire 27, a drain electrode 14 having a Cu/Ti two-layer structure with an upper drain electrode 14b provided on a lower drain electrode 14a and a drain wire 15 (see FIG. 4) extending from the drain electrode 14 are formed. Further, at the same time, a signal wire 27 (see FIGS. 2 and 4) having a Cu/Ti two-layer structure with an upper signal wire provided on a lower signal wore is formed to serve as a display electrode in the display region 41 and as part of a drawn wire (or, specifically, as a drawn wire for a change in layer in the wire connection area 44).

Next, that region of the electrode contact layer 26 which is to serve as a channel part is removed (channel etching) by dry etching, and the second semiconductor layer 32 is entirely removed. At this point in time, that region of the surface of channel layer 25 which is to serve as the channel part is etched so that the channel part has its thickness adjusted. After that, the resist pattern is washed away, whereby each TFT 11 is formed.

In this step, it is preferable that the Ti film thus formed have a thickness of 20 to 150 nm and that the Cu film thus formed have a thickness of 200 to 500 nm; however, this does not imply any particular limitation.

[Protective Film/Interlayer Insulating Film Forming Step]

In this step, first, a silicon nitride ($SiN_x$) film is formed by CVD as a protective film 28 (passivation film, inorganic insulating film) over the gate insulating film 24 in such a way as to cover the signal wires 27, the signal electrodes 13, and the drain electrodes 14.

Next, an interlayer insulating film material made of a photosensitive resin material is formed by spin coating on the silicon nitride film. After that, patterning is carried out by photolithography, and then dry etching is carried out. Thus, the protective film 28 constituted by the nitride silicon film and an interlayer insulating film 29 (organic insulating film, planarizing film) constituted by the interlayer insulating film material are pattern-formed.

At this point in time, in consideration of a displacement of patterning or etching accuracy in dry etching to be described later, it is preferable that the interlayer insulating film 29 be patterned so that its end face 29 overlaps an upper surface of the first semiconductor layer 31.

Although not illustrated, by carrying out dry etching with use of the interlayer insulating film 29 as a mask, unmasked parts of the protective film 28 in each pixel 10 are removed, so that the signal electrode 13 and the drain electrode 14 are exposed.

Meanwhile, in the scanning wire connection area 50, as shown in (d) of FIG. 6, by carrying out dry etching with use of the interlayer insulating film 29 as a mask, unmasked parts of the gate insulating film 24 and the protective film 28 over the scanning wire 22 serving as a drawn wire are removed, whereby the terminal area 55 (scanning terminal 51 (see (a) of FIG. 1) and an area therearound) of the scanning wire 22 is exposed.

In the scanning wire connection area 50 at this point in time, as shown in (d) of FIG. 6, the first semiconductor layer 31 is disposed in a position of intersection between an extension of the end face 29a of the interlayer insulating film 29 and the scanning wire 22. This allows the first semiconductor layer 31 to serve as a mask during dry etching.

In the result, as shown in (d) of FIG. 6 and (a) and (b) of FIG. 1, in the region where the first semiconductor layer 31 exists, the first semiconductor layer 31 and the gate insulating film 24 are structured such that part of the first semiconductor layer 31 and part of the gate insulating film 24 extend (i.e., come out) further than the end face 29a of the interlayer insulating film 29.

Further, although not illustrated, in the signal wire connection area 60, as in the scanning wire connection area 50, by carrying out dry etching with use of the interlayer insulating film 29 as a mask, unmasked parts of the gate insulating film 24 and the protective film 28 over the connection wire 62 serving as a drawn wire for the signal wire 27 are removed, whereby the terminal area (signal terminal 61 and an area therearound) of the connection wire 62 is exposed.

In the signal wire connection area 60 at this point in time, too, a semiconductor layer (first semiconductor layer 31) similar to the semiconductor layer 31 in the scanning wire connection area 50 is disposed in a position of intersection between an extension of the end face 29a of the interlayer insulating film 29 and the scanning wire 22. This allows the semiconductor layer (first semiconductor layer 31) to serve as a mask during dry etching. In the result, in the signal wire connection area 60, too, the first semiconductor layer 31 and the gate insulating film 24 are structured such that part of the first semiconductor layer 31 and part of the gate insulating film 24 extend (i.e., come out) further than the end face 29a of the interlayer insulating film 29.

In this step, it is preferable that the silicon nitride film thus formed have a thickness of 100 to 700 nm; however, this does not imply any particular limitation. The interlayer insulating film 29 is not to be particularly limited, as long as it is formed to have such a thickness that unevenness due to the metal wires and TFTs 11 of the active-matrix substrate 20 can be compensated for. The interlayer insulating film is formed, for example, to have a thickness of 0.5 μm to 10 μm.

[Transparent Conductive Film Forming Step]

In this step, a transparent conductive film made of ITO is formed entirely over an upper surface of the glass substrate 21 over which the interlayer insulating film 29 has been formed. Next, on the transparent conductive film, a resist pattern is formed by photolithography. After that, the transparent conductive film is patterned by wet etching, and then the resist pattern is washed away. Thus, a pixel electrode 30 constituted by the transparent conductive film is formed in each pixel 10.

Further, in the scanning wire connection area 50, as shown in (e) of FIG. 6, the pixel electrode 30 constituted by the transparent conductive film is formed in such a way as to cover an upper surface of the interlayer insulating film 29, the end face 29a of the interlayer insulating film 29, the end face 28a of the protective film 28, an upper surface of the first semiconductor layer 31, the end face 31a of the first semiconductor layer 31, the end face of 24a of the gate insulating film 24, and an upper surface of the exposed part of the scanning wire 22.

Since the transparent electrode 33 is formed on the exposed part of the scanning wire 22 as described above, a scanning terminal 51 (terminal electrode) is formed at an end of the scanning wire 22.

Although not illustrated, the above step causes a transparent electrode similar to the transparent electrode 33 to be formed in the signal wire connection area 60, too. That is, in the signal wire connection area 60, too, a transparent electrode is formed of the same material at the same time in the same layer as the transparent electrode in the scanning wire connection area 50, separately from the transparent electrode in the scanning wire connection area 50.

In the signal wire connection area 60, as in the scanning wire connection area 50, the pixel electrode 30 constituted by the transparent conductive film is formed in such a way as to cover the upper surface of the interlayer insulating film 29, the end face 29a of the interlayer insulating film 29, the end face 28a of the protective film 28, the upper surface of the first semiconductor layer 31, the end face 31a of the first semiconductor layer 31, the end face of 24a of the gate insulating film 24, and an upper surface of the exposed part of the connection wire 62.

Since the transparent electrode 33 is formed on the exposed part of the connection wire 62 as described above, a signal terminal (see FIG. 4: terminal electrode) is formed at an end of the connection wire 62.

In this step, it is preferable that the transparent conductive film thus formed have a thickness of 50 to 200 nm; however, this does not imply any particular limitation.

[Alignment Film Forming Step]

Finally, an alignment film (not illustrated) is formed, as needed, on a surface of the active-matrix substrate 20 (which faces the counter substrate 80). The alignment film can be formed, for example, by forming a polyimide film by a print process.

The above step causes the scanning wire connection area 50, the signal wire connection area 60, and the wire connection section 70 to be formed in their respective predetermined positions on the active-matrix substrate 20 at the same time as the TFTs 11 are formed. It should be noted that each of the connection areas is fabricated through the aforementioned steps of manufacturing an active-matrix substrate 20, with variations in patterns to be formed in the respective steps.

Next, a configuration of the counter substrate 80 and a method for manufacturing such a counter substrate 80 are described below with reference to (a) through (c) of FIG. 7.

Figure 7:
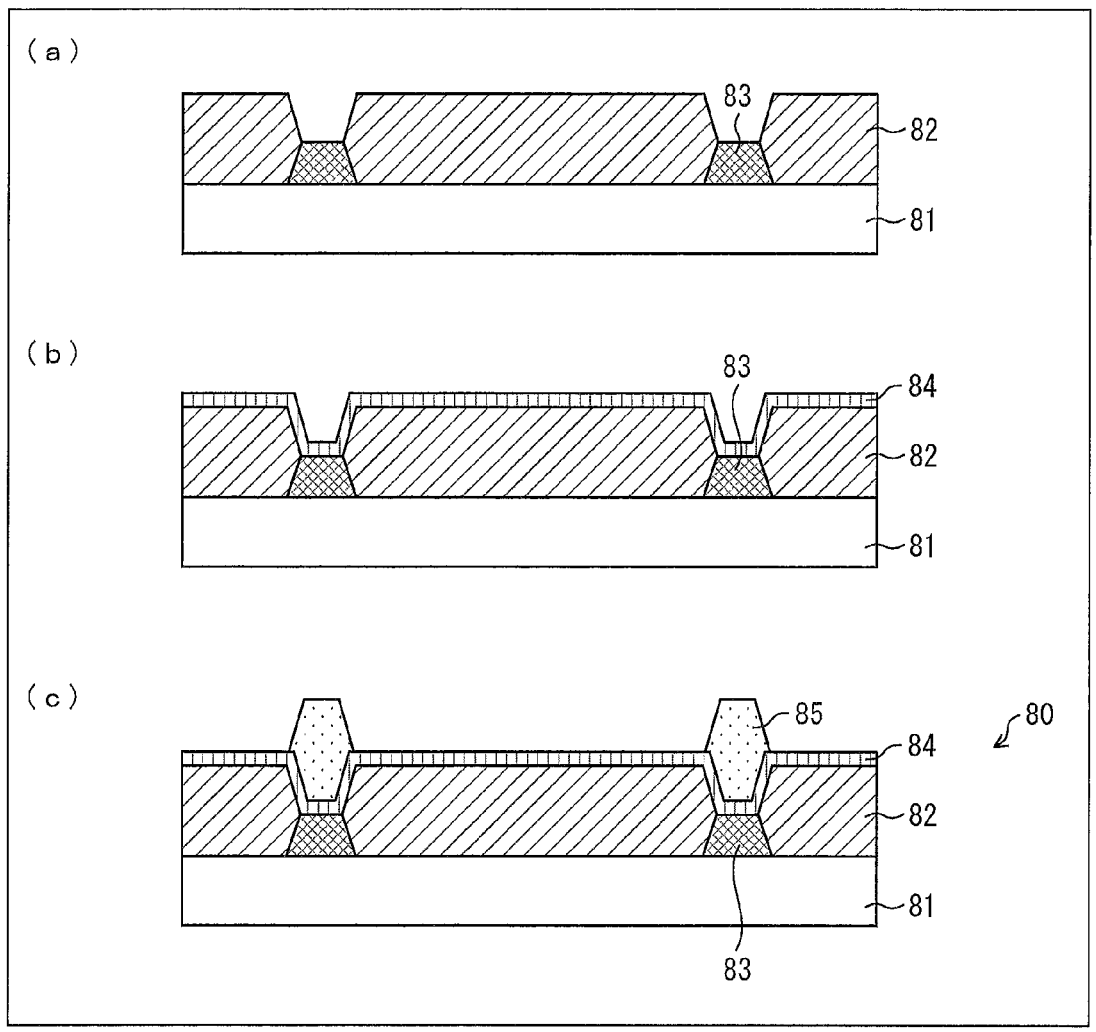
FIG. 7 is a set of cross-sectional views (a) through (c) showing successive steps of a process by which a counter substrate is manufactured.

FIG. 7 is a set of cross-sectional views (a) through (c) showing successive steps of a process by which such a counter substrate 80 is manufactured. (a) through (c) of FIG. 7 each shows a cross-section of the counter substrate 80 at a point in time where each respective step has ended.

As shown in (c) of FIG. 7, the counter substrate 80 is configured to include: a glass substrate 81; a color filter layer 82 laminated on the glass substrate 81; a black matrix 83 laminated on the glass substrate 81; a counter electrode 84 laminated on the a color filter layer 82 and the black matrix 83; and photo spacers 85 laminated on the counter electrode 84.

As will be shown below, the counter substrate 80 is manufactured through three photolithographic steps.

[Black Matrix/Color Filter Layer Forming Step]

In this step, as shown in (a) of FIG. 7, a black matrix 83 and a color filter layer 82 are formed of a photosensitive material by photolithography on a glass substrate 81. An example of the color filter layer thus formed is an R (red), G (green), and B (blue) color filter layer.

[Counter Electrode Forming Step]

Next, as shown in (b) of FIG. 7, a transparent conductive film made of ITO is formed by sputtering on the glass substrate 81 in such a way as to cover the black matrix 83 and the color filter layer 82. Then, on the transparent conductive film, a resist pattern is formed by photolithography. After that, the transparent conductive film is patterned by wet etching, and then the resist pattern is washed away, whereby a counter electrode 84 is formed.

In this step, it is preferable that the transparent conductive film thus formed have a thickness of 50 to 200 nm; however, this does not imply any particular limitation.

[Photo Spacer Forming Step]

Next, as shown in (c) of FIG. 7, photo spacers 85 are formed of a photosensitive material by photolithography on the counter electrode 84 in such a way as to cover the black matrix layer 83.

[Alignment Film Forming Step]

Finally, an alignment film (not illustrated) is formed, as needed, on a surface of the counter substrate 80 (which faces the active-matrix substrate 20). The alignment film can be formed, for example, by forming a polyimide film by a print process. The counter substrate 80 is manufactured through the steps described above.

It should be noted, however, that the thickness of each layer described above, the material for each layer described above, and the method for forming each layer described above are not to be limited to the aforementioned specific examples, but may appropriately be set or changed.

Next, a method for manufacturing a liquid crystal panel 2 according to the present embodiment is described.

The liquid crystal panel 2 can be manufactured by carrying out the following steps after the steps of manufacturing an active-matrix substrate 20 and the steps of manufacturing a counter substrate 80.

[Joining Step]

In this step, first, a sealing agent 91 printed on either an active-matrix substrate 20 or a counter substrate 80 in such a way as to extend along the shape of the edge of the counter substrate 80. Next, liquid crystals are dropped onto a region surrounded by the sealing agent 91. After that, the active-matrix substrate 20 and the counter substrate 80 joined to each other via the sealing agent.

[Substrate Cutting Step]

Next, the substrates joined to each other in the joining step are cut (diced) as needed. Through these steps, the liquid crystal panel 2 is formed.

After that, by connecting an external device such as a TCP provided with drive circuits such as the scanning wire drive circuit 4, the signal wire drive circuit 5, etc. via the ACF 93 to the terminal areas provided in the external device connection areas (such as the scanning wire connection area 50, the signal wire connection area 60, etc.) included in the connection areas 44 provided on the active-matrix substrate of the liquid crystal panel 2, a liquid crystal display device 1 according to the present embodiment can be manufactured.

This makes it possible to obtain an active-matrix substrate capable of preventing corrosion and breakage of metal wires and superior in corrosion resistance and a liquid crystal display device 1 including such an active-matrix substrate 20.

An active-matrix substrate 20 according to the present embodiment can be applied not only to the liquid crystal panel 2 and the liquid crystal display device 1 that have been described above, but also to a display panel and a display device that use organic EL or inorganic EL as display media.

Further, the display device can be suitably applied to a display device, etc. in an electrophoretic device, as well as a laptop personal computer, a cellular phone, an electronic organizer, a TV (television) receiver.

As described above, the present embodiment has been described by taking, as an example, a case where the same semiconductor layer as that in the TFTs 11 is used as a mask layer. However, the present embodiment is not to be limited to such an example.

Such a mask layer needs only be a layer that has etching resistance (dry etching resistance) and functions as a mask for patterning of the gate insulating film 24, and may be formed separately from the semiconductor layer in the TFTs 11.

However, by using, as such a mask layer, the same semiconductor layer as that in the TFTs 11 as described above, the mask layer can be easily and inexpensively formed simply by changing the shape of the masks for patterning semiconductor layers, without changing the steps.

Further, the present embodiment has been described by taking, as an example, a case where when that region of the electrode contact layer 26 which is to serve as a channel part is removed (channel etching) by dry etching, the second semiconductor layer 32 is removed. However, the present embodiment is not to be limited to such an example. For example, it is also possible to leave the second semiconductor layer by using a dedicated mask.

Embodiment 2

Another embodiment of the present invention is described below with reference to FIG. 8. It should be noted that in the present embodiment, points of difference between the present embodiment and Embodiment 1 are mainly described, and that those components having the same functions as those of Embodiment 1 are given the same reference numerals, and as such, are not described below.

As with Embodiment 1, the present embodiment is described by taking the scanning wire connection area 50 as an example of the connection area 44. However, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively. Further, in the auxiliary capacitor wire connection area, too, a similar reading is possible, with changes made only in the names of the metal layers (wires).

Figure 8:
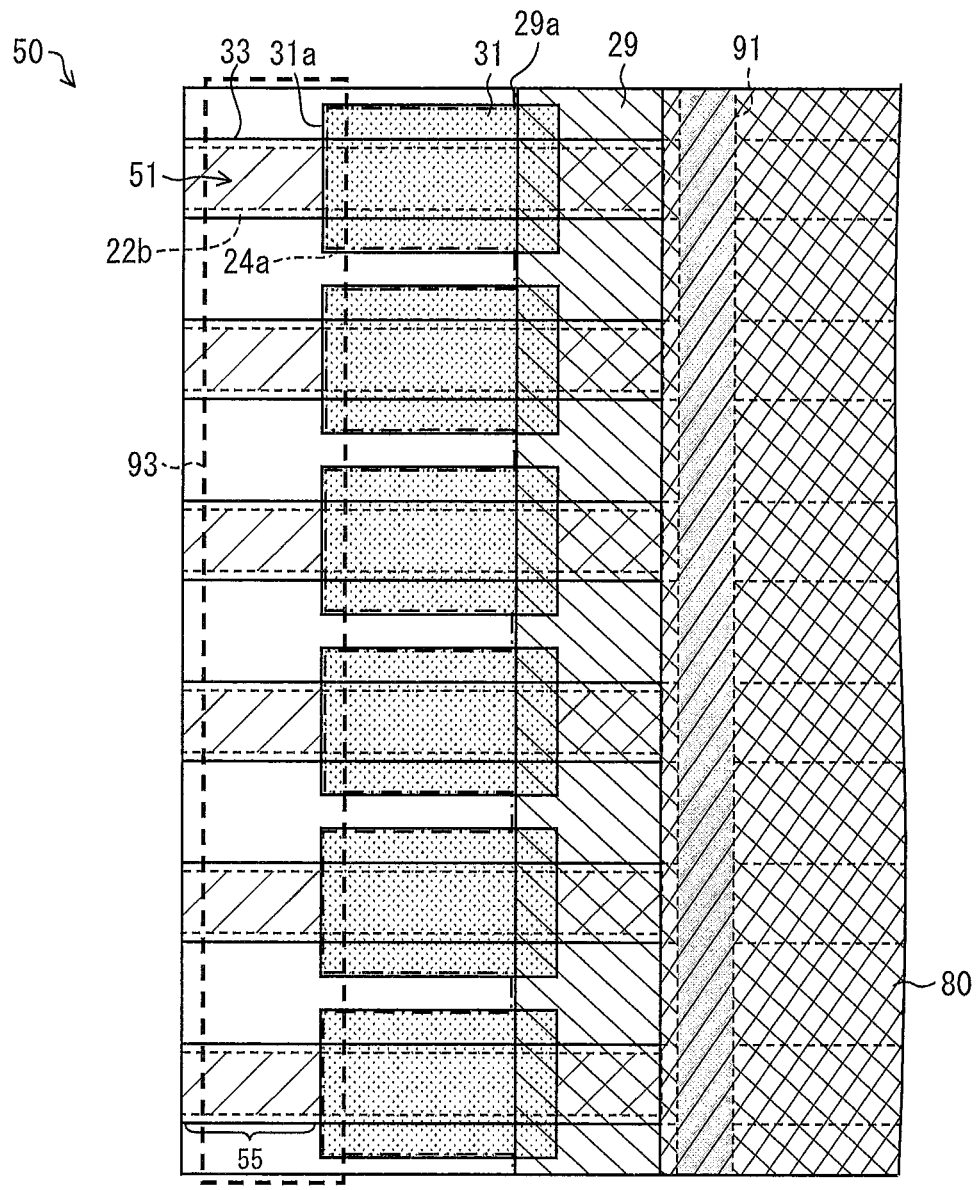
FIG. 8 is a plan view schematically showing a configuration of a scanning wire connection area on an active-matrix substrate according to Embodiment 2 of the present invention.

FIG. 8 is a plan view schematically showing a configuration of a scanning wire connection area 50 on an active-matrix substrate 20 according to the present embodiment.

The active-matrix substrate 20 according to the present embodiment has the same configuration as the active-matrix substrate 20 according to Embodiment 1 except for the following: In the active-matrix substrate 20 according to the present embodiment, as shown in FIG. 8, the first semiconductor layer 31 extends into an area below the ACF 93 (position to which the ACF 93 is attached), whereby the end face 31a of the first semiconductor layer 31 and the end face 24a of the gate insulating film 24 in the region where the first semiconductor layer 31 exists are located below the ACF 93.

This allows the active-matrix substrate 20 according to the present embodiment to prevent corrosion and breakage of the scanning wires 22 and the scanning electrodes 12 for the same principle (reason) as that explained above with reference to FIG. 5 in Embodiment 1.

Further, according to the present embodiment, as shown in FIG. 8, each first semiconductor layer 31 is expanded in a direction parallel to the scanning wire 22 in such a way as to extend into an area below the ACF 93, whereby the place of contact between the scanning wire 22 and the transparent electrode 33 and, further, that part of the transparent electrode 33 which covers the area of contact between the end face 24a of the gate insulating film 24 and the scanning wire 22 fall entirely within an area inside of the sealing agent 91 or an area below the ACF, and as such, will not be exposed to the air. This further improves reliability.

In the present embodiment, it is of course OK to leave the interlayer insulating film 29 as wide as possible with the end face 29a of the interlayer film 29 and the end face 24a of the gate insulating film 24 kept spaced from each other. The interlayer insulating film 29 may extend into a position close to the position to which the ACF 93 is attached, as long as the interlayer insulating film 29 does not interfere with the position to which the ACF 93 is attached and is placed at a sufficient distance from the end face 31a of the first semiconductor layer 31.

It should be noted that although the present embodiment described above is configured such that the first semiconductor layer 31 is extended (expanded) to the position to which the ACF 93 is attached, the present embodiment is not limited to such a configuration.

Embodiment 3

Another embodiment of the present invention is described below with reference to (a) and (b) of FIG. 9. It should be noted that in the present embodiment, points of difference between the present embodiment and Embodiment 1 are mainly described, and that those components having the same functions as those of Embodiment 1 are given the same reference numerals, and as such, are not described below.

As with Embodiments 1 and 2, the present embodiment is described by taking the scanning wire connection area 50 as an example of the connection area 44. However, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively. Further, in the auxiliary capacitor wire connection area, too, a similar reading is possible, with changes made only in the names of the metal layers (wires).

Figure 9:
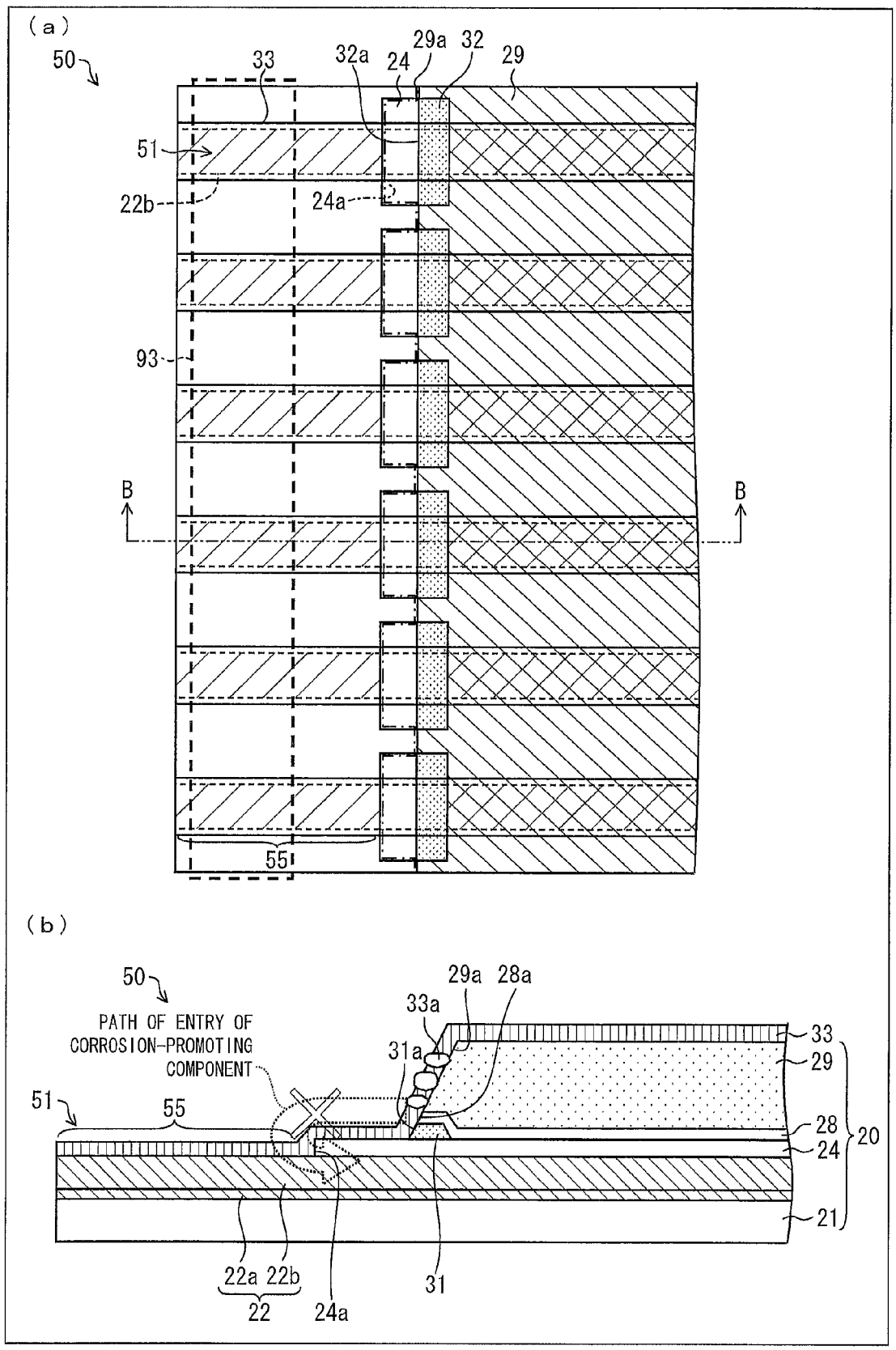
FIG. 9 shows (a) a cross-sectional view showing another example of a configuration of a scanning wire connection area on an active-matrix substrate according Embodiment 3 of the present invention and (b) a cross-sectional view of the active-matrix substrate taken along the arrow B-B in (a) of FIG. 9.

FIG. 9 shows (a) a cross-sectional view showing another example of a configuration of a scanning wire connection area 50 on an active-matrix substrate 20 according the present embodiment and (b) a cross-sectional view of the active-matrix substrate 20 taken along the arrow B-B in (a) of FIG. 9.

Embodiments 1 and 2 have been described by taking, as examples, cases where after dry etching of the gate insulating film 24, the gate insulating film 24 and the first semiconductor layer 31 (or, specifically, part of the gate insulating film 24 and part of the semiconductor layer 31) are left in such a way as to extend from the end face 29a of the interlayer insulating film 29 toward the terminal area 55.

On the other hand, in the active-matrix substrate 20 according the present embodiment, as shown in (b) of FIG. 9, the first semiconductor layer 31 has an end face 31a that meets the end face 29a of the interlayer insulating film 29 and the end face 28a of the protective film 28, and as shown in (a) and (b) of FIG. 9, only the gate insulating film 24 is left in such a way as to extend from the end face 29a of the interlayer insulating film 29 toward the terminal area 55.

For this reason, in the present embodiment, unlike in Embodiments 1 and 2, only the gate insulating film 24, which extends from the end face 29a of the interlayer insulating film 29 toward the terminal area 55, functions as a separating wall (separating layer) that separates the scanning wire 22 (or the terminal area 55 in particular) from the end face 29a of the interlayer insulating film 29 and from that part of the transparent electrode 33 which is on the end face 29a.

However, in the present embodiment, too, the side facing the terminal area 55, i.e., the end face 24a of the gate insulating film 24 that faces the terminal area 55 is located closer to the terminal area 55 than is the end face 29a of the interlayer insulating film 29 that faces the terminal area 55. In other words, the end face 29a of the interlayer insulating film 29 that faces the terminal area 55 is provided further away from the terminal area 55 than is the end face 24a of the gate insulating film 24 that faces the terminal area 55.

For this reason, in the present embodiment, too, as shown in (b) of FIG. 9, even if there occurs a defect 33a in that part of the transparent electrode 33 which covers the interlayer insulating film 29, the distance between the defect 33a and an area therebelow where the gate insulating film 24 and the scanning wire 22 are in contact with each other (or, in particular, the end face 24a of the interlayer insulating film 24 that is in contact with the scanning wire 22) is kept large. Further, in the present embodiment, too, use of the first semiconductor layer 31 as a mask layer during dry etching of the gate insulating film 24 reduces the surface roughness of the gate insulating film 24 after dry etching to a comparatively small degree. For this reason, that part of the transparent electrode 33 which covers the end face 24a of the gate insulating film 24 becomes dense, so that the intrusion and runabout entry of a corrosion-accelerating component are prevented.

For this reason, even if the interlayer insulating film 29 has a rough surface and a defect 33a occurs in the transparent electrode 33 on the interlayer insulating film 29 as shown in (b) of FIG. 9, corrosion and breakage of the scanning wire 22 and the scanning electrode 12 due to the surface state of the interlayer insulating film 29 can be prevented.

In the present embodiment, the transparent electrode 33 extends to the terminal area 55 in such a way as to cover an upper surface of the interlayer insulating film 29, the end face 29a of the interlayer insulating film 29, the end face 28a of the protective film 28, the end face 31a of the first semiconductor layer 31, an upper surface of the gate insulating film 24, and the end face 24a of the gate insulating film 24. That part of the transparent electrode 33 which covers the scanning wire 22 in the terminal area 55 is used as a scanning terminal 51.

It should be noted that although the present embodiment has been described by taking, as an example, a case where the first semiconductor layer 31 is used as a mask layer as described above, both the first and second semiconductor layers 31 and 32 may be used as such a mask layer by leaving the second semiconductor layer, for example, with use of a dedicated mask.

Thus, according to the present embodiment, the transparent electrode 33 covers the interlayer insulating film 29 as well as an area extending from the terminal area 55 to the upper surface of the gate insulating film 24 that extends from the end face 29a of the interlayer insulating film 29. For this reason, even if a defect in pattern alignment of the transparent electrode 33 causes a displacement of that edge of the transparent electrode 33 which faces the sealing agent 91, that edge of the transparent electrode 33 which faces the sealing agent 91 will not have a (boundary) shift (displacement) to come closer to the terminal area 55 than the gate insulating film 24 extending from the end face 29a of the interlayer insulating film 29. For this reason, the surface of the scanning wire 22 (or, in particular, that surface of the scanning wire 22 which is close to the end face 29a of the interlayer insulating film 29) will not be exposed.

Further, in the present embodiment, too, by thus keeping a distance between the end face 29a of the interlayer insulating film 29 and the end face 24a of the gate insulating film 24, the gate insulating film 24 extending from the end face 29a of the interlayer insulating film 29 is allowed to render gradual the steps that are straddled by the transparent electrode 33 extending from the surface of the interlayer insulating film 29 to the terminal area 55. This also allows an improvement in coverage of the transparent electrode 33.

Next, a method for manufacturing an active-matrix substrate 20 according to the present embodiment is described below with reference to (a) through (e) of FIG. 6 and (a) and (b) of FIG. 9.

It should be noted the scanning wire forming step shown in (a) of FIG. 6 through the signal wire forming step shown in (c) of FIG. 6 are the same as those of Embodiment 1, and as such, are not described below.

In the present embodiment, first, in the protective film/interlayer insulating film forming step shown in (d) of FIG. 6, an interlayer insulating film 29 is patterned in the same manner as in Embodiment 1 so that its end face 29a overlaps the first semiconductor layer 31.

Next, the protective film 28 and the gate insulating film 24 are dry-etched by using the interlayer insulating film 29 as a mask. At this point in time, part of the first semiconductor layer 31 is removed by changing etching conditions so that those parts of the protective film 28 and the first semiconductor layer 31 which run off the end face 29a of the interlayer insulating film 29 and that part of the gate insulating film 24 which runs off the edge of the first semiconductor layer 31 before dry etching are etched away.

Thus, as shown in (a) and (b) of FIG. 9, that part of the first semiconductor layer 31 that runs off the end face 29a of the interlayer insulating film 29 is etched away, so that the first semiconductor layer 31 comes to have an end face 31a that meets the end face 29a of the interlayer insulating film 29 and the end face 28a of the protective film 28.

Therefore, by next forming a transparent conductive film entirely over the upper surface of the glass substrate 21 over which the interlayer insulating film 29 has been formed and patterning the transparent conductive film in the same manner as in the transparent conductive film forming step shown in (e) of FIG. 6, an active-matrix substrate 20 according to the present embodiment shown in (a) and (b) of FIG. 9 can be obtained.

Embodiment 4

Another embodiment of the present invention is described below with reference to (a) and (b) of FIG. 10 and (a) through (f) of FIG. 11. It should be noted that in the present embodiment, points of difference between the present embodiment and Embodiment 1 are mainly described, and that those components having the same functions as those of Embodiment 1 are given the same reference numerals, and as such, are not described below.

Figure 10:
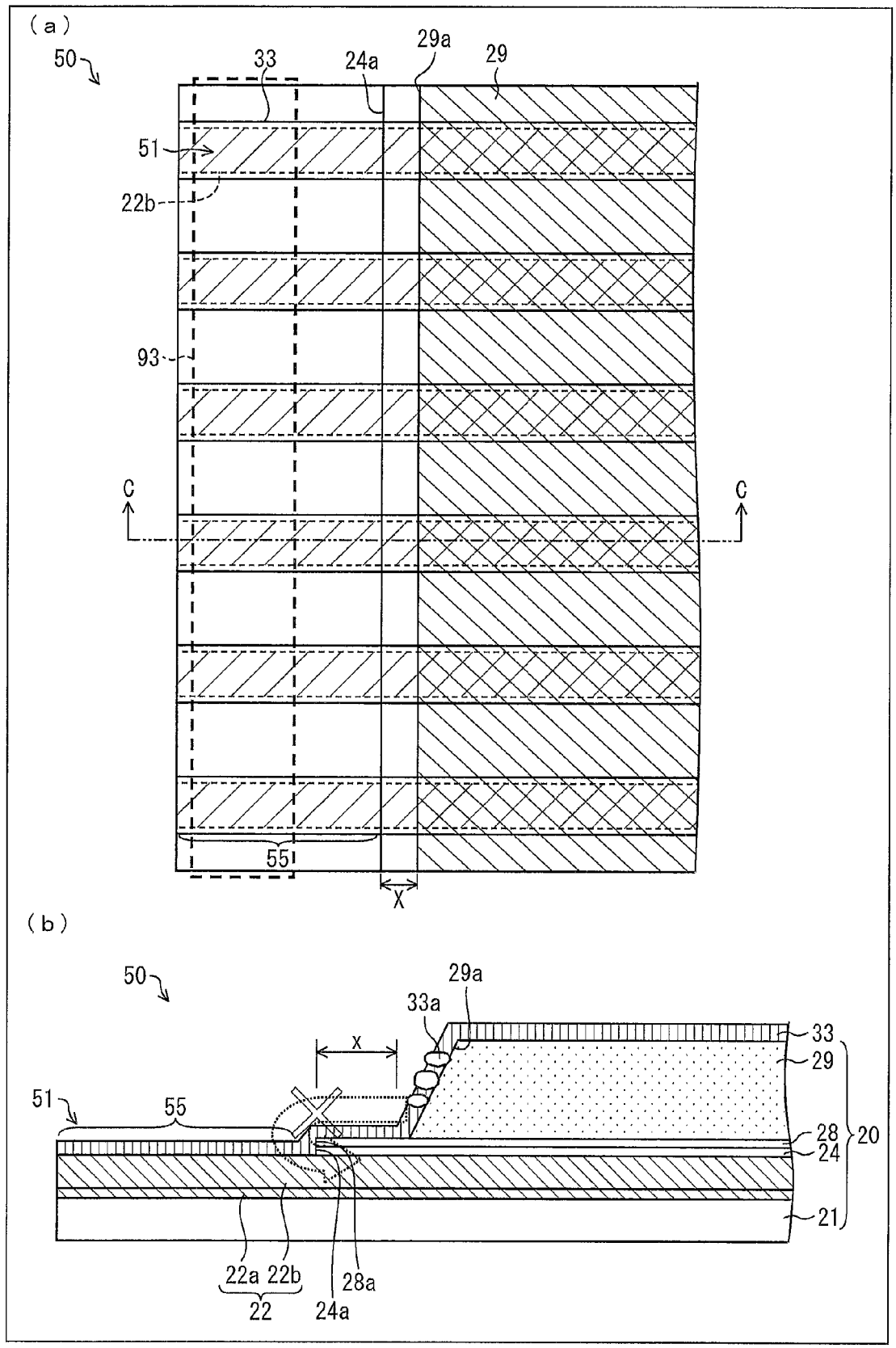
FIG. 10 shows (a) a plan view schematically showing a configuration of a scanning wire connection area on an active-matrix substrate according Embodiment 4 of the present invention and an area therearound and (b) a cross-sectional view of the active-matrix substrate taken along the arrow C-C in (a) of FIG. 10.

FIG. 10 shows (a) a plan view schematically showing a configuration of a scanning wire connection area 50 on an active-matrix substrate 20 according the present embodiment and an area therearound and (b) a cross-sectional view of the active-matrix substrate 20 taken along the arrow C-C in (a) of FIG. 10.

As shown in (a) and (b) of FIG. 10, the active-matrix substrate 20 according to the present embodiment has its scanning wire connection area 50 configured such that a scanning wire 22, a gate insulating film 24, a protective film 28, an interlayer insulating film 29, and a transparent electrode 33 are laminated in the order named over a glass substrate 21. Further provided at an end of the scanning wire 22 by laminating the transparent electrode 33 directly on the scanning wire 22 is a terminal area 55.

In the present embodiment, too, as shown in (b) of FIG. 10, the scanning wire 22 is configured with its upper scanning wire 22b provided on its lower scanning wire 22a. However, as noted above in Embodiment 1, the scanning wire 22 is not to be limited to such a configuration.

The active-matrix substrate 20 according to the present embodiment has the same configuration as an active-matrix substrate 20 shown in (a) and (b) of FIG. 9 in Embodiment 3, except that neither a first semiconductor layer 31 nor a second semiconductor layer 32 is provided over the gate insulating film 24.

That is, in the active-matrix substrate 20 according the present embodiment, only the gate insulating film 24 extends from the end face 29a of the interlayer insulating film 29 toward the terminal area 55. For this reason, in the present embodiment, as in Embodiment 3, only the gate insulating film 24, which extends from the end face 29a of the interlayer insulating film 29 toward the terminal area 55, functions as a separating wall (separating layer) that separates the scanning wire 22 (or the terminal area 55 in particular) from the end face 29a of the interlayer insulating film 29 and from that part of the transparent electrode 33 which is on the end face 29a.

In the present embodiment, the transparent electrode extends to the terminal area 55 in such a way as to cover an upper surface of the interlayer insulating film 29, the end face 29a of the interlayer insulating film 29, the end face 28a of the protective film 28, and the end face 24a of the gate insulating film 24.

Such an active-matrix substrate 20 can be easily formed, for example, by dry-etching the protective film 28 and the gate insulating film 24, then ashing the interlayer insulating film 29 with oxygen ($O_2$ ashing), and thereby etching back the interlayer insulating film 29.

In this way, by carrying out $O_2$ ashing or the like to cause the end face 29a of the interlayer insulating film 29 to get further away from the terminal area 55 than the end face 28a of the protective film 28 and the end face 24a of the gate insulating film 24, the end face 29a of the interlayer insulating film 29 can be easily spaced at a certain distance from the end face 28a of the protective film 28 and the end face 24a of the gate insulating film 24.

Thus, in the present embodiment, too, the end face 29a of the interlayer insulating film 29 that faces the terminal area 55 is provided further away from the terminal area 55 than is the end face 24a of the gate insulating film 24 that faces the terminal area 55. For this reason, in the present embodiment, too, as shown in (b) of FIG. 10, even if there occurs a defect 33a in that part of the transparent electrode 33 which covers the interlayer insulating film 29, the distance between the defect 33a and an area therebelow where the gate insulating film 24 and the scanning wire 22 are in contact with each other (or, in particular, the end face 24a of the interlayer insulating film 24 that is in contact with the scanning wire 22) is kept large. Further, in the present embodiment, too, the surface roughness of the gate insulating film 24 after dry etching is reduced to a comparatively small degree. For this reason, that part of the transparent electrode 33 which covers the end face 24a of the gate insulating film 24 becomes dense, so that the intrusion and runabout entry of a corrosion-accelerating component are prevented.

For this reason, even if the interlayer insulating film 29 has a rough surface and a defect 33a occurs in the transparent electrode 33 on the interlayer insulating film 29 as shown in (b) of FIG. 10, corrosion and breakage of the scanning wire 22 and the scanning electrode 12 due to the surface state of the interlayer insulating film 29 can be prevented.

Here, a method for manufacturing an active-matrix substrate 20 according to the present embodiment is described below with reference to (a) through (f) of FIG. 11.

Figure 11:
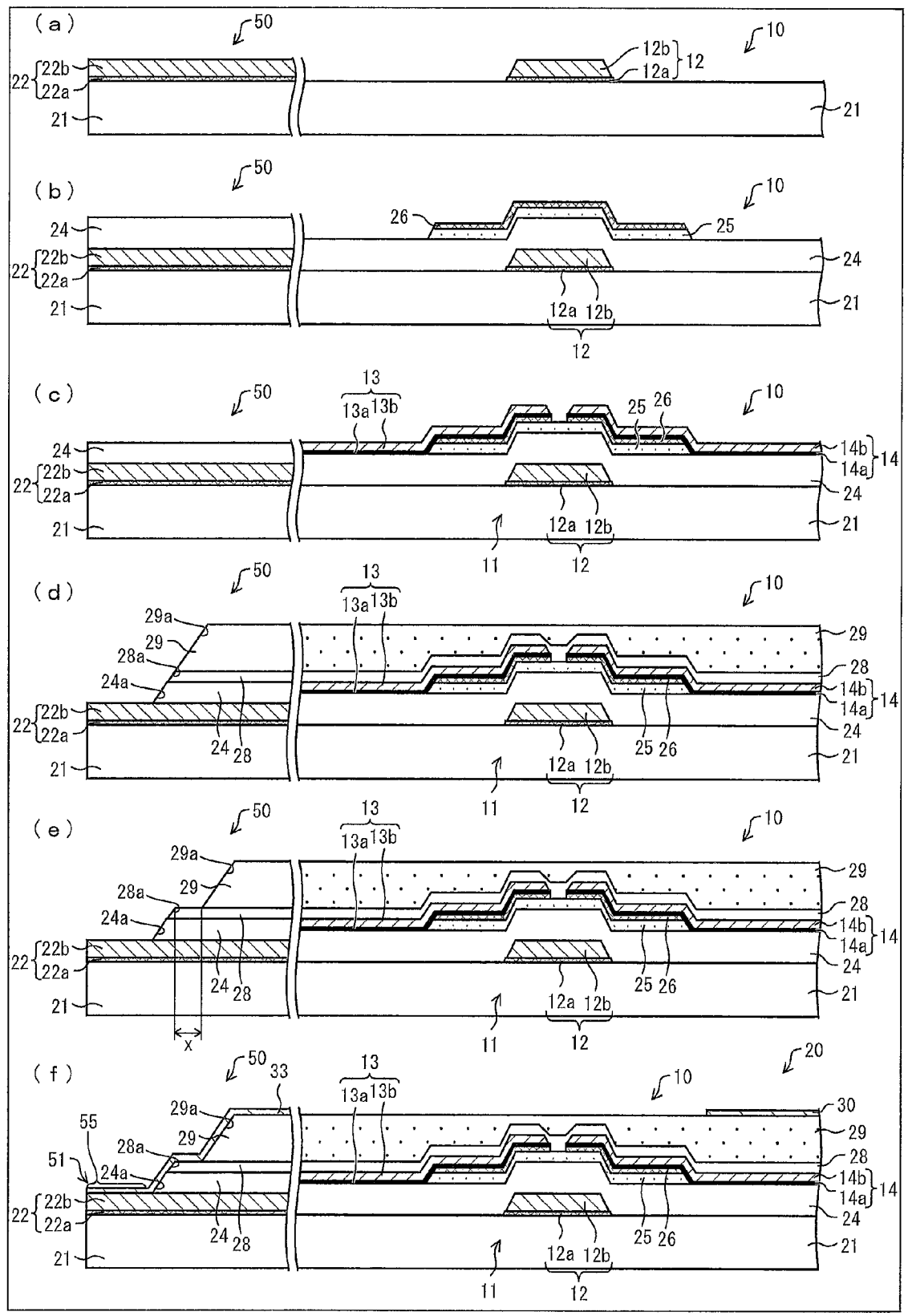
FIG. 11 is a set of cross-sectional views (a) through (f) of an active-matrix substrate according to Embodiment 5 of the present invention, the cross-sectional views (a) through (f) showing successive steps of a process by which the active-matrix substrate is manufactured.

FIG. 11 is a set of cross-sectional views (a) through (f) of the active-matrix substrate 20, the cross-sectional views (a) through (f) showing successive steps of a process by which the active-matrix substrate 20 is manufactured. It should be noted that in each of (a) through (f) of FIG. 11, a cross-section of the scanning wire connection area 50 and a cross-section of an area near a TFT 11 in each pixel 10 are juxtaposed as cross-sections of the non-display and display regions 42 and 41 of the active-matrix substrate 20 at the end of the corresponding step.

In the following example of manufacturing, the conditions such as the thickness of each layer are the same as those in Embodiment 1, unless otherwise specified.

[Scanning Wire Forming Step]

(a) of FIG. 11 shows a state in which a two-layered scanning signal wire 22 composed of a lower scanning wire 22a and an upper scanning wire 22b has been formed as a metal wire on a glass substrate 21 and the scanning wire 22 is provided with a two-layered scanning electrode 12 composed of a lower scanning electrode 12a and an upper scanning electrode 12b.

This step is the same as that shown in (a) of FIG. 6 in Embodiment 1, and as such, the step is not described below.

It should be noted that this example of manufacturing is also described by taking, as an example, a case where a first metal wire (gate metal layer) including the scanning wire 22 has a Ti/Cu laminated structure (two-layer structure) serving as an upper metal wire/a lower metal wire. However, as noted in above in Embodiment 1, the present invention is not to be limited to such an example, and the first metal wiring layer may have a single-layer structure or a laminated structure.

[Gate Insulating Film/Semiconductor Layer Forming Step]

This step is the same as that shown in (b) of FIG. 6 in Embodiment 1, except that neither a first semiconductor layer 31 nor a second semiconductor layer 32 is formed in the connection area 44.

That is, in the gate insulating film/semiconductor layer forming step according to the present embodiment, first, as shown in (b) of FIG. 11, a gate insulating film 24 (inorganic insulating film) made of silicon nitride ($SiN_x$) is formed by CVD in such a way as to cover the scanning electrode 12 and the scanning wire 22. Next, an amorphous silicon layer and an $n^+$ amorphous silicon layer highly doped with an n-type impurity are formed as semiconductor layers over the gate insulating film 24, and then a resist pattern is formed by photolithography. After that, the semiconductor layers are patterned by dry etching, and then the resist pattern is washed away.

Thus, as shown in (b) of FIG. 11, a channel layer 25 constituted by the amorphous silicon layer and an electrode contact 26 constituted by the $n^+$ amorphous silicon layer laminated on the channel layer 25 are formed over the gate insulating film 24 in each pixel 10.

[Signal Wire Forming Step]

This step is the same as that shown in (c) of FIG. 6 in Embodiment 1. That is, the active-matrix substrate 20 at this stage has the same structure as that shown in (c) of FIG. 6, except that, as shown in (c) of FIG. 11, it has no semiconductor layers (neither a first semiconductor layer 31 nor a second semiconductor layer 32) formed in the connection area 44 and the connection area 44 therefore has no unevenness formed due to such semiconductor layers.

Therefore, in the present embodiment, this step is not described. It should be noted that this example of manufacturing is also described by taking, as an example, a case where a second metal wire (source metal layer) including the signal electrodes 13 has a Ti/Cu laminated structure (two-layer structure) serving as an upper metal wire/a lower metal wire. However, as in the case of the first metal wiring layer (gate metal layer), the present invention is not to be limited to such an example.

[Protective Film/Interlayer Insulating Film Forming Step]

In this step, first, a silicon nitride ($SiN_x$) film is formed by CVD as a protective film 28 (passivation film, inorganic insulating film) over the gate insulating film 24 in such a way as to cover the signal wires 27, the signal electrodes 13, and the drain electrodes 14. Thus, a TFT 11 is formed in each pixel 10.

Next, an interlayer insulating film material made of a photosensitive resin material is formed by spin coating on the silicon nitride film. After that, patterning is carried out by photolithography, and then dry etching is carried out. Thus, the protective film 28 constituted by the nitride silicon film and an interlayer insulating film 29 (organic insulating film, planarizing film) constituted by the interlayer insulating film material are pattern-formed.

At this point in time, although not illustrated, by carrying out dry etching with use of the interlayer insulating film 29 as a mask, unmasked parts of the protective film 28 in each pixel 10 are removed, so that the signal electrode 13 and the drain electrode 14 are exposed.

Meanwhile, in the scanning wire connection area 50, as shown in (d) of FIG. 11, by carrying out dry etching with use of the interlayer insulating film 29 as a mask, unmasked parts of the gate insulating film 24 and the protective film 28 over the scanning wire 22 serving as a drawn wire are removed, whereby the terminal area 55 and an area therearound of the scanning wire 22 are exposed.

As described above, this step per se is the same as that shown in (d) of FIG. 6 in Embodiment 1. However, since the present embodiment has no semiconductor layers formed in the connection area 44, it has no semiconductor layer (first semiconductor layer shown in (d) of FIG. 6) formed in the scanning wire connection area 50, as shown in (d) of FIG. 11.

For this reason, as shown in (d) of FIG. 11, the protective film 28 and the gate insulating film 24 are dry-etched so that their respective end faces 28a and 24a meet the end face 29a of the interlayer insulating film 29.

[Ashing Step]

In this step, the interlayer insulating film 29 is etched back by dry-etching the protecting film 28 and the gate insulating film 28 as shown in (d) of FIG. 11 and then ashing the interlayer insulating film 29 with oxygen ($O_2$ ashing).

Thus, by causing the end face 29a of the interlayer insulating film 29 to get further away from the terminal area 55 than the end face 28a of the protective film 28 and the end face 24a of the gate insulating film 24, the end face 29a of the interlayer insulating film 29 is spaced at a distance x from the end face 28a of the protective film 28 and the end face 24a of the gate insulating film 24. The distance x is the same as that mentioned above.

In the result, as shown in (a) and (b) of FIG. 10 and (e) of FIG. 11, the gate insulating film 24 is structured such that part of the gate insulating film 24 extends from the end face 29a of the interlayer insulating film 29.

It should be noted, in this step, that the ashing conditions are not to be particularly limited. The ashing conditions need only be set so that, as described above, the end face 29a of the interlayer insulating film 29 gets further away from the terminal area 55 than the end face 28a of the protective film 28 and the end face 24a of the gate insulating film 24.

[Transparent Conductive Film Forming Step]

This step per se is the same as that shown in (e) of FIG. 6 in Embodiment 1. In this step, a transparent conductive film made of ITO is formed entirely over an upper surface of the glass substrate 21 over which the interlayer insulating film 29 has been formed. Next, on the transparent conductive film, a resist pattern is formed by photolithography. After that, the transparent conductive film is patterned by wet etching, and then the resist pattern is washed away.

Thus, in the present embodiment, too, as shown in (f) of FIG. 11, a pixel electrode 30 constituted by the transparent conductive film is formed in each pixel 10.

Meanwhile, since, as mentioned above, the present embodiment has no semiconductor layer formed in the scanning wire connection area 50, the step causes a transparent electrode 33 constituted by the transparent conductive film is formed in the scanning wire connection area 50 in such a way as to cover an upper surface of the interlayer insulating film 29, the end face 29a of the interlayer insulating film 29, an upper surface of the protective film 28, the end face 28a of the protective film 28, the end face 24a of the gate insulating film 24, and an upper surface of the exposed part of the scanning wire 22.

Since the transparent electrode 33 is formed on the exposed part of the scanning wire 22 as described above, a scanning terminal 51 (terminal electrode) is formed at an end of the scanning wire 22.

[Alignment Film Forming Step]

Finally, as in Embodiment 1, an alignment film (not illustrated) is formed, as needed, on a surface of the active-matrix substrate 20 (which faces the counter substrate 80).

Thus, the active-matrix substrate 20 according to the present embodiment can be manufactured.

The foregoing example of manufacturing has been described by taking, as an example, a case where, as described above, the interlayer insulating film 29 is subjected to $O_2$ ashing after the protective film/interlayer insulating film forming step (i.e., after dry etching the protective film 28 and the gate insulating film 24). However, the present embodiment is not to be limited to such an example. For example, the end face 29a of the interlayer insulating film 29 may be spaced (etched back) at a certain distance x from the end face 28a of the protective film 28 and the end face 24a of the gate insulating film 24 by using a half-exposure technique, $O_2$ ashing, etc. In this case, too, the active-matrix substrate 20 according to the present embodiment shown in (a) and (b) of FIG. 10 can be manufactured.

The distance x (etch-back distance) is not to be particularly limited. However, to ensure the effects, it is preferable that the distance x be 0.5 µm or greater. Further, in a case where etch back is carried out by ashing, it is not realistic for the distance x to take on a value that is greater than the film thickness of the interlayer insulating film 29. Therefore, the distance x is set to be equal to or smaller than the film thickness of the interlayer insulating film 29 (e.g., in the range of 0.5 µm to 5 µm). On the other hand, in a case were etch back is carried out in combination of the half-exposure technique, the distance x can be made larger (e.g., made larger than the film thickness of the interlayer insulating film 29).

Embodiment 5

Another embodiment of the present invention is described below with reference to FIGS. 12 and 13. It should be noted that in the present embodiment, points of difference between the present embodiment and Embodiments 1 and 4 are mainly described, and that those components having the same functions as those of Embodiments 1 and 4 are given the same reference numerals, and as such, are not described below.

Figure 12:
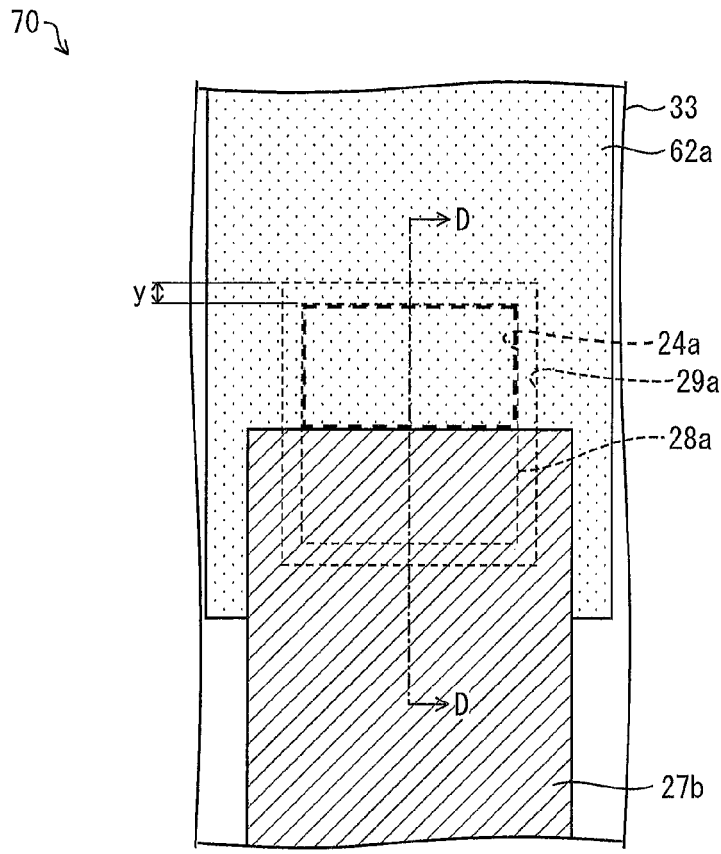
FIG. 12 is a plan view schematically showing a configuration of a scanning wire connection area on an active-matrix substrate according Embodiment 6 of the present invention.

FIG. 12 is a plan view schematically showing a configuration of a wire connection area 70 on an active-matrix substrate 20 according the present embodiment. FIG. 13 is a cross-sectional view of the active-matrix substrate 20 taken along the arrow D-D in FIG. 12.

In the wire connection area 70, as mentioned above, a change in connection (change in layer) from the source metal layer to the gate metal layer is made.

Figure 13:
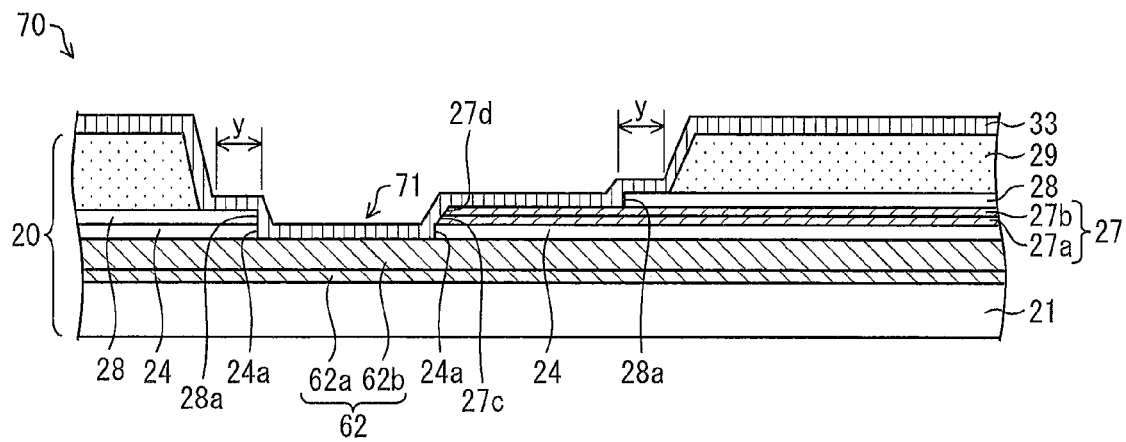
FIG. 13 is a cross-sectional view of the active-matrix substrate taken along the arrow D-D in FIG. 12.

As shown in FIG. 13, the active-matrix substrate 20 has its wire connection area 70 configured such that a connection wire 62 constituted by a first metal wiring layer (gate metal layer), a gate insulating film 24, a signal wire 27 constituted by a second metal wiring layer (source metal layer), a protective film 28, an interlayer insulating film 29, and a transparent electrode 33 are laminated in the order named over a glass substrate 21.

In the present embodiment, too, the first metal wiring layer and the second metal wiring layer each have a two-layer structure. That is, in the present embodiment, the connection wire 62, as shown in FIG. 13, is configured with its upper connection wire 62b provided on its lower connection wire 62a. Further, the signal wire 27, as shown in FIG. 13, is configured with its upper signal wire 27b provided on its lower signal wire 27a. However, as noted above in Embodiment 1, neither the first metal wiring layer nor the second metal wiring layer is to be limited to such a configuration.

The signal wire 27 is electrically connected to the connection wire 62 via a contact hole 71 (opening) provided in the wire connection area 70. The contact hole 71 has its surface covered with the transparent electrode 33.

The connection wire 62 and the signal wire 27 are formed in such a way as to extend along different directions from each other. The contact hole 71 are formed so that at least either the connection wire 62 or the signal wire 27 (the signal wire 27 in the present embodiment) has its edge (end face) located inside of the contact hole 71.

The contact hole 17 of FIGS. 12 and 13 can be formed by the method described above in Embodiment 4. A method for forming such a contact hole 71 is described below with reference to (a) through (f) of FIG. 11 and FIGS. 12 and 13.

In the [Scanning Wire Forming Step] described above in Embodiment 4, a connection wire 62 constituted by the same first metal wiring layer as the scanning wire 22 is formed in the same layer as the scanning wire 22 on the glass substrate 21 in the wire connection area 70.

Next, in the [Gate Insulating Film/Semiconductor Layer Forming], a gate insulating film 24 is formed on the connection wire 62 in the wire connection area 70.

After that, in the [Signal Wire Forming Step], a signal wire 27 is formed on the gate insulating film 24 in the wire connection area 70.

Then, in the [Protective Film/Interlayer Insulating Film Forming Step], by carrying out dry etching with use of the interlayer insulating film 29 as a mask, unmasked parts of the gate insulating film 24 and the protective film 28 are removed, whereby an opening that is to serve as a contact hole 71 is formed in an area of change in wiring between the signal wire 27 and the connection wire 62 (i.e., an area that is to serve as a connection area between the signal wire 27 and the connection wire 62 for a change in layer; hereinafter simply referred to as "changing area").

At this point in time, first, a series of dry etching with use of the interlayer insulating film 29 as a mask causes openings to be formed in those parts of the protective film 28 which are adjacent to the signal wire 27 and to the gate insulating film 24, respectively, so that part of the signal wire 27 is exposed, as shown in FIGS. 12 and 13. Then, by using the interlayer insulating film 29 and the signal wire 27 as masks, openings are formed in those parts of the gate insulating film 24 and the protective film 28 which are adjacent to the connection wire 62, respectively, so that part of the connection wire 62 is exposed.

Thus, as shown in FIG. 12, in the openings whose opening end faces are the end face 28a of the protective film 28 and an end face (not illustrated) of the interlayer insulating film 29 before ashing, respectively, an opening whose opening end face is the end face 24a of the gate insulating film 24 is formed. Since the protective film 28 has an opening formed therein with use of the interlayer insulating film 29 as a mask, the protective film 28 has its end face 28a formed in such a way as to meet (overlap) the end face (opening end face) of the interlayer insulating film 29 before ashing. For this reason, FIG. 12 illustrates the end face 28a (opening end face) of the protective film 28 and omits to illustrate the interlayer insulating film 29 before ashing.

After that, in the [Ashing Step], the interlayer insulating film 29 is etched back by $O_2$ ashing or the like. Thus, as shown in FIGS. 12 and 13, the end face 29a of the interlayer insulating film 29 gets further away from the exposed parts of the connection wire 62 and the signal wire 27 than the end face 28a of the protective film 28 by a distance y.

That is, the distance y is an etch-back distance of the end face 29a of the interlayer insulating film 29 after ashing from the end face 29a of the interlayer insulating film 29 before ashing, and is equal to the distance between the end face 28a of the protective film 28 and the end face 29a of the interlayer insulating film 29 after ashing.

In the result, the opening in the interlayer insulating film 28 is enlarged, and an opening formed by the end face 29a of the interlayer insulating film 29 of FIGS. 12 and 13 is formed.

In the result, as shown in FIGS. 12 and 13, the gate insulating film 24, the protective film 28, and the signal wire 27 are structured such that part of the gate insulating film 24, part of the protective film 28, and part of the signal wire 27 extend from the end face 29a of the interlayer insulating film 29. That is, the gate insulating film 24, the protective film 28, and the signal wire 27 are structured such that part of the gate insulating film 24, part of the protective film 28, and part of the signal wire 27 come out further than the end face 29a, which is the opening end face of the interlayer insulating film 29, into the opening.

Next, in the [Transparent Conductive Film Forming Step], the transparent electrode 33 is formed in such a way as to cover part or all of the changing area including the entire opening formed by the end face 29a of the interlayer insulating film 29, the upper surface and end face 28a of the protective film 28 that extend from the end face 29a of the interlayer insulating film 29, the upper surface and end face 27d of the upper signal wire 27b that extend from the position of the end face 29a of the interlayer insulating film 29 before ashing (i.e., from the end face 28a of the protective film 28), the end face 27c of the lower signal wire 27a, and the end face 24a of the gate insulating film 24. Thus, the connection wire 62 and the signal wire 72 are electrically connected via the transparent electrode 33. Thus, the contact hole 71 is formed.

As described above, according to the present embodiment, the end face 29a of the interlayer insulating film 29 is provided further away from an area where the connection wire 62 and the transparent electrode 33 are in direct contact with each other (first connection area in the changing area) and an area where the signal wire 27 and the transparent electrode 33 are direct contact with each other (second connection area in the changing area) than the end face 24a of the interlayer insulating film 24 that faces those areas (i.e., the first and second connection areas) and the end face 28a of the protective film 28 that faces those areas (i.e., the first and second connection areas).

For this reason, in the present embodiment, too, even if there occurs a defect 33a in that part of the transparent electrode 33 which covers the interlayer insulating film 29, the distance between the defect 33a and the first and second connection areas (i.e., a region in each metal wire where the conductive film is laminated directly on the metal wire without the inorganic insulating film and the organic insulating film being sandwiched therebetween) is kept large. Further, in the present embodiment, too, the surface roughness of the gate insulating film 24 and the protective film 28 after dry etching is reduced to a comparatively small degree. For this reason, those parts of the transparent electrode 33 which covers the end face 24a of the gate insulating film 24 and the end face 28a of the protective film 28 become dense, so that the intrusion and runabout entry of a corrosion-accelerating component are prevented.

For this reason, in the present embodiment, too, even if the interlayer insulating film 29 has a rough surface and a defect 33a occurs in the transparent electrode 33 on the interlayer insulating film 29, corrosion and breakage of the scanning wire 22 and the scanning electrode 12 due to the surface state of the interlayer insulating film 29 can be prevented.

In the present embodiment, too, the ashing conditions are not to be particularly limited. The ashing conditions need only be set so that, as described above, the end face 29a of the interlayer insulating film 29 gets further away the end face 28a of the protective film 28 and the end face 24a of the gate insulating film 24.

The etch-back distance y of the end face of the interlayer insulating film 29 in the wire connection area 70 is not to be particularly limited. However, to ensure the effects, it is preferable that the distance y be 0.5 μm or greater. Further, in a case where etch back is carried out by ashing, it is not realistic for the distance y to take on a value that is greater than the film thickness of the interlayer insulating film 29. Therefore, the distance y is set to be equal to or smaller than the film thickness of the interlayer insulating film 29 (e.g., in the range of 0.5 μm to 5 μm). On the other hand, in a case were etch back is carried out in combination of the half-exposure technique, the etch-back distance y of the interlayer insulating film 29 by etch back can be made larger (e.g., made larger than the film thickness of the interlayer insulating film 29).

However, in the case of use of the above technique in an area of change in wiring (contact hole 71) as described above, the upper limit on the distance y is restricted by the widths of wires (i.e., the width of the connection wire 62 and the width of the signal wire 27 or, in the example shown in FIG. 12, in particular, the width of the signal wire 27 whose line width is narrower).

Embodiment 6

Another embodiment of the present invention is described below with reference to FIG. 14 and (a) and (b) of FIG. 15. It should be noted that in the present embodiment, points of difference between the present embodiment and Embodiments 1 and 4 are mainly described, and that those components having the same functions as those of Embodiments 1 and 4 are given the same reference numerals, and as such, are not described below.

Figure 14:
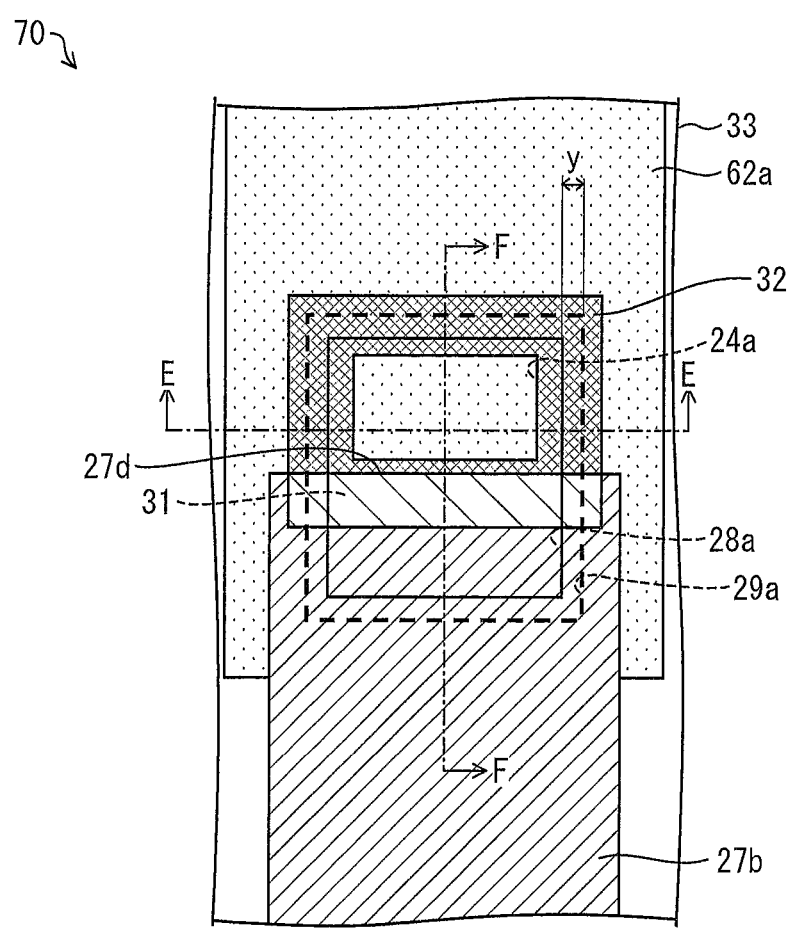
FIG. 14 is a plan view schematically showing a configuration of a scanning wire connection area on an active-matrix substrate according Embodiment 7 of the present invention.

FIG. 14 is a plan view schematically showing a configuration of a scanning wire connection area 70 on an active-matrix substrate 20 according the present embodiment. Further, FIG. 15 shows (a) a cross-sectional view of the active-matrix substrate 20 taken along the arrow E-E in FIG. 14 and (b) a cross-sectional view of the active-matrix substrate 20 taken along the arrow F-F in FIG. 14.

Figure 15:
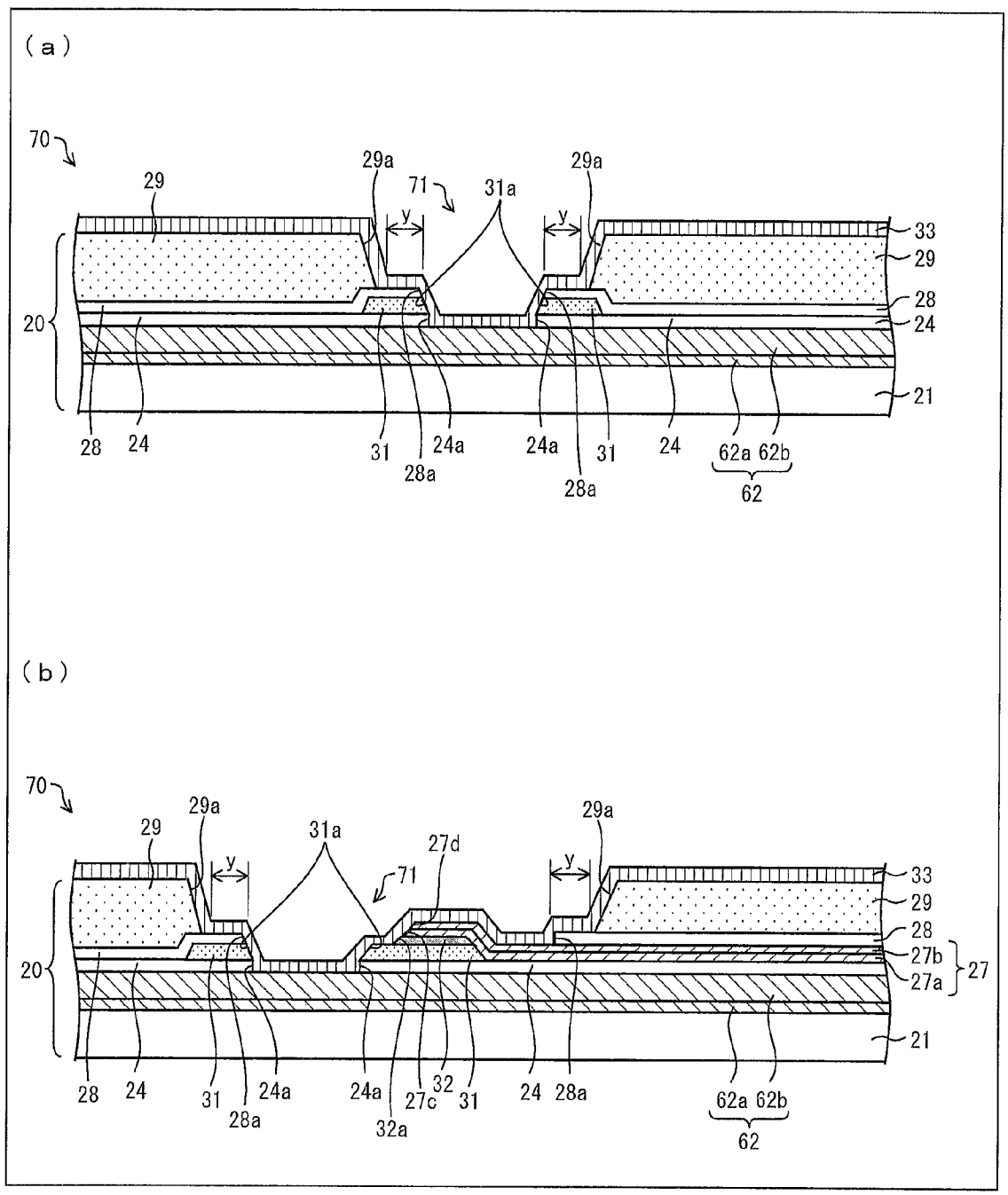
FIG. 15 shows (a) a cross-sectional view of the active-matrix substrate 20 taken along the arrow E-E in FIG. 14 and (b) a cross-sectional view of the active-matrix substrate 20 taken along the arrow F-F in FIG. 14.

As shown in (a) and (b) of FIG. 15, the active-matrix substrate 20 according to the present embodiment has its wire connection area 70 structured such that a connection wire 62 constituted by a first metal wiring layer (gate metal layer), a gate insulating film 24, a first semiconductor layer 31, a second semiconductor layer 32, a signal wire 27 constituted by a second metal wiring layer (source metal layer), a protective film 28, an interlayer insulating film 29, and a transparent electrode 33 are laminated in the order named over a glass substrate 21.

It should be noted that the present embodiment is also described by taking, as an example, a case where the first metal wiring layer and the second metal wiring layer each have a two-layer structure, where the connection wire 62 is composed of a lower connection wire 62a and an upper connection wire 62b, and where the signal wire 27 is composed of a lower signal wire 27a and an upper signal wire 27b; however, as with Embodiment 5, the present embodiment is not limited to such an example.

In the present embodiment, too, the signal wire 27 is electrically connected to the connection wire 62 via a contact hole 71 (opening) provided in the wire connection area 70. The contact hole 71 has its surface covered with the transparent electrode 33.

Further, the connection wire 62 and the signal wire 27 are formed in such a way as to extend along different directions from each other. The contact hole 71 are formed so that at least either the connection wire 62 or the signal wire 27 (the signal wire 27 in the present embodiment) has its edge (end face) located inside of the contact hole 71.

Since, in the present embodiment, the first semiconductor layer 31 is provided with an opening forming the contact hole 71, the first semiconductor layer 31 has a ring shape.

The contact hole 71 of FIG. 14 and (a) and (b) of FIG. 15 can be formed by a combination of the method described above in Embodiment 4 with the method described above in Embodiment 1. A method for forming such a contact hole 71 is described below with reference to (a) through (e) of FIG. 6, (a) through (f) of FIG. 11, FIG. 14, and (a) and (b) of FIG. 15.

In the [Scanning Wire Forming Step] described above in Embodiment 1, a connection wire 62 constituted by the same first metal wiring layer as the scanning wire 22 is formed in the same layer as the scanning wire 22 on the glass substrate 21 in the wire connection area 70.

Next, in the [Gate Insulating Film/Semiconductor Layer Forming], a gate insulating film 24, a first semiconductor layer 31, and a second semiconductor layer 32 are formed in the order named over the connection wire 62 in the wire connection area 70. In this step, each of the first and second semiconductor layers 31 and 32 thus formed has an island shape.

After that, in the [Signal Wire Forming Step], two types of conductive film made of Ti and Cu, respectively, are successively formed in the order name by sputtering over the gate insulating film 24 in such a way as to cover the first and second semiconductor layers 31 and 32.

Next, on the conductive film, a resist pattern is formed by photolithography. After that, the conductive film is patterned by wet etching. At this point in time, that region of the second semiconductor layer 32 which is not covered with the resist pattern is removed by the patterning. After that, the resist pattern is washed away.

Thus formed on the gate insulating film 24 is a signal wire 27 covering part of the first semiconductor layer 31 and the second semiconductor layer 32.

Moreover, in the [Protective Film/Interlayer Insulating Film Forming Step], by carrying out dry etching with use of the interlayer insulating film 29 as a mask, unmasked parts of the gate insulating film 24 and the protective film 28 are removed, whereby an opening that is to serve as a contact hole 71 is formed in an area of change in wiring between the signal wire 27 and the connection wire 62 (changing area).

At this point in time, first, a series of dry etching with use of the interlayer insulating film 29 as a mask causes openings to be formed in those parts of the protective film 28 which are adjacent to the signal wire 27, to the second semiconductor layer 32, and to the gate insulating film 24, respectively, so that part of the signal wire 27 is exposed, as shown in FIG. 14 and (a) and (b) of FIG. 15. Then, by using the interlayer insulating film 29, the signal wire 27, the first semiconductor layer 31, and the second semiconductor layer 32 as masks, openings are formed in those parts of the gate insulating film 24 and the protective film 28 which are adjacent to the connection wire 62, respectively, so that part of the connection wire 62 is exposed.

Thus, as shown in FIG. 14, in the openings whose opening end faces are the end face 28a of the protective film and an end face (not illustrated) of the interlayer insulating film 29 before ashing, respectively, an opening whose opening end face is the end face 24a of the gate insulating film 24 is formed. Since the protective film 28 has an opening formed therein with use of the interlayer insulating film 29 as a mask, the interlayer insulating film 29 before ashing has its end face (opening end face) formed in such a way as to meet (overlap) the end face 28a of the protective film 28. For this reason, FIG. 14 illustrates the end face 28a (opening end face) of the protective film 28 and omits to illustrate the interlayer insulating film 29 before ashing. Further, as shown in (a) and (b) of FIG. 15, the first semiconductor layer 31 has its end face 31a (opening end face) formed in such a way as to meet (overlap) the end face 24a of the gate insulating film 24. For this reason, FIG. 14 illustrates the end face 24a of the gate insulating film 24 and omits to illustrate the end face 31a (opening end face) of the first semiconductor layer 31. Since, as mentioned above, the second semiconductor layer 32 exposed from the signal wire 27 has been removed during the patterning of the signal wire 27, the second semiconductor layer 32 has its end face 32a formed, as shown in (b) of FIG. 15, in such a way as to meet the end face of the signal wire 27.

After that, in the [Ashing Step], the interlayer insulating film 29 is etched back by $O_2$ ashing or the like. Thus, as shown in FIG. 14 and (a) and (b) of FIG. 15, the end face 29a of the interlayer insulating film 29 gets further away from the exposed parts of the connection wire 62 and the signal wire 27 than the end face 28a of the protective film 28 by a distance y.

In the present embodiment, too, the distance y is an etch-back distance of the end face 29a of the interlayer insulating film 29 after ashing from the end face of the interlayer insulating film 29 before ashing, and is equal to the distance between the end face 28a of the protective film 28 and the end face 29a of the interlayer insulating film 29 after ashing.

In the result, the opening in the interlayer insulating film 28 is enlarged, and an opening formed by the end face 29a of the interlayer insulating film 29 of FIG. 14 and (a) and (b) of FIG. 15 is formed.

In the result, as shown in FIG. 14 and (a) and (b) of FIG. 15, the active-matrix substrate 20 is structured such that part of the gate insulating film 24, part of the first semiconductor layer 31, part of the second semiconductor layer 32, part of the signal wire 27, and part of the protective film 28 extend from the end face 29a of the interlayer insulating film 29 (i.e., come out further than the end face 29a, which is the opening end face of the interlayer insulating film 29, into the opening).

Next, in the [Transparent Conductive Film Forming Step], the transparent electrode 33 is formed in such a way as to cover part or all of the changing area including the entire opening formed by the end face 29a of the interlayer insulating film 29, the upper surface and end face 28a of the protective film 28 that extend from the end face 29a of the interlayer insulating film 29, the upper surface and end face 27d of the upper signal wire 27b that extend from the position of the end face 29a of the interlayer insulating film 29 before ashing (i.e., from the end face 28a of the protective film 28), the end face 27c of the lower signal wire 27a, the end face 32a of the second semiconductor layer 32, the end face 31a of the first semiconductor layer 31, and the end face 24a of the gate insulating film 24. Thus, the connection wire 62 and the signal wire 72 are electrically connected via the transparent electrode 33. Thus, the contact hole 71 is formed.

As described above, in the present embodiment, too, the end face 29a of the interlayer insulating film 29 is provided further away from an area where the connection wire 62 and the transparent electrode 33 are in direct contact with each other (first connection area in the changing area) and an area where the signal wire 27 and the transparent electrode 33 are direct contact with each other (second connection area in the changing area) than the end face 24a of the interlayer insulating film 24 that faces those areas (i.e., the first and second connection areas) and the end face 28a of the protective film 28 that faces those areas (i.e., the first and second connection areas).

For this reason, in the present embodiment, too, even if there occurs a defect 33a in that part of the transparent electrode 33 which covers the interlayer insulating film 29, the distance between the defect 33a and the first and second connection areas (i.e., a region in each metal wire where the conductive film is laminated directly on the metal wire without the inorganic insulating film and the organic insulating film being sandwiched therebetween) is kept large. Further, in the present embodiment, too, the surface roughness of the gate insulating film 24 and the protective film 28 after dry etching is reduced to a comparatively small degree. For this reason, those parts of the transparent electrode 33 which covers the end face 24a of the gate insulating film 24 and the end face 28a of the protective film 28 become dense, so that the intrusion and runabout entry of a corrosion-accelerating component are prevented.

For this reason, in the present embodiment, too, even if the interlayer insulating film 29 has a rough surface and a defect 33a occurs in the transparent electrode 33 on the interlayer insulating film 29, corrosion and breakage of the scanning wire 22 and the scanning electrode 12 due to the surface state of the interlayer insulating film 29 can be prevented.

It should be noted, in this step, that the ashing conditions are not to be particularly limited. The ashing conditions need only be set so that, as described above, the end face 29a of the interlayer insulating film 29 gets further away the end face 28a of the protective film 28 and the end face 24a of the gate insulating film 24.

In the present embodiment, too, the etch-back distance y of the end face of the interlayer insulating film 29 in the wire connection area 70 is not to be particularly limited. Further, in a case where etch back is carried out by ashing, the distance y is set to be, for example, in the range of 0.5 μm to 5 μm for the same reason as that stated above in Embodiment 5. On the other hand, in the present embodiment, too, in a case were etch back is carried out in combination of the half-exposure technique, the etch-back distance y of the interlayer insulating film 29 by etch back can be made larger (e.g., made larger than the film thickness of the interlayer insulating film 29).

In the present embodiment, too, in the case of use of the above technique in an area of change in wiring (contact hole 71) as described above, the upper limit on the distance y is restricted by the widths of wires (i.e., the width of the connection wire 62 and the width of the signal wire 27 or, in the example shown in FIG. 14, in particular, the width of the signal wire 27 whose line width is narrower).

As described above, in a case where the present invention is applied to the wire connection area 70, it is preferable that a structure that enlarges the distance between the end face 29a of the interlayer insulating film 29 and the end face 28a of the protective film 28 be also provided on the signal wire 27. For this reason, in a case where the present invention is applied to the wire connection area 70, it is preferable that the active-matrix substrate 20 be structured as shown in Embodiment 5 or in the present embodiment.

However, in a case where the wire connection area 70 is formed inside of the sealing agent 91, corrosion is less likely. For this reason, the [Ashing Step] may be omitted from the example of manufacturing of the present embodiment by applying only the method described above in Embodiment 1. Thus, the active-matrix substrate 20 may be structured to prevent only the connection wire 60 (first wiring layer) from corroding.

Further, the present embodiment has been described by taking, as an example, a case were the second semiconductor layer 32 exposed from the signal wire 27 has been removed during the patterning of the signal wire 27 as mentioned above. However, the present embodiment is not to be limited to such an example. For example, it is possible to leave the second semiconductor layer by using a dedicated mask for etching of the semiconductor layer, e.g., by etching the metal wire and the semiconductor layer separately.

Embodiment 7

Another embodiment of the present invention is described below with reference to (a) through (f) of FIG. 16. It should be noted that in the present embodiment, points of difference between the present embodiment and Embodiment 1 are mainly described, and that those components having the same functions as those of Embodiment 1 are given the same reference numerals, and as such, are not described below.

Figure 16:
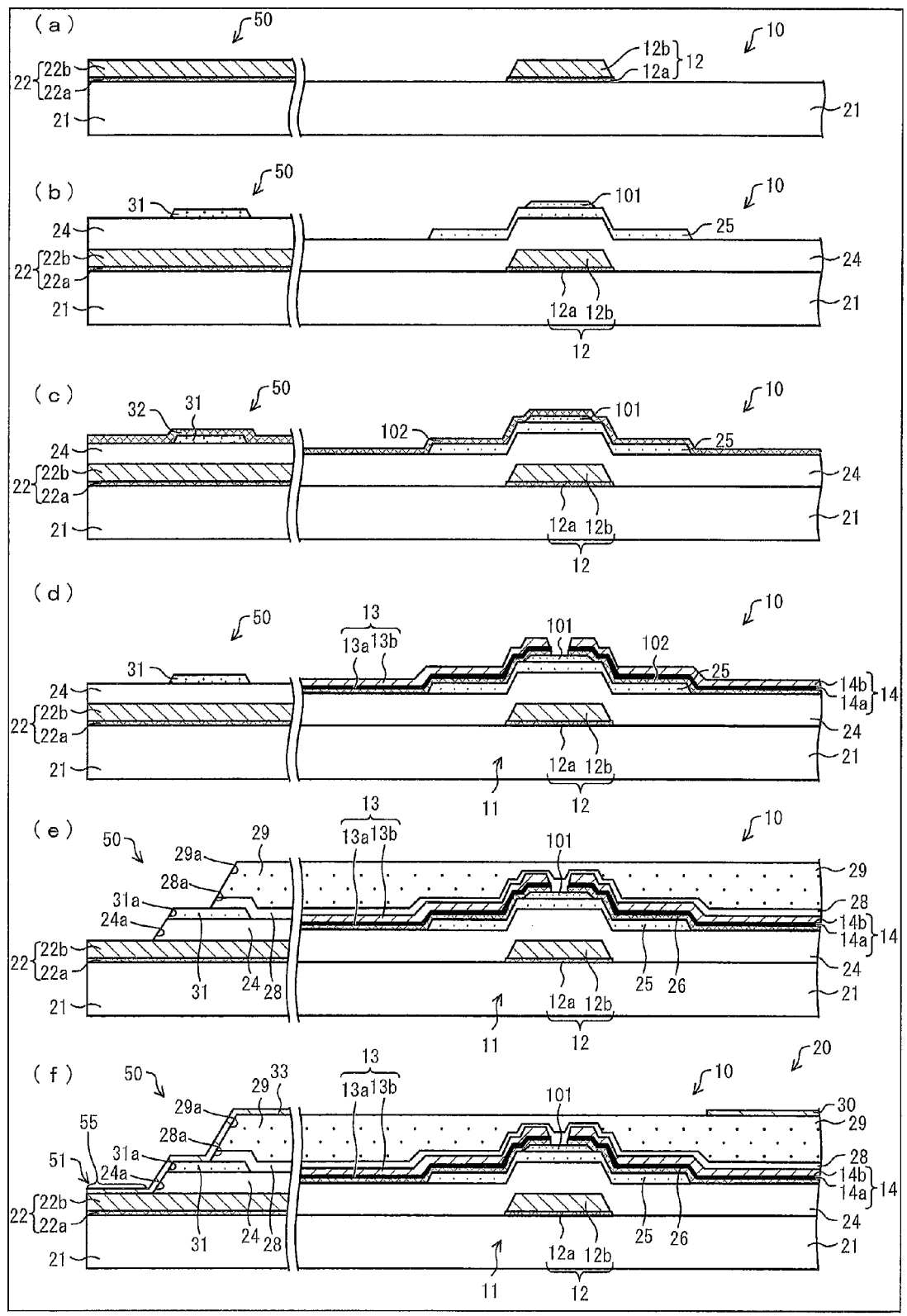
FIG. 16 is a set of cross-sectional views (a) through (f) of an active-matrix substrate 20 according to Embodiment 7 of the present invention, the cross-sectional views (a) through (f) showing successive steps of a process by which the active-matrix substrate 20 is manufactured.

FIG. 16 is a set of cross-sectional views (a) through (f) of the active-matrix substrate 20, the cross-sectional views (a) through (e) showing successive steps of a process by which the active-matrix substrate 20 is manufactured. It should be noted that in each of (a) through (f) of FIG. 16, a cross-section of the scanning wire connection area 50 and a cross-section of an area near a TFT 11 in each pixel 10 are juxtaposed as cross-sections of the non-display and display regions 42 and 41 of the active-matrix substrate 20 at the end of the corresponding step.

First, those layers constituting the active-matrix substrate 20 are described below with reference to (f) of FIG. 16.

As with Embodiment 1, the present embodiment is described by taking the scanning wire connection area 50 as an example of the connection area 44. However, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively.

As shown in (f) of FIG. 16, the active-matrix substrate 20 according to the present embodiment has its display region 41 configured such that a first metal wiring layer (gate metal layer) such as a scanning electrode 12, a gate insulating film 24, a channel layer 25, a channel protecting layer 101, an electrode contact layer 26, a second metal wiring layer (source metal layer) such as a signal electrode 13 and a drain electrode 14, a protective film 28, an interlayer insulating film 29, a pixel electrode 30, and, as needed, an alignment film (not illustrated) are provided in the order named over a glass substrate 21.

Meanwhile, the active-matrix substrate 20 has its scanning wire connection area 50 configured such that a scanning wire 22, the gate insulating film 24, a first semiconductor layer 31, the protective film 28, the interlayer insulating film 29, and the transparent electrode 33 are laminated in the order named over the glass substrate 21. Further provided at an end of the scanning wire 22 by laminating the transparent electrode 33 directly on the scanning wire 22 is a terminal area 55.

In the present embodiment, too, the scanning wire 22 is configured with its upper scanning wire 22b provided on its lower scanning wire 22a. However, as noted above in Embodiment 1, the scanning wire 22 is not to be limited to such a configuration.

The active-matrix substrate 20 according to the present embodiment has the same configuration as the active-matrix substrate 20 according to Embodiment 1, except that the channel protecting layer 101 is provided between the channel layer 25 and the electrode contact layer 26 and that a semiconductor layer that is to serve as the electrode contact layer 26 is also provided under the second metal wiring layer (not illustrated).

In the following, a method for manufacturing an active-matrix substrate 20 according to the present embodiment is described below with reference to (a) through (f) of FIG. 16. In the following example of manufacturing, the conditions such as the thickness of each layer are the same as those in Embodiment 1, unless otherwise specified.

[Scanning Wire Forming Step]

This step is the same as that shown in (a) of FIG. 6 in Embodiment 1, and as such, the step is not described below in detail.

However, in the gate insulating film/semiconductor layer forming step according to the present embodiment, a Ti film having a thickness of 30 to 150 nm and a Cu film having a thickness of 200 to 500 nm were successively formed in the order named by sputtering over the glass substrate 21. Thus, a scanning electrode 12 having a Cu/Ti two-layer structure with its upper scanning electrode 12b provided on its lower scanning electrode 12a and a scanning wire 22 having a Cu/Ti two-layer structure with its upper scanning wire 22b provided on its lower scanning wire 22a were formed.

[Gate Insulating Film/First Semiconductor Layer/Channel Protecting Layer Forming Step]

In this step, as shown in (b) of FIG. 16, a channel layer 25, a channel protecting layer 101, and an electrode contact layer 26 are formed.

First, a gate insulating film 24 (inorganic insulating film) made of silicon nitride ($SiN_x$), an amorphous silicon layer (semiconductor layer) for forming a channel layer 25, and a silicon nitride ($SiN_x$) layer for forming a channel protecting layer 101 are successively formed by CVD in the order named in such a way as to cover the scanning electrode 12 and the scanning wire 22.

After that, by repeating twice the step including forming a resist pattern by photolithography and washing away the resist pattern, the silicon nitride ($SiN_x$) layer and the amorphous silicon layer, which are the uppermost layers, are patterned as shown in (b) of FIG. 16.

Thus, as shown in (b) of FIG. 16, a channel layer 25 constituted by the amorphous silicon layer and a channel protecting layer 101 laminated on the channel layer 25 are formed over the gate insulating film 24 in each pixel 10. Further, a first semiconductor layer 31 constituted by the amorphous silicon layer is formed on the gate insulating film 24 in the scanning wire connection area 50. It should be noted that the uppermost silicon nitride layer was entirely removed by the patterning except for the channel part.

In this step, it is preferable that the silicon nitride film thus formed to constitute the gate insulating film 24 have a thickness of 200 to 500 nm; however, this does not imply any particular limitation. Further, it is preferable that the amorphous silicon layer thus formed to constitute the channel layer 25 and the first semiconductor layer 31 have a thickness of 30 to 300 nm, and that the silicon nitride layer thus formed to constitute the channel protecting layer 101 have a thickness of 100 to 300 nm.

[Second Semiconductor Layer/Signal Wiring Forming Step]

In this step, first, as shown in (c) of FIG. 16, an n+ amorphous silicon layer 102 highly doped with an n-type impurity is formed by CVD on the gate insulating film 24 in such a way as to cover the channel layer 25, the channel protecting film 101, and the first semiconductor layer 31.

Next, two types of conductive film made of Ti and Cu, respectively, are successively formed in the order named by sputtering over the n+ amorphous silicon layer 102.

Then, on the conductive film, a resist pattern is formed by photolithography. After that, the conductive film and the n+ amorphous silicon layer 102 are patterned by etching, and the second semiconductor layer 32 constituted by the n+ amorphous silicon layer 102 is removed. After that, the resist pattern is washed away.

Thus, as shown in (d) of FIG. 16, the second metal wiring layer thus pattern-formed (e.g., signal electrodes 13, drain electrodes 14, signal wires 27, drain wires 15, intermediate electrodes 16, etc.) and the electrode contact layer 26, constituted by the n+ amorphous silicon layer 102, which is provided under the second metal wiring layer in such a way as to overlap the second metal wiring layer are formed in the display region 41. At the same time, in the connection area 44, the semiconductor layer 31 is pattern-formed which is electrically disconnected from the channel layer 25 and the electrode contact 26 in the display region 41.

In this step, it is preferable that the n+ amorphous silicon layer thus formed have a thickness of 50 to 150 nm, that the Ti film thus formed have a thickness of 20 to 150 nm, and that the Cu film thus formed have a thickness of 100 to 400 nm; however, this does not imply any particular limitation.

It should be noted that this example of manufacturing has also been described by taking, as an example, a case where a second metal wire (source metal layer) including the signal electrodes 13 has a Ti/Cu laminated structure (two-layer structure) serving as an upper metal wire/a lower metal wire. However, as in the case of the first metal wiring layer (gate metal layer), the present invention is not to be limited to such an example.

[Protective Film/Interlayer Insulating Film Forming Step]

This step per se is the same as that shown in (d) of FIG. 6 in Embodiment 1. In this step, first, as shown in (e) of FIG. 16, a silicon nitride (SiN$_x$) film is formed by CVD as a protective film 28 over the gate insulating film 24 in such a way as to cover the signal wires 27, signal electrodes 13, and drain electrodes 14 constituted by the second metal wiring layer.

Next, an interlayer insulating film material made of a photosensitive resin material is formed by spin coating on the silicon nitride film. After that, patterning is carried out by photolithography, and then dry etching is carried out. Thus, the protective film 28 constituted by the nitride silicon film and an interlayer insulating film 29 constituted by the interlayer insulating film material are pattern-formed.

At this point in time, although not illustrated, by carrying out dry etching with use of the interlayer insulating film 29 as a mask, unmasked parts of the protective film 28 in each pixel 10 are removed, so that the signal electrode 13 and the drain electrode 14 are exposed.

Meanwhile, in the scanning wire connection area 50, as shown in (e) of FIG. 16, by carrying out dry etching with use of the interlayer insulating film 29 as a mask, unmasked parts of the gate insulating film 24 and the protective film 28 over the scanning wire 22 serving as a drawn wire are removed, whereby the terminal area 55 (scanning terminal 51 and an area therearound) of the scanning wire 22 is exposed.

In the scanning wire connection area 50 at this point in time, as shown in (e) of FIG. 16, the first semiconductor layer 31 is disposed in a position of intersection between an extension of the end face 29a of the interlayer insulating film 29 and the scanning wire 22. This allows the first semiconductor layer 31 to serve as a mask during dry etching. In the result, as shown in (e) of FIG. 16, the first semiconductor layer 31 and the gate insulating layer 24 are structured such that part of the first semiconductor layer 31 and part of the gate insulating film 24 extend further than the end face 29a of the interlayer insulating film 29.

Therefore, the same active-matrix substrate 20 as the active-matrix substrate 20 shown in (d) of FIG. 6 in Embodiment 1 is formed through this step in the present embodiment as shown in (e) of FIG. 16, except that the channel protecting layer 101 is provided between the channel layer 25 and the electrode contact layer 26 and that a semiconductor layer that is to serve as the electrode contact layer 26 is also provided under the second metal wiring layer in the display region 41.

[Transparent Conductive Film Forming Step]

This step per se is the same as that shown in (e) of FIG. 6 in Embodiment 1. In this step, a transparent conductive film made of ITO is formed entirely over an upper surface the glass substrate 21 over which the interlayer insulating film 29 has been formed. Next, on the transparent conductive film, a resist pattern is formed by photolithography. After that, the transparent conductive film is patterned by wet etching, and then the resist pattern is washed away.

Thus, in the present embodiment, too, as shown in (f) of FIG. 16, a pixel electrode 30 constituted by the transparent conductive film is formed in each pixel 10. Further, a transparent electrode 33 constituted by the transparent conductive film is formed in the scanning wire connection area 50 in such a way as to cover an upper surface of the interlayer insulating film 29, the end face 29a of the interlayer insulating film 29, the end face 28a of the protective film 28, an upper surface of the first semiconductor layer 31, the end face 31a of the first semiconductor layer 31, the end face 24a of the gate insulating film 24, and an upper surface of the exposed part of the scanning wire 22.

Since the transparent electrode 33 is formed on the exposed part of the scanning wire 22 as described above, a scanning terminal 51 (terminal electrode) is formed at an end of the scanning wire 22.

[Alignment Film Forming Step]

Finally, as in Embodiment 1, an alignment film (not illustrated) is formed, as needed, on a surface of the active-matrix substrate 20 (which faces the counter substrate 80).

Thus, the active-matrix substrate 20 according to the present embodiment can be manufactured.

It should be noted that the present embodiment has been described by taking, as an example, a case where in the step shown in (b) of FIG. 16, a silicon nitride film and an amorphous silicon layer are patterned by carrying out photolithography twice. However, the present embodiment is not to be limited to such an example. The silicon nitride layer and the amorphous silicon layer can be patterned, for example, by carrying out the following step.

First, in the [Gate Insulating Film/First Semiconductor Layer/Channel Protecting Layer Forming Step], a gate insulating film 24, an amorphous silicon layer for forming a channel layer 25, and a silicon nitride layer for forming a channel protecting layer 101 are successively formed by CVD in the order named in such a way as to cover the scanning electrode 12 and the scanning wire 22, as thus far described above.

After that, a resist is applied by spin coating onto the silicon nitride layer for forming the channel protecting layer 101, and a resist pattern (halftone mask; not illustrated) having two levels of thickness is formed by half exposure on the regions where the channel layer 25 and the channel protecting layer 101 are formed. At this point in time, the film thickness of the resist pattern in the region where the channel protecting layer 101 is formed is made thinner than the film thickness of the resist pattern in the region where the channel layer 205 is formed.

Next, by etching the amorphous silicon layer and the silicon nitride film altogether with use of the resist pattern as a mask, an amorphous silicon layer and a silicon nitride layer on which the channel layer 25 and the channel protecting layer 101 are based are pattern-formed in the regions where the channel layer 25 and the channel protecting layer 101 are formed, respectively. That is, etching with use of the resist pattern as a mask gives a structure in which the channel layer 25 is pattern-formed and the silicon nitride layer for forming the channel protecting layer 101 is laminated on the channel layer 25.

After that, the thinner part of the resist pattern having two levels of thickness is removed by ashing (e.g., $O_2$ ashing). By etching the silicon nitride layer left on the channel layer 25 with use as a mask of the resist pattern thus left after ashing back (i.e., the thicker part of the resist pattern having two levels of thickness), the channel protecting layer 101 is pattern-formed.

Thus, the foregoing method allows the channel layer 25 and the channel protecting layer 101, which have different patterns as shown in (b) of FIG. 16, to be formed by carrying out photolithography only once.

Further, although the present embodiment has been described by taking, as an example, a case where the second semiconductor layer 32 is removed, the present embodiment is not to be limited to such an example, as mentioned above.

Embodiment 8

Another embodiment of the present invention is described below with reference to (a) through (f) of FIG. 17. It should be noted that in the present embodiment, points of difference between the present embodiment and Embodiment 1 are mainly described, and that those components having the same functions as those of Embodiment 1 are given the same reference numerals, and as such, are not described below.

Figure 17:
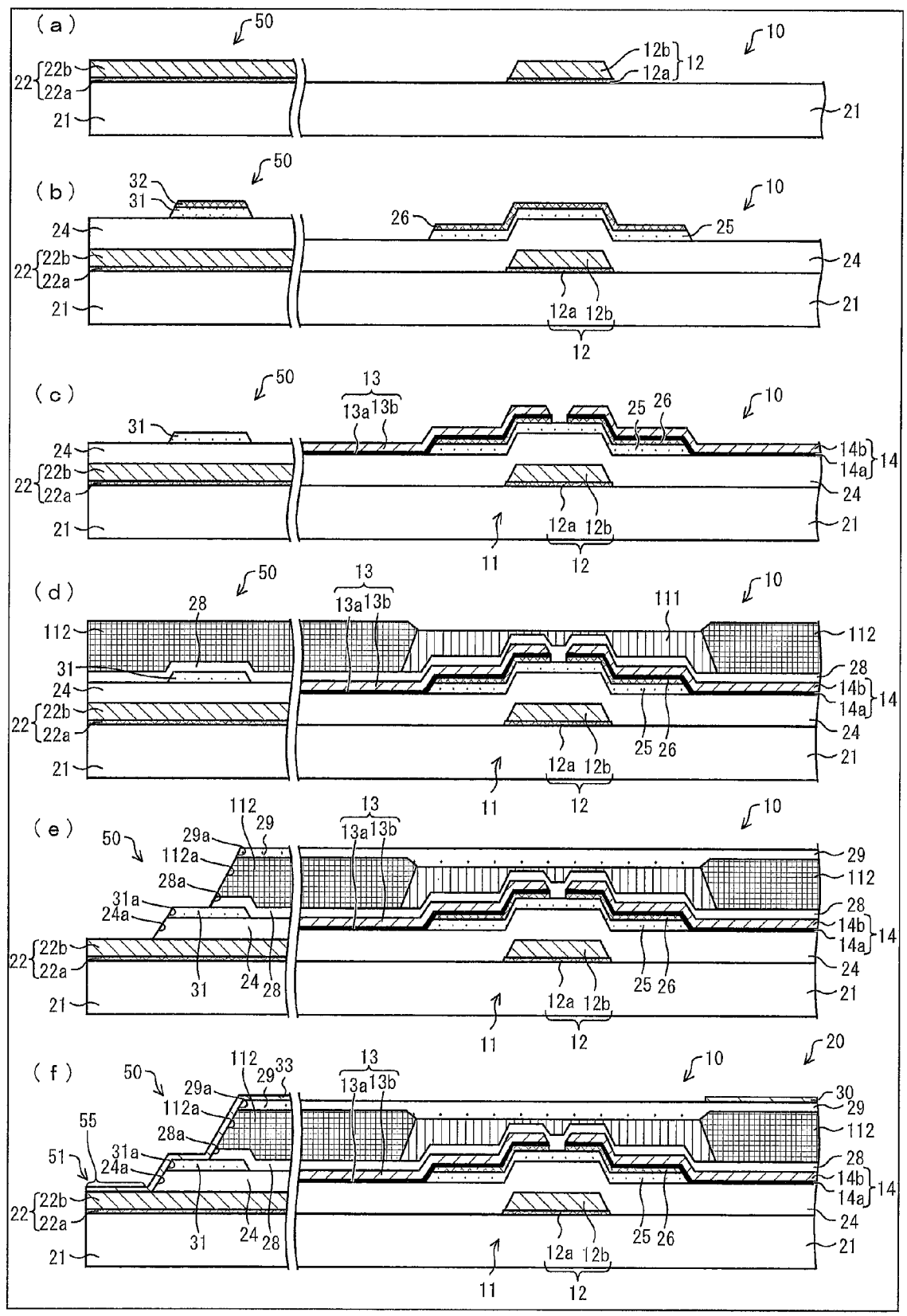
FIG. 17 is a set of cross-sectional views (a) through (f) of an active-matrix substrate according to Embodiment 8 of the present invention, the cross-sectional views (a) through (f) showing successive steps of a process by which the active-matrix substrate is manufactured.

FIG. 17 is a set of cross-sectional views (a) through (f) of the active-matrix substrate 20, the cross-sectional views (a) through (e) showing successive steps of a process by which the active-matrix substrate 20 is manufactured. It should be noted that in each of (a) through (f) of FIG. 17, a cross-section of the scanning wire connection area 50 and a cross-section of an area near a TFT 11 in each pixel 10 are juxtaposed as cross-sections of the non-display and display regions 42 and 41 of the active-matrix substrate 20 at the end of the corresponding step.

First, those layers constituting the active-matrix substrate 20 are described below with reference to (f) of FIG. 17.

As with Embodiment 1, the present embodiment is described by taking the scanning wire connection area 50 as an example of the connection area 44. However, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively.

The active-matrix substrate 20 according to the present embodiment has a COA (color filter-on-array) structure. As shown in (f) of FIG. 17, the active-matrix substrate 20 according to the present embodiment has its display region 41 configured such that a first metal wiring layer (gate metal layer) such as a scanning electrode 12, a gate insulating film 24, a channel layer 25, an electrode contact layer 26, a second metal wiring layer (source metal layer) such as a signal electrode 13 and a drain electrode 14, a protective film 28, a black matrix 112 and color filter layer 111, an interlayer insulating film 29, a pixel electrode 30, and, as needed, an alignment film (not illustrated) are provided in the order named over a glass substrate 21.

Meanwhile, the active-matrix substrate 20 has its scanning wire connection area 50 configured such that a scanning wire 22, the gate insulating film 24, the protective film 28, the black matrix 112 and color filter layer 111, the interlayer insulating film 29, and the transparent electrode 33 are laminated in the order named over the glass substrate 21. Further provided at an end of the scanning wire 22 by laminating the transparent electrode 33 directly on the scanning wire 22 is a terminal area 55.

In the present embodiment, too, the scanning wire 22 is configured with its upper scanning wire 22b provided on its lower scanning wire 22a. However, as noted above in Embodiment 1, the scanning wire 22 is not to be limited to such a configuration.

The active-matrix substrate 20 according to the present embodiment has the same configuration as the active-matrix substrate 20 according to Embodiment 1, except that, as described above, the black matrix 112 and color filter layer 111 constituted by an organic insulating film is provided between the protective film 28 and the interlayer insulating film 29.

In the following, a method for manufacturing an active-matrix substrate 20 according to the present embodiment is described below with reference to (a) through (f) of FIG. 17. In the following example of manufacturing, the conditions such as the thickness of each layer are the same as those in Embodiment 1, unless otherwise specified.

[Scanning Wire/Gate Insulating Film/Semiconductor Layer/Signal Wire Forming Step]

The steps shown in (a) through (c) of FIG. 17 are the same as those shown in (a) through (c) of FIG. 6 in Embodiment 1, and as such, the steps are not described in the present embodiment.

[Protective Film/Black Matrix and Color Filter Layer Forming Step]

In this step, first, as shown in (d) of FIG. 17, a silicon nitride ($SiN_x$) film is formed by CVD as a protective film 28 over the gate insulating film 24 in such a way as to cover the signal wires 27, the signal electrodes 13, and the drain electrodes 14. The steps thus far are the same as those of Embodiment 1.

Next, a color filter material composed of photosensitive resin materials having their respective colors and a black matrix material are formed by spin coating on the silicon nitride film for each respective color and patterned by photolithography, whereby a black matrix 112 and an R (red), G (green), and B (blue) color filter layer 111 are formed.

In this step, it is preferable that the silicon nitride film thus formed have a thickness of 100 to 700 nm; however, this does not imply any particular limitation. Further, it is preferable that the black matrix 112 thus formed have a thickness of 500 to 5000 nm, and that the color filter layer 111 thus formed have a thickness of 500 to 5000 nm.

[Interlayer Insulating Film Forming Step]

In this step, an interlayer insulating film material made of a photosensitive resin material is formed by spin coating on the black matrix 112 and color filter layer 111. After that, patterning is carried out by photolithography, and then dry etching is carried out. Thus, an interlayer insulating film 29 constituted by the interlayer insulating film material is pattern-formed.

At this point in time, although not illustrated, by carrying out dry etching with use of the interlayer insulating film 29 as a mask, unmasked parts of the protective film 28 in each pixel 10 are removed, so that the signal electrode 13 and the drain electrode 14 are exposed.

Meanwhile, in the connection area 44, as shown in (e) of FIG. 17, by carrying out dry etching with use of the interlayer insulating film 29 as a mask, an unmasked part of the black matrix 112 and color filter layer 111 and unmasked parts of the gate insulating film 24 and the protective film 28 over the scanning wire 22 serving as a drawn wire are removed, whereby the terminal area 55 and an area therearound of the scanning wire 22 is exposed.

In the scanning wire connection area 50 at this point in time, as shown in (e) of FIG. 17, the first semiconductor layer 31 is disposed in a position of intersection between an extension of the end face 29a of the interlayer insulating film 29 and the scanning wire 22. This allows the first semiconductor layer 31 to serve as a mask during dry etching. In the result, as shown in (e) of FIG. 17, the first semiconductor layer 31 and part of the gate insulating film 24 are structured such that part of the first semiconductor layer 31 and part of the gate insulating film 24 extend further than the end face 29a of the interlayer insulating film 29.

In the present embodiment, the interlayer insulating film 29 needs only be formed to have such a thickness that unevenness due to the metal wires, TFTs 11, color filter layer 111, and black matrix 112 of the active-matrix substrate 20 can be compensated for; however, this does not imply any particular limitation. The interlayer insulating film is formed, for example, to have a thickness of 0.5 μm to 5 μm. Further, if the color filter layer 111, and the black matrix 112 are made of materials having resistance to processes, the color filter layer 111 can be patterned to serve as a substitute for the interlayer insulating film 29.

[Transparent Conductive Film Forming Step]

This step per se is the same as that shown in (e) of FIG. 6 in Embodiment 1. In this step, a transparent conductive film made of ITO is formed entirely over an upper surface of the glass substrate 21 over which the interlayer insulating film 29 has been formed. Next, on the transparent conductive film, a resist pattern is formed by photolithography. After that, the transparent conductive film is patterned by wet etching, and then the resist pattern is washed away.

Thus, in the present embodiment, too, as shown in (f) of FIG. 17, a pixel electrode 30 constituted by the transparent conductive film is formed in each pixel 10. Further, a transparent electrode 33 constituted by the transparent conductive film is formed in the scanning wire connection area 50 in such a way as to cover an upper surface the interlayer insulating film 29, the end face 29a of the interlayer insulating film 29, an end face 112a of the black matrix 112, an end face (not illustrated) of the color filter layer 112, the end face 28a of the protective film 28, an upper surface of the first semiconductor layer 31, the end face 31a of the first semiconductor layer 31, the end face 24a of the gate insulating film 24, and an upper surface of the exposed part of the scanning wire 22.

Since the transparent electrode 33 is formed on the exposed part of the scanning wire 22 as described above, a scanning terminal 51 (terminal electrode) is formed at an end of the scanning wire 22.

[Alignment Film Forming Step]

Finally, as in Embodiment 1, an alignment film (not illustrated) is formed, as needed, on a surface of the active-matrix substrate 20 (which faces the counter substrate 80).

Thus, the active-matrix substrate 20 according to the present embodiment can be manufactured.

Further, although the present embodiment has also been described by taking, as an example, a case where the second semiconductor layer 32 is removed, the present embodiment is not to be limited to such an example, as mentioned above.

Embodiment 9

Another embodiment of the present invention is described below with reference to (a) through (f) of FIG. 18. It should be noted that in the present embodiment, points of difference between the present embodiment and Embodiment 1 are mainly described, and that those components having the same functions as those of Embodiment 1 are given the same reference numerals, and as such, are not described below.

FIG. 18 is a set of cross-sectional views (a) through (f) of the active-matrix substrate 20, the cross-sectional views (a) through (e) showing successive steps of a process by which the active-matrix substrate 20 is manufactured. It should be noted that in each of (a) through (f) of FIG. 18, a cross-section of the scanning wire connection area 50 and a cross-section of an area near a TFT 11 in each pixel 10 are juxtaposed as cross-sections of the non-display and display regions 42 and 41 of the active-matrix substrate 20 at the end of the corresponding step.

First, those layers constituting the active-matrix substrate 20 are described below with reference to (f) of FIG. 18.

As with Embodiment 1, the present embodiment is described by taking the scanning wire connection area 50 as an example of the connection area 44. However, the scanning wire connection area 50, the scanning wires 22, the scanning terminals 51, and the scanning electrodes 12 can be read as the signal wire connection area 60, the connection wires 62, the signal terminals 61, and the signal electrodes 13, respectively.

As shown in (f) of FIG. 18, the active-matrix substrate 20 according to the present embodiment has its display region 41 configured such that a first metal wiring layer (gate metal layer) such as a scanning electrode 12, a gate insulating film 24, a channel layer 25, an electrode contact layer 26, a second metal wiring layer (source metal layer) such as a signal electrode 13 and a drain electrode 14, a protective film 28, an interlayer insulating film 29, a pixel electrode 30, and, as needed, an alignment film (not illustrated) are provided in the order named over a glass substrate 21.

The active-matrix substrate 20 according to the present embodiment is different from the active-matrix substrate 20 according to Embodiment 1 in that two semiconductor layers that are to serve as a channel layer 25 and an electrode contact layer 26 are formed under the second metal wiring layer in the display region 41 in such a way as to extend across the whole display region 41.

It should be noted that the scanning wire connection area 50 of the active-matrix substrate 20 according to the present embodiment is identical in configuration to that of the active-matrix substrate 20 according to Embodiment 1. The active-matrix substrate 20 has its scanning wire connection area 50 configured such that a scanning wire 22, the gate insulating film 24, the first semiconductor layer 31, the protective film 28, the interlayer insulating film 29, and the transparent electrode 33 are laminated in the order named over the glass substrate 21. Further provided at an end of the scanning wire 22 by laminating the transparent electrode 33 directly on the scanning wire 22 is a terminal area 55.

In the present embodiment, too, the scanning wire 22 is configured with its upper scanning wire 22b provided on its lower scanning wire 22a. However, as noted above in Embodiment 1, the scanning wire 22 is not to be limited to such a configuration.

In the following, a method for manufacturing an active-matrix substrate 20 according to the present embodiment is described below with reference to (a) through (f) of FIG. 18. In the following example of manufacturing, the conditions such as the thickness of each layer are the same as those in Embodiment 1, unless otherwise specified.

[Scanning Wire Forming Step]

The step shown in (a) of FIG. 18 is the same as that shown in (a) of FIG. 6 in Embodiment 1, and as such, the step is not described in the present embodiment.

[Gate Insulating Film/Semiconductor Layer/Signal Wire Forming Step]

In this step, first, as shown in (b) of FIG. 18, a gate insulating film 24 (inorganic insulating film) made of silicon nitride ($SiN_x$) is formed by CVD in such a way as to cover the scanning electrode 12 and the scanning wire 22.

Next, an amorphous silicon layer 12 and an $n^+$ amorphous silicon layer 122 highly doped with an n-type impurity are formed as semiconductor layers over the gate insulating film 24.

Next, a conductive film 123 made of Ti and a conductive film 124 made of Cu are successively formed in the order named by sputtering over the $n^+$ amorphous silicon layer 122.

Then, a resist is applied by spin coating onto the conductive film 124, and by carrying out half exposure and thereby leaving only necessary parts of the resist and partly reducing the thickness of the resist, a resist pattern 125 (halftone mask) having two levels of thickness is formed.

Specifically, as shown in (b) of FIG. 18, the film thickness of those parts of the resist pattern 125 which correspond to a channel part and a part where the first semiconductor layer 31 is left is made thinner by the half exposure than the thickness of those parts of the resist pattern 125 which are to finally serve as the second metal wiring layer (e.g., the signal electrode 13, the drain electrode 14, the signal wire 27, the drain wire 15, the intermediate electrode 16, etc.). Further, the other parts of the resist (i.e., which correspond to parts where the conductive films 123 and 124 are removed by the subsequent etching) are removed.

After that, by etching with the resist pattern 125 as a mask, the conductive films 123 and 124 are patterned, and the channel layer 25 and the first semiconductor layer 31, each of which is constituted by the amorphous silicon layer 121, and the electrode contact layer 26 and the second semiconductor layer 32, each of which is constituted by the n+ amorphous silicon layer 122, are pattern-formed.

Next, the thinner part of the resist pattern 125 having two levels of thickness is removed by ashing (e.g., $O_2$ ashing).

Next, the conductive films 123 and 124 are wet-etched by using, as a mask, the resist pattern 125 thus left (i.e., the thicker part of the resist pattern 125 having two levels of thickness). Thus, as shown in (c) of FIG. 18, the signal electrode 13 and the drain electrode 14, which are constituted by the conductive films 123 and 124, respectively, are formed (pattern separation), and those parts of the conductive films 123 and 124 which are in the scanning wire connection area 50 are removed.

After that, as shown in (d) of FIG. 18, that region of the electrode contact layer 26 which is to serve as a channel part is removed (channel etching) by dry etching, and the second semiconductor layer 32 is entirely removed. At this point in time, that region of the surface of channel layer 25 which is to serve as the channel part is etched so that the channel part has its thickness adjusted. After that, the resist pattern is washed away, whereby each TFT 11 is formed.

In the result, two semiconductor layers that are to serve as a channel layer 25 and an electrode contact layer 26 are left under the second metal wiring layer in the display region 41 in such a way as to extend across the whole display region 41.

In this step, it is preferable that the silicon nitride film thus formed to constitute the gate insulating film 24 have a thickness of 200 to 500 nm; however, this does not imply any particular limitation. Further, it is preferable that the amorphous silicon layer thus formed to constitute the channel layer 25 and the first semiconductor layer 31 have a thickness of 30 to 300 nm, and that the $n^+$ amorphous silicon layer thus formed to constitute the electrode contact layer 26 and the second semiconductor layer have a thickness of 20 to 150 nm. Further, it is preferable that the conductive film 123 made of Ti have a thickness of 20 to 150 nm and that the conductive film 124 made of Cu have a thickness of 200 to 500 nm.

It should be noted that this example of manufacturing has also been described by taking, as an example, a case where a second metal wire (source metal layer) including the signal electrodes 13 has a Ti/Cu laminated structure (two-layer structure) serving as an upper metal wire/a lower metal wire. However, as in the case of the first metal wiring layer (gate metal layer), the present invention is not to be limited to such an example.

[Protective Film/Interlayer Insulating Film Forming Step]

This step per se is the same as that shown in (d) of FIG. 6 in Embodiment 1. In this step, first, as shown in (e) of FIG. 18, a silicon nitride ($SiN_x$) film is formed by CVD as a protective film 28 over the gate insulating film 24 in such a way as to cover the signal wires 27, signal electrodes 13, and drain electrodes 14 constituted by the second metal wiring layer.

Next, an interlayer insulating film material made of a photosensitive resin material is formed by spin coating on the silicon nitride film. After that, patterning is carried out by photolithography, and then dry etching is carried out. Thus, the protective film 28 constituted by the nitride silicon film and an interlayer insulating film 29 constituted by the interlayer insulating film material are pattern-formed.

At this point in time, although not illustrated, by carrying out dry etching with use of the interlayer insulating film 29 as a mask, unmasked parts of the protective film 28 in each pixel 10 are removed, so that the signal electrode 13 and the drain electrode 14 are exposed.

Meanwhile, in the scanning wire connection area 50, as shown in (e) of FIG. 18, by carrying out dry etching with use of the interlayer insulating film 29 as a mask, unmasked parts of the gate insulating film 24 and the protective film 28 over the scanning wire 22 serving as a drawn wire are removed, whereby the terminal area 55 (scanning terminal 51 and an area therearound) of the scanning wire 22 is exposed.

In the scanning wire connection area 50 at this point in time, as shown in (e) of FIG. 18, as in Embodiment 1, the first semiconductor layer 31 disposed in a position of intersection between an extension of the end face 29a of the interlayer insulating film 29 and the scanning wire 22. This allows the first semiconductor layer 31 to serve as a mask during dry etching. In the result, as shown in (e) of FIG. 18, the first semiconductor layer 31 and part of the gate insulating film 24 are structured such that part of the first semiconductor layer 31 and part of the gate insulating film 24 extend further than the end face 29a of the interlayer insulating film 29.

[Transparent Conductive Film Forming Step]

This step per se is the same as that shown in (e) of FIG. 6 in Embodiment 1. In this step, a transparent conductive film made of ITO is formed entirely over an upper surface of the glass substrate 21 over which the interlayer insulating film 29 has been formed. Next, on the transparent conductive film, a resist pattern is formed by photolithography. After that, the transparent conductive film is patterned by wet etching, and then the resist pattern is washed away.

Thus, in the present embodiment, too, as shown in (f) of FIG. 18, a pixel electrode 30 constituted by the transparent conductive film is formed in each pixel 10. Further, a transparent electrode 33 constituted by the transparent conductive film is formed in the scanning wire connection area 50 in such a way as to cover an upper surface of the interlayer insulating film 29, the end face 29a of the interlayer insulating film 29, the end face 28a of the protective film 28, an upper surface of the first semiconductor layer 31, the end face 31a of the first semiconductor layer 31, the end face 24a of the gate insulating film 24, and an upper surface of the exposed part of the scanning wire 22.

Since the transparent electrode 33 is formed on the exposed part of the scanning wire 22 as described above, a scanning terminal 51 (terminal electrode) is formed at an end of the scanning wire 22.

[Alignment Film Forming Step]

Finally, as in Embodiment 1, an alignment film (not illustrated) is formed, as needed, on a surface of the active-matrix substrate 20 (which faces the counter substrate 80).

Thus, the active-matrix substrate 20 according to the present embodiment can be manufactured.

According to the present embodiment, as described above, the number of masks can be reduced by etching the second metal wire (source metal layer) and the semiconductor layer altogether with use of a halftone mask. Therefore, in a case where the semiconductor layer is left in the connection area 44 as described above (e.g., in the scanning wire connection area 50 as described above), the technique of etching the second metal wire and the semiconductor layer altogether with use of a halftone mask can be suitably used as a process for reducing the number of masks.

Further, although the present embodiment has also been described by taking, as an example, a case where the second semiconductor layer 32 is removed, the present embodiment is not to be limited to such an example, as mentioned above.

Further, the present embodiment has been described by taking, as an example, a case where by subjecting the resist pattern 125 to $O_2$ ashing and then wet-etching the conductive films 123 and 124 with use of the remaining resist pattern 125 as a mask, the signal electrode 13 and the drain electrode 14, which are composed of the conductive films 123 and 124, respectively, are formed (pattern separation), and those parts of the conductive films 123 and 124 which are in the scanning wire connection area 50 are removed.

However, the present embodiment is not to be limited to such an example. For example, it is possible that by subjecting the resist pattern 125 to $O_2$ ashing and then dry-etching the conductive films 123 and 124 with use of the remaining resist pattern 125 as a mask, etching of the conductive films 123 and 124, etching (removal) of that region of the electrode contact layer 26 which is to serve as a channel part and of the second semiconductor layer 32, and etching of the surface of that region of the channel layer 25 which is to serve as the channel part are successively carried out.

It should be noted that in each of the embodiments described above, the wiring board (element substrate) according the present invention has been described by taking, as an example, an active-matrix substrate 20 including TFTs 11 (which are three-terminal elements) as drive elements.

However, the present invention is not to be limited to such an example. As described above, the present invention is characterized in the structure of a connection area such as a wire connection area or an external device connection area and in a method for manufacturing such a structure. Therefore, the present invention can be applied to any wiring board that includes: an insulating substrate; a metal wire provided on the insulating substrate; an inorganic insulating film covering the metal wire; an organic insulating film covering the inorganic insulating film; and a conductive film formed on the organic insulating film, the metal wire being provided with a region where the conductive film is laminated directly on the metal wire without the inorganic insulating film and the organic insulating film being sandwiched therebetween.

As mentioned above, the wiring board can be applied not only to the liquid crystal panel and the liquid crystal display device that have been described above, but also to a display panel and a display device that use organic EL or inorganic EL as display media.

Further, the display device can be suitably applied to a display device, etc. in an electrophoretic device, as well as a laptop personal computer, a cellular phone, an electronic organizer, a TV (television) receiver.

Furthermore, examples of electronic devices in which the display device is incorporated includes various electronic devices such as calculators, IC cards, minidisk players, public bulletin boards for outdoor use, and mobile devices such as PDAs, as well as cellular phones, electronic organizers, TV receivers, electrophoretic devices.

As described above, a wiring board according to the present invention includes: an insulating substrate; a metal wire provided on the insulating substrate; an inorganic insulating film covering the metal wire; an organic insulating film covering the inorganic insulating film; and a conductive film formed on the organic insulating film. The metal wire is provided with a region where the conductive film is laminated directly on the metal wire without the inorganic insulating film and the organic insulating film being sandwiched therebetween. Further, the conductive film extends over the region in such a way as to cover an end face of the organic insulating film that faces the region and an end face of the inorganic insulating film that faces the region, and the end face of the organic insulating film is further away from the region than the end face of the inorganic insulating film.

The wiring board is preferably configured to further include a mask layer provided between the end face of the organic insulating film and the inorganic insulating film, the mask layer having greater resistant to etching that the inorganic insulating film.

For example, the wiring board is preferably configured to further include: a drive element including a semiconductor layer; and a semiconductor layer provided in a same layer as the semiconductor layer and between the end face of the organic insulating film that faces the region and the inorganic insulting film.

Since the semiconductor layer is provided between the end face of the organic insulating film that faces the region and the inorganic insulting film, the semiconductor layer functions as a mask layer during dry etching of the inorganic insulating film.

For this reason, the wiring board thus configured allows that part of the inorganic insulating film on which the semiconductor layer or the mask layer is provided to be left after dry etching of the inorganic insulating film. Further, the foregoing configuration allows that part of the conductive film which covers the end face of the inorganic insulating film to be dense. This brings about improvement in the effect of preventing the intrusion or runabout entry of a corrosion-accelerating component. Further, the semiconductor layer and the mask layer per se keep a large distance between the defect and an area therebelow where the inorganic insulating film makes contact with the conductive film, and forms a step. For this reason, the foregoing configuration can more surely prevent the intrusion or runabout entry of a corrosion-accelerating component. Further, the foregoing configuration can render gradual a step that is to be straddled by the conductive film.

Further, the wiring board is preferably configured such that: the region is a terminal area for use in connection to an external device; and the semiconductor layer extends to a region where an adhesive layer to be stuck to an external device is formed, the adhesive layer being provided on the conductive film in the region.

According to the foregoing configuration, an area of contact between the metal wire and the conductive film and, further, the conductive film, which covers an area of contact between the end face of the inorganic insulating film and the metal wire, can be protected from the outside air. Especially, in a case where the wiring board is used in a display panel, the area of contact between the metal wire and the conductive film and, further, the conductive film, which covers the area of contact between the end face of the inorganic insulating film and the metal wire, placed wholly in an area inside of the sealing agent or an area below the adhesive layer, and as such, are not exposed to the outside air. This allows further improvement in reliability.

Further, the wiring board is preferably configured such that the metal wire contains copper or an alloy thereof. This makes it possible to reduce the resistance of the metal wire.

A display panel according to the present invention includes such a wiring board. Further, a display device according to the present invention includes such a display panel.

The display panel is preferably configured such that: the wiring board and a counter substrate having a smaller area than the wiring board are join to each other via a sealing agent; and the region is provided outside of a region surrounded by the sealing agent.

The outside of the region surrounded by the sealing agent is exposed to the outside air, and as such, allows a corrosion-accelerating component to easily intrude thereinto. For this reason, by applying the present invention to a display panel in which the region is provided outside of a region surrounded by the sealing agent, the problem of corrosion can be solved.

This makes it possible to prevent a metal electrode from corroding due to a defect in a transparent conductive film covering the end face of the organic insulating film.

Further, as described above, a first method for manufacturing a wiring substrate according to the present invention includes: a metal wire forming step of forming a metal wire on an insulating substrate; an inorganic insulating film forming step of forming an inorganic insulating film that covers the metal wire; an organic insulating film forming step of pattern-forming an organic insulating film that covers the inorganic insulating film; an inorganic insulating film patterning step of patterning the inorganic insulating film with use of the organic insulating film as a mask and thereby exposing part of the metal wire; and a conductive film forming step of forming a conductive film on the organic insulting film so that the conductive film covers an end face of the organic insulating film and an end face of the inorganic insulating film and makes contact with the exposed part of the metal wire, the method further including a mask layer forming step of forming a mask layer on the inorganic insulating film so that the mask layer overlaps the metal wire, the mask layer functioning as a mask during patterning of the inorganic insulating film, the mask layer forming step being executed between the inorganic insulating film forming step and the organic insulating film forming step, by pattern-forming the organic insulating film in the organic insulating film forming step so that the end face of the organic insulating film is located on the mask layer and by patterning the inorganic insulating film in the inorganic insulating film patterning step with use of the organic insulating film and the mask layer as masks, the end face of the organic insulating film being made further away from a region than the end face of the inorganic insulating film, the region being a region where the metal wire is exposed, the end faces each facing the region.

Further, as described above, a second method for manufacturing a wiring substrate according to the present invention includes: a metal wire forming step of forming a metal wire on an insulating substrate; an inorganic insulating film forming step of forming an inorganic insulating film that covers the metal wire; an organic insulating film forming step of pattern-forming an organic insulating film that covers the inorganic insulating film; an inorganic insulating film patterning step of patterning the inorganic insulating film with use of the organic insulating film as a mask and thereby exposing part of the metal wire; and a conductive film forming step of forming a conductive film on the organic insulting film so that the conductive film covers an end face of the organic insulating film and an end face of the inorganic insulating film and makes contact with the exposed part of the metal wire, the method further including a partial organic insulating film removing step of etching back (e.g., ashing or ashing combined with half exposure during the formation of the organic insulating film) part of the organic insulating film, the part covering the inorganic insulating film, and thereby making the end face of the organic insulating film further away from a region than the end face of the inorganic insulating film, the region being a region where the metal wire is exposed, the end faces each facing the region, the partial organic insulating film removing step being executed between the inorganic insulating film patterning step and the conductive film forming step.

Further, as described above, a third method for manufacturing a wiring substrate according to the present invention includes: a first metal wire forming step of forming a first metal wire on an insulating substrate; a first inorganic insulating film forming step of forming a first inorganic insulating film that covers the first metal wire; a second metal wire forming step of forming a second metal wire on the first inorganic insulating film; a second inorganic insulating film forming step of forming a second inorganic insulating film that covers the second metal wire; an organic insulating film forming step of pattern-forming an organic insulating film that covers the second inorganic insulating film; an inorganic insulating film patterning step of forming an opening by patterning the first and second inorganic insulating films with use of the organic insulating film as a mask and thereby exposing parts of the first and second metal wires inside of the opening; and a conductive film forming step of forming a conductive film on the organic insulting film so that the conductive film covers an end face of the organic insulating film and end faces of the first and second inorganic insulating films and makes contact with the exposed parts of the first and second metal wires, the method further including a partial organic insulating film removing step of etching back (e.g., ashing or ashing combined with half exposure during the formation of the organic insulating film) parts of the organic insulating film, the parts covering the first and second inorganic insulating films, and thereby making the end face of the organic insulating film further away from a region than the end faces of the first and second inorganic insulating films, the region being a region where the first and second metal wires are exposed, the end faces each facing the region, the partial organic insulating film removing step being executed between the inorganic insulating film patterning step and the conductive film forming step.

Further, as described above, a fourth method for manufacturing a wiring substrate according to the present invention includes: a first metal wire forming step of forming a first metal wire on an insulating substrate; a first inorganic insulating film forming step of forming a first inorganic insulating film that covers the first metal wire; a second metal wire forming step of forming a second metal wire on the first inorganic insulating film; a second inorganic insulating film forming step of forming a second inorganic insulating film that covers the second metal wire; an organic insulating film forming step of pattern-forming an organic insulating film that covers the second inorganic insulating film; an inorganic insulating film patterning step of forming an opening by patterning the first and second inorganic insulating films with use of the organic insulating film as a mask and thereby exposing parts of the first and second metal wires inside of the opening; and a conductive film forming step of forming a conductive film on the organic insulting film so that the conductive film covers an end face of the organic insulating film and end faces of the first and second inorganic insulating films and makes contact with the exposed parts of the first and second metal wires, the method further including a mask layer forming step of forming a mask layer on the first inorganic insulating film so that the mask layer overlaps the first metal wire, the mask layer functioning as a mask during patterning of the first inorganic insulating film, the mask layer forming step being executed between the first metal wire forming step and the first inorganic insulating film forming step, by pattern-forming the organic insulating film in the organic insulating film forming step so that the end face of the organic insulating film is located on the mask layer and by patterning the first and second inorganic insulating films in the inorganic insulating film patterning step with use of the organic insulating film and the mask layer as masks, the end face of the organic insulating film being made further away from a region than the end face of the first inorganic insulating film, the region being a region where the first metal wire is exposed, the end faces each facing the region.

It should be noted that the fourth method for manufacturing a wiring board preferably further includes a partial organic insulating film removing step of etching back or half-exposing part of the organic insulating film, the part covering the second inorganic insulating film, and thereby making the end face of the organic insulating film further away from a region than the end face of the second inorganic insulating film, the region being a region where the second metal wire is exposed, the end faces each facing the region, the partial organic insulating film removing step being executed between the inorganic insulating film patterning step and the conductive film forming step.

Use of any of the method described above makes it possible to manufacture a wiring board according the present invention. It should be noted, as described above, that in a case where the region is a region of connection between the first metal wiring layer and the second metal wiring layer and is formed in an area inside of the sealing agent, corrosion is less likely than in a case where the region is provided in an area outside of the sealing agent. For this reason, in such a case, as described above, the wiring board may be structured such that the mask layer prevents only the first metal wiring layer from corroding. However, in order to more surely prevent corrosion, or in order to provide the region in an area outside of the sealing agent, it is more preferable to, by etching back (e.g., ashing or ashing combined with half exposure during the formation of the organic insulating film) the organic insulating film in addition to forming the mask layer, structure the wiring board such that the second metal wiring layer can further be prevented from corroding.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention makes it possible to obtain wiring boards, display panels, and display devices that are superior in corrosion resistance. Such wiring boards, display panels, and display devices can be suitably used in various electronic devices that need corrosion resistance, such as calculators, IC cards, minidisk players, public bulletin boards for outdoor use, and mobile devices such as PDAs, as well as cellular phones, electronic organizers, TV receivers, electrophoretic devices.

REFERENCE SIGNS LIST

1 Liquid crystal display device
2 Liquid crystal panel
3 Control circuit
4 Scanning wire drive circuit (external circuit)
5 Signal wire drive circuit (external circuit)
6 Auxiliary capacitor wire drive circuit (external circuit)
10 Pixel
11 TFT (drive element)
12 Scanning electrode
12a Lower scanning electrode
12b Upper scanning electrode
13 Signal electrode
13a Lower signal electrode
13b Upper signal electrode
14 Drain electrode
14a Lower drain electrode
14b Upper drain electrode
15 Drain wire
16 Intermediate electrode
17 Contact hole
20 Active-matrix substrate (wiring board)
21 Glass substrate
22 Scanning wire (metal wire)
22a Lower scanning wire (metal wire)
22b Upper scanning wire (metal wire)

23 Auxiliary capacitor wire
24 Gate insulating film (inorganic insulating film)
24a End face
25 Channel layer (semiconductor layer)
26 Electrode contact layer (semiconductor layer)
27 Signal wire (metal wire)
27a Lower signal wire (metal wire)
27b Upper signal wire (metal wire)
27c End face
27d End face
28 Protective film (inorganic insulating film)
28a End face
29 Interlayer insulating film (organic insulating film)
29a End face
30 Pixel electrode
31 First semiconductor layer (semiconductor layer)
31a End face
32 Second semiconductor layer (semiconductor layer)
32a End face
33 Transparent electrode (conductive film)
33a Defect
41 Display region
42 Non-display region
43 Sealing part
44 Connection area
20 Matrix substrate
50 Scanning wire connection area
51 Scanning terminal
55 Terminal area (region)
60 Signal wire connection area
61 Signal terminal
62 Connection wire (metal wire)
62a Lower connection wire (metal wire)
62b Upper connection wire (metal wire)
70 Wire connection area
71 Contact hole
80 Counter substrate
81 Glass substrate
82 Color filter layer
83 Black matrix
84 Counter electrode
91 Sealing agent
92 Liquid crystal layer
93 ACF (adhesive layer)
101 Channel protecting layer
102 Amorphous silicon layer
111 Color filter layer
112 Black matrix
112a End face
121 Amorphous silicon layer
122 n$^+$ Amorphous silicon layer
123 Conductive film
124 Conductive film
125 Resist pattern

The invention claimed is:

1. A wiring board comprising:
an insulating substrate;
a metal wire provided on the insulating substrate;
an inorganic insulating film covering the metal wire;
an organic insulating film covering the inorganic insulating film; and
a conductive film formed on the organic insulating film, wherein
the metal wire is provided with a first region where the conductive film is laminated directly on the metal wire without the inorganic insulating film and the organic insulating film being sandwiched therebetween,
the conductive film extends over the first region in such a way as to cover an end face of the organic insulating film that faces the first region and an end face of the inorganic insulating film that faces the first region,
the end face of the organic insulating film is further away from the first region than the end face of the inorganic insulating film,
the wiring board includes a drive element including a first semiconductor layer,
the wiring board includes a second semiconductor layer provided in a same layer as the first semiconductor layer and between the end face of the organic insulating film that faces the first region and the inorganic insulating film,
the first region is a terminal area arranged to connect to an external device,
no other metal wire is present between the metal wire and an end part of the organic insulating film that faces the first region, and
the second semiconductor layer extends to a second region where an adhesive layer to be stuck to the external device is located, the adhesive layer being provided on the conductive film in the first region.

2. The wiring board as set forth in claim 1, the metal wire contains copper or an alloy thereof.

3. A display panel comprising a wiring board as set forth in claim 1.

4. The display panel as set forth in claim 3, wherein:
the wiring board and a counter substrate having a smaller area than the wiring board are join to each other via a sealing agent; and
the first region is provided outside of a third region surrounded by the sealing agent.

5. A display device comprising a display panel as set forth in claim 3.

6. A method for manufacturing a wiring board, the method comprising: a metal wire forming step of forming a metal wire on an insulating substrate; an inorganic insulating film forming step of forming an inorganic insulating film that covers the metal wire; an organic insulating film forming step of pattern-forming an organic insulating film that covers the inorganic insulating film; an inorganic insulating film patterning step of pattering the inorganic insulating film with use of the organic insulating film as a mask and thereby exposing part of the metal wire; and a conductive film forming step of forming a conductive film on the organic insulating film so that the conductive film covers an end face of the organic insulating film and an end face of the inorganic insulating film and makes contact with the exposed part of the metal wire, the method further comprising a mask layer forming step of forming a mask layer on the inorganic insulating film so that the mask layer overlaps the metal wire, the mask layer functioning as a mask during patterning of the inorganic insulating film, the mask layer forming step being executed between the inorganic insulating film forming step and the organic insulating film forming step, by pattern-forming the organic insulating film in the organic insulating film forming step so that the end face of the organic insulating film is located on the mask layer and by patterning the inorganic insulating film in the inorganic insulating film patterning step with use of the organic insulating film and the mask layer as masks, the end face of the organic insulating film being made further away from a first region than the end face of the inorganic insulating film, the first region being a region where the metal wire is exposed, the end faces each facing the first region, the method further comprises a step of forming a drive element including a first semiconductor layer, the method further comprises a step of forming a second semiconductor layer provided in a same layer as the first semiconductor layer and between the end face of the organic insulating film that faces the first region and the inorganic insulating film, the first region is a terminal area arranged to connect to an external device, the method does not provide any other metal wire between the metal wire and an end part of the organic insulating film that faces the first region, and in the stem of forming the second semiconductor layer, the second semiconductor layer is formed to extend to a second region where an adhesive layer to be stuck to the external device is formed, the adhesive layer being provided on the conductive film in the first region.

7. A method for manufacturing a wiring board, the method comprising: a metal wire forming step of forming a metal wire on an insulating substrate; an inorganic insulating film forming step of forming an inorganic insulating film that covers the metal wire; an organic insulating film forming step of pattern-forming an organic insulating film that covers the inorganic insulating film; an inorganic insulating film patterning step of patterning the inorganic insulating film with use of the organic insulating film as a mask and thereby exposing part of the metal wire; and a conductive film forming step of forming a conductive film on the organic insulating film so that the conductive film covers an end face of the organic insulating film and an end face of the inorganic insulating film and makes contact with the exposed part of the metal wire, the method further comprising a partial organic insulating film removing step of etching back part of the organic insulating film, the part covering the inorganic insulating film, and thereby making the end face of the organic insulating film further away from a first region than the end face of the inorganic insulating film, the first region being a region where the metal wire is exposed, the end faces each facing the first region, the partial organic insulating film removing step being executed between the inorganic insulating film patterning step and the conductive film forming step, the method further comprises a step of forming a drive element including a first semiconductor layer, the method further comprises a step of forming a second semiconductor layer provided in a same layer as the first semiconductor layer and between the end face of the organic insulating film that faces the first region and the inorganic insulating film, the first region is a terminal area arranged to connect to an external device, the method does not provide any other metal wire between the metal wire and an end part of the organic insulating film that faces the first region, and in the step of forming the second semiconductor layer, the second semiconductor layer is formed to extend to a second region where an adhesive layer to be stuck to the external device is formed, the adhesive layer being provided on the conductive film in the first region.

8. A method for manufacturing a wiring board, the method comprising: a first metal wire forming step of forming a first metal wire on an insulating substrate; a first inorganic insulating film forming step of forming a first inorganic insulating film that covers the first metal wire; a second metal wire forming step of forming a second metal wire on the first inorganic insulating film; a second inorganic insulating film forming step of forming a second inorganic insulating film that covers the second metal wire; an organic insulating film forming step of pattern-forming an organic insulating film that covers the second inorganic insulating film; an inorganic insulating film patterning step of forming an opening by patterning the first and second inorganic insulating films with use of the organic insulating film as a mask and thereby exposing parts of the first and second metal wires inside of the opening; and a conductive film forming step of forming a conductive film on the organic insulating film so that the conductive film covers an end face of the organic insulating film and end faces of the first and second inorganic insulating films and makes contact with the exposed parts of the first and second metal wires, the method further comprising a partial organic insulating film removing step of etching back parts of the organic insulating film, the parts covering the first and second inorganic insulating films, and thereby making the end face of the organic insulating film further away from a first region than the end faces of the first and second inorganic insulating films, the first region being a region where the first and second metal wires are exposed, the end faces each facing the first region, the partial organic insulating film removing step being executed between the inorganic insulating film patterning step and the conductive film forming step, the method further comprises a step of forming a drive element including a first semiconductor layer, the method further comprises a step of forming a second semiconductor layer provided in a same layer as the first semiconductor layer and between the end face of the organic insulating film that faces the first region and the inorganic insulating film, the first region is a terminal area arranged to connect to an external device, the method does not provide any other metal wire between the metal wire and an end part of the organic insulating film that faces the first region, and in the step of forming the second semiconductor layer, the second semiconductor layer is formed to extend to a second region where an adhesive layer to be stuck to the external device is formed, the adhesive layer being provided on the conductive film in the first region.

9. A method for manufacturing a wiring board, the method comprising: a first metal wire forming step of forming a first metal wire on an insulating substrate; a first inorganic insulating film forming step of forming a first inorganic insulating film that covers the first metal wire; a second metal wire forming step of forming a second metal wire on the first inorganic insulating film; a second inorganic insulating film forming step of forming a second inorganic insulating film that covers the second metal wire; an organic insulating film forming step of pattern-forming an organic insulating film that covers the second inorganic insulating film; an inorganic insulating film patterning step of forming an opening by patterning the first and second inorganic insulating films with use of the organic insulating film as a mask and thereby exposing parts of the first and second metal wires inside of the opening; and a conductive film forming step of forming a conductive film on the organic insulating film so that the conductive film covers an end face of the organic insulating film and end faces of the first and second inorganic insulating films and makes contact with the exposed parts of the first and second metal wires, the method further comprising a mask layer forming step of forming a mask layer on the first inorganic insulating film so that the mask layer overlaps the first metal wire, the mask layer functioning as a mask during patterning of the first inorganic insulating film, the mask layer forming step being executed between the first metal wire forming step and the first inorganic insulating film forming step, by pattern-forming the organic insulating film in the organic insulating film forming step so that the end face of the organic insulating film is located on the mask layer and by patterning the first and second inorganic insulating films in the inorganic insulating film patterning step with use of the organic insulating film and the mask layer as masks, the end face of the organic insulating film being made further away from a region than the end face of the first inorganic insulating film, the region being a region where the first metal wire is exposed, the end faces each facing the region, the method further comprises a step of forming a drive element including a first semiconductor layer, the method further comprises a step of forming a second semiconductor layer provided in a same layer as the first semiconductor layer and between the end face of the organic insulating film that faces the first region and the inorganic insulating film, the first region is a terminal area arranged to connect to an external device, the method does not provide any other metal wire between the metal wire and an end part of the organic insulating film that faces the first region, and in the step of forming the second semiconductor layer, the second semiconductor layer is formed to extend to a second region where an adhesive layer to be stuck to the external device is formed, the adhesive layer being provided on the conductive film in the first region.

10. The method as set forth in claim 9, further comprising a partial organic insulating film removing step of etching back part of the organic insulating film, the part covering the second inorganic insulating film, and thereby making the end face of the organic insulating film further away from a third region than the end face of the second inorganic insulating film, the third region being a region where the second metal wire is exposed, the end faces each facing the third region, the partial organic insulating film removing step being executed between the inorganic insulating film patterning step and the conductive film forming step.

* * * * *